(12) United States Patent
Ikeda et al.

(10) Patent No.: US 9,854,629 B2
(45) Date of Patent: Dec. 26, 2017

(54) DISPLAY DEVICE

(71) Applicant: Semiconductor Energy Laboratory Co., Ltd., Atsugi-shi, Kanagawa-ken (JP)

(72) Inventors: Hisao Ikeda, Kanagawa (JP); Nozomu Sugisawa, Kanagawa (JP); Yuichi Yanagisawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 122 days.

(21) Appl. No.: 14/820,782

(22) Filed: Aug. 7, 2015

(65) Prior Publication Data

US 2016/0044751 A1    Feb. 11, 2016

(30) Foreign Application Priority Data

Aug. 8, 2014  (JP) ................................ 2014-162594

(51) Int. Cl.
  *G02F 1/133*    (2006.01)
  *H05B 33/02*    (2006.01)
  (Continued)

(52) U.S. Cl.
  CPC ........... *H05B 33/02* (2013.01); *G06F 1/1652* (2013.01); *H01L 27/323* (2013.01);
  (Continued)

(58) Field of Classification Search
  CPC ...... H05B 33/02; G06F 1/1652; H01L 27/323
  (Continued)

(56) References Cited

U.S. PATENT DOCUMENTS

| 5,801,797 A | 9/1998 | Iida et al. |
| 2002/0113546 A1 | 8/2002 | Seo et al. |

(Continued)

FOREIGN PATENT DOCUMENTS

| CN | 001713035 A | 12/2005 |
| CN | 101996535 A | 3/2011 |

(Continued)

OTHER PUBLICATIONS

International Search Report(Application No. PCT/IB2015/055925) dated Nov. 24, 2015.

(Continued)

*Primary Examiner* — Lucy Chien
(74) *Attorney, Agent, or Firm* — Fish & Richardson P.C.

(57) ABSTRACT

A display device suitable for increasing in size, a display device where display unevenness is suppressed, or a display device that can display an image on a curved surface is provided. The display device includes a first display panel, a second display panel, a first adhesive layer, and a substrate. The first and second display panels each include a first region, a second region, and a barrier layer. The barrier layer includes a portion overlapping with the first region and a portion overlapping with the second region. The first region includes a region transmitting visible light. The second region can display an image. The barrier layer contains an inorganic insulating material and includes a region in contact with the first adhesive layer and a region with a thickness of 10 nm to 2 μm. The display device includes a region where the substrate, the first adhesive layer, the first region of the second display panel, and the second region of the first display panel overlap each other.

16 Claims, 23 Drawing Sheets

(51) Int. Cl.
   *H05B 33/12* (2006.01)
   *G06F 1/16* (2006.01)
   *H01L 27/32* (2006.01)
   *H01L 51/52* (2006.01)

(52) U.S. Cl.
   CPC ......... *H01L 27/3293* (2013.01); *H05B 33/12* (2013.01); *H01L 27/3276* (2013.01); *H01L 51/524* (2013.01); *H01L 51/525* (2013.01); *H01L 51/5246* (2013.01); *H01L 51/5253* (2013.01); *H01L 2251/5338* (2013.01)

(58) Field of Classification Search
   USPC .......................................................... 349/73
   See application file for complete search history.

(56) References Cited

U.S. PATENT DOCUMENTS

| | | |
|---|---|---|
| 2003/0032210 A1 | 2/2003 | Takayama et al. |
| 2004/0014252 A1 | 1/2004 | Shimoda et al. |
| 2004/0051451 A1 | 3/2004 | Kawase et al. |
| 2005/0285811 A1 | 12/2005 | Kawase et al. |
| 2007/0001927 A1 | 1/2007 | Ricks et al. |
| 2008/0197769 A1 | 8/2008 | Seo et al. |
| 2009/0072733 A1* | 3/2009 | Funayama ............. B82Y 20/00 313/506 |
| 2009/0239320 A1 | 9/2009 | Takayama et al. |
| 2010/0177018 A1 | 7/2010 | Wang et al. |
| 2010/0277684 A1* | 11/2010 | Fukushima ......... H01L 51/5246 349/158 |
| 2011/0050657 A1 | 3/2011 | Yamada |
| 2011/0057861 A1* | 3/2011 | Cok .................... H01L 27/3293 345/1.3 |
| 2012/0268445 A1 | 10/2012 | Ogata et al. |
| 2013/0200783 A1 | 8/2013 | Van Heck et al. |
| 2013/0201636 A1 | 8/2013 | Van Den Brand et al. |
| 2013/0201637 A1 | 8/2013 | De Kok et al. |
| 2013/0214324 A1 | 8/2013 | Takayama et al. |
| 2015/0028316 A1 | 1/2015 | Kojima et al. |

FOREIGN PATENT DOCUMENTS

| | | |
|---|---|---|
| CN | 102742027 A | 10/2012 |
| CN | 102742369 A | 10/2012 |
| CN | 102742371 A | 10/2012 |
| DE | 102010000020 | 8/2010 |
| EP | 1143772 A | 10/2001 |
| EP | 1612658 A | 1/2006 |
| JP | 09-311344 A | 12/1997 |
| JP | 2001-100662 A | 4/2001 |
| JP | 2002-324673 A | 11/2002 |
| JP | 2003-174153 A | 6/2003 |
| JP | 2004-111059 A | 4/2004 |
| JP | 2004-251981 A | 9/2004 |
| JP | 2006-010811 A | 1/2006 |
| JP | 2008-157986 A | 7/2008 |
| JP | 2008-545164 | 12/2008 |
| JP | 2010-160489 A | 7/2010 |
| JP | 2010-266777 A | 11/2010 |
| JP | 2011-022302 A | 2/2011 |
| JP | 2011-047976 A | 3/2011 |
| JP | 2011-047977 A | 3/2011 |
| JP | 2011-192567 A | 9/2011 |
| JP | 2012-028226 A | 2/2012 |
| JP | 2012-028638 A | 2/2012 |
| JP | 2013-504092 | 2/2013 |
| JP | 2013-518308 | 5/2013 |
| JP | 2013-518388 | 5/2013 |
| JP | 2013-519106 | 5/2013 |
| KR | 2006-0048387 A | 5/2006 |
| TW | I257596 | 7/2006 |
| TW | 201027162 | 7/2010 |
| WO | WO-2001/024585 | 4/2001 |
| WO | WO-2007/005245 | 1/2007 |
| WO | WO-2011/031605 | 3/2011 |
| WO | WO-2011/093711 | 8/2011 |
| WO | WO-2011/093712 | 8/2011 |
| WO | WO-2011/093713 | 8/2011 |
| WO | WO-2013/128740 | 9/2013 |

OTHER PUBLICATIONS

Written Opinion (Application No. PCT/IB2015/055925) dated Nov. 24, 2015.

* cited by examiner

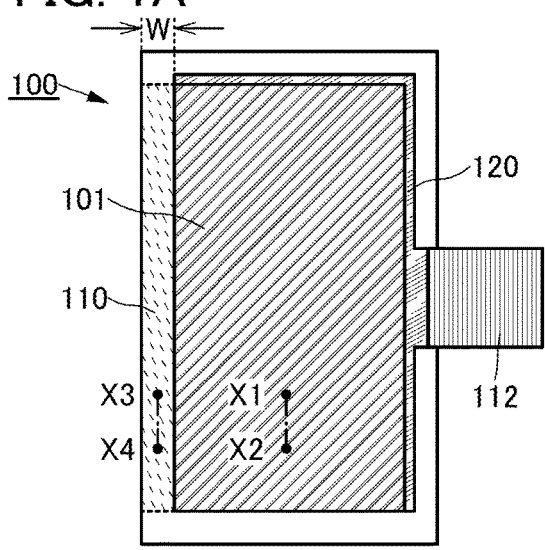
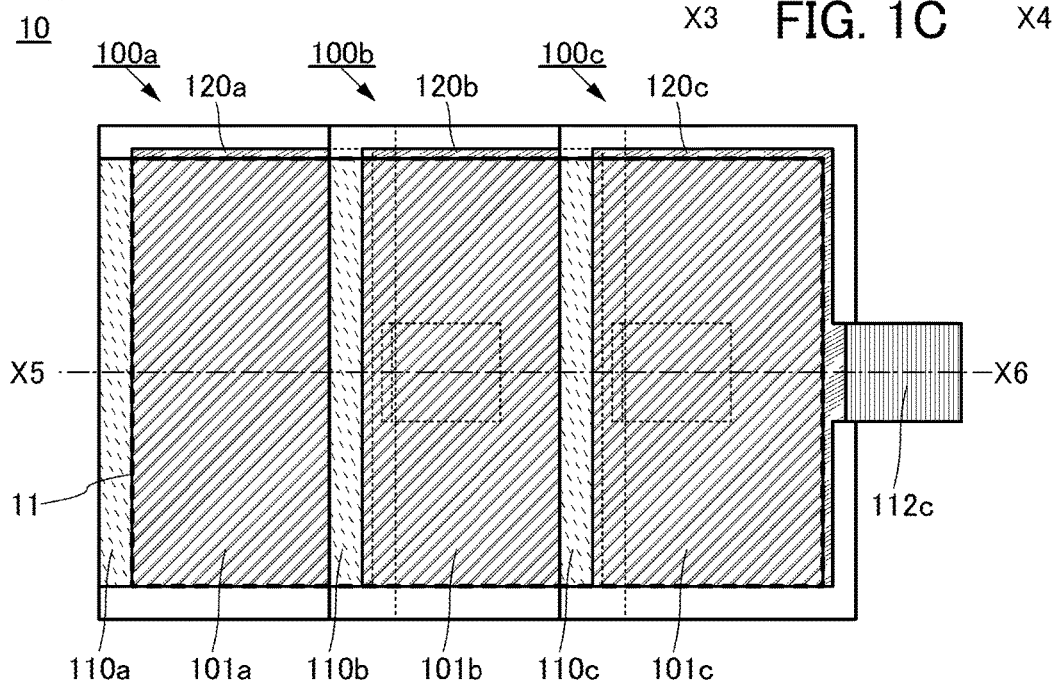
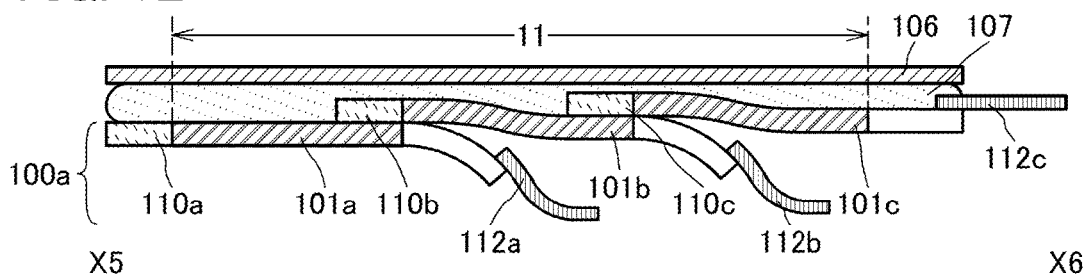

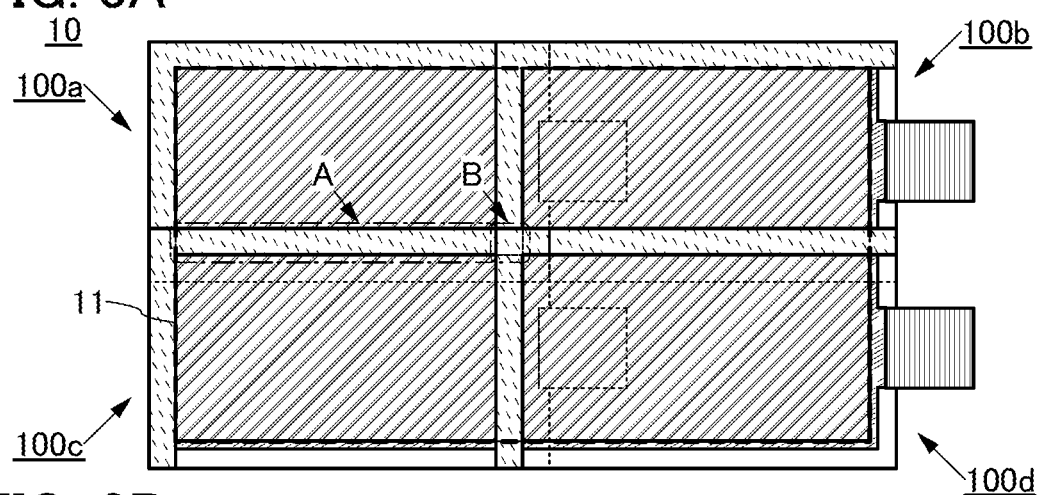
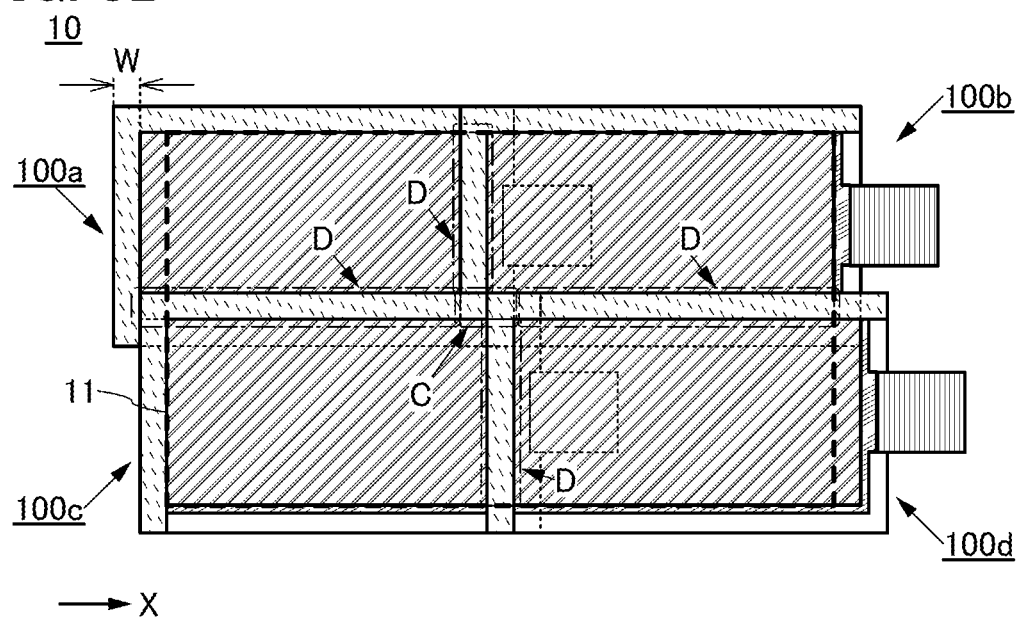

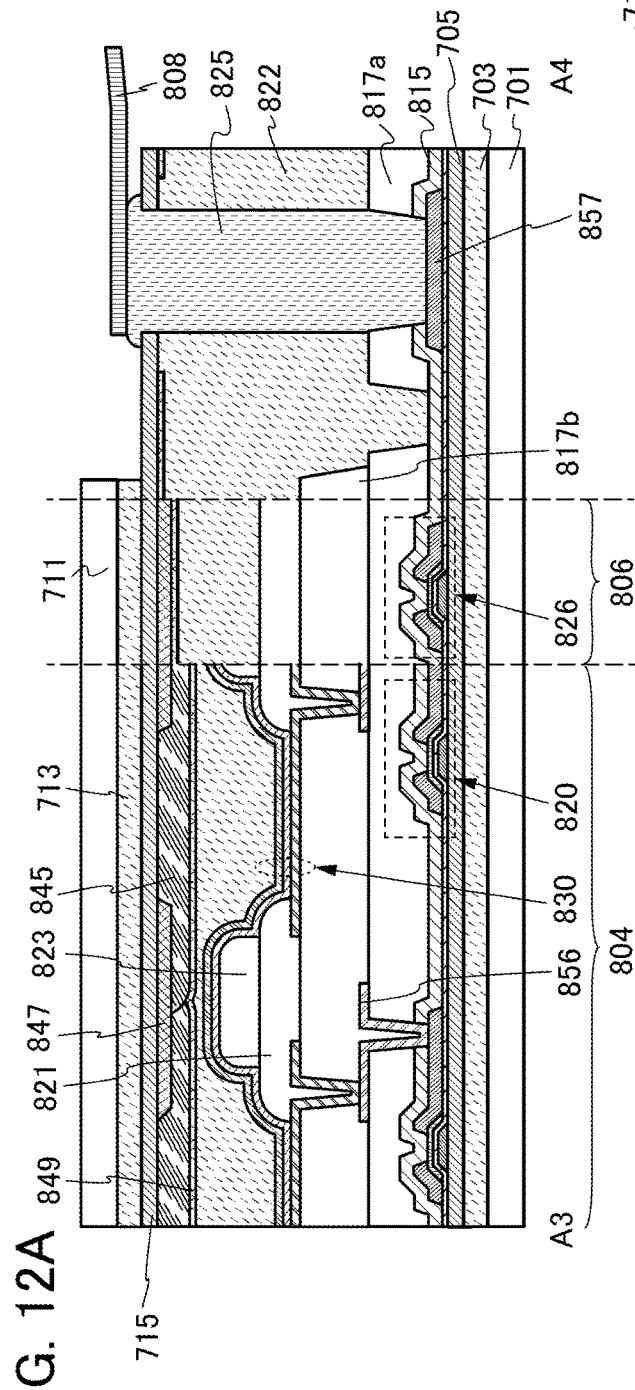
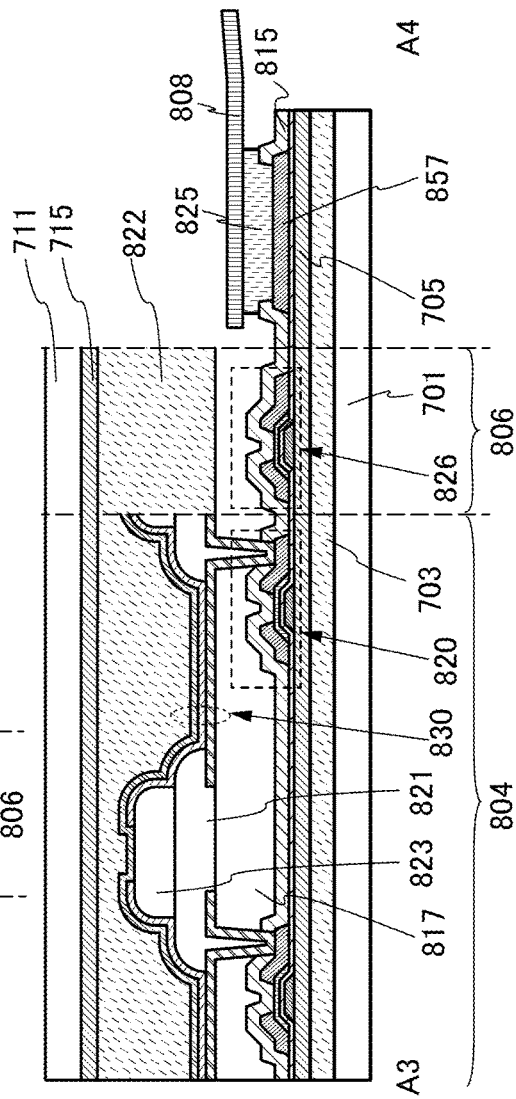
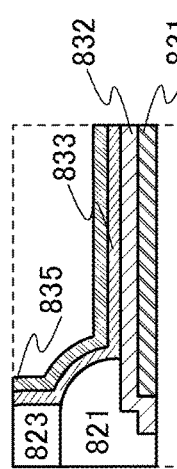
FIG. 12A
FIG. 12B
FIG. 12C

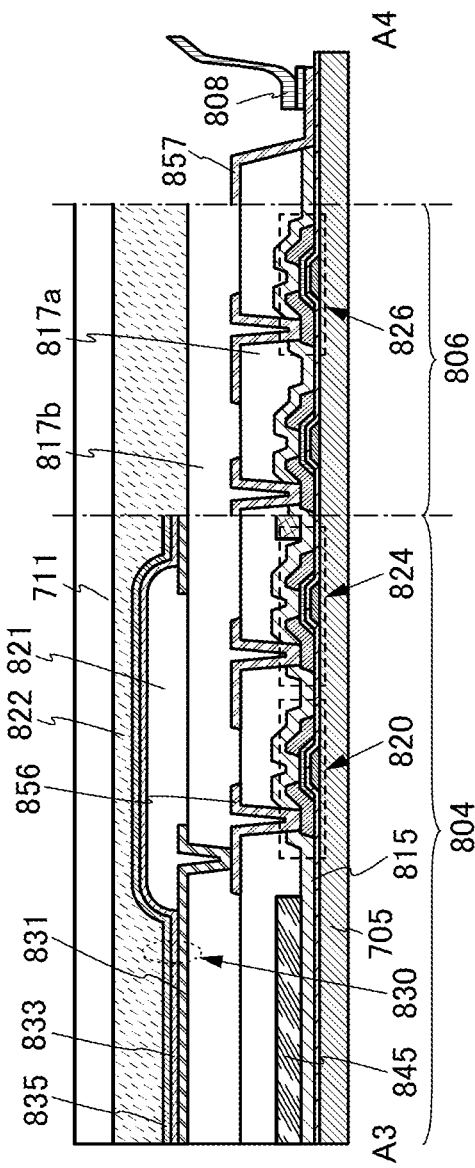

500TP

FIG. 20A
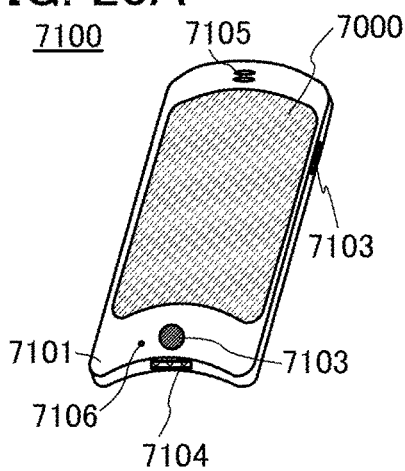
FIG. 20B
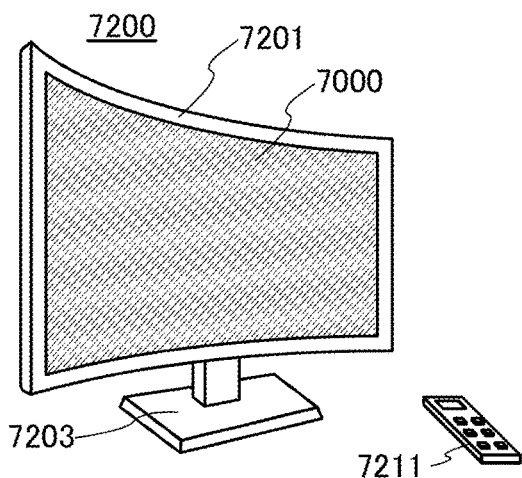
FIG. 20C1
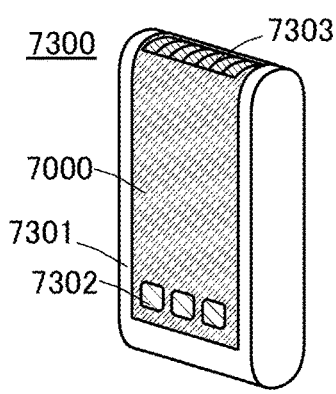
FIG. 20C2
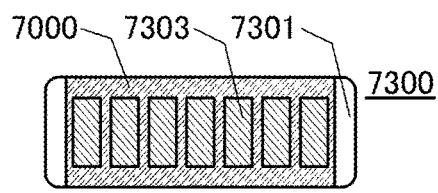
FIG. 20D
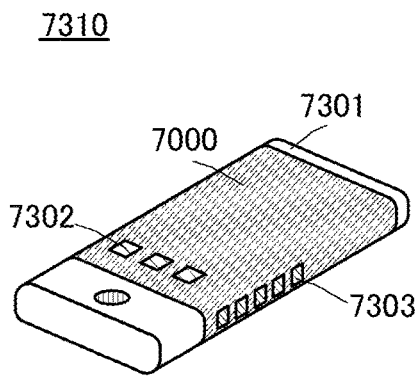
FIG. 20E
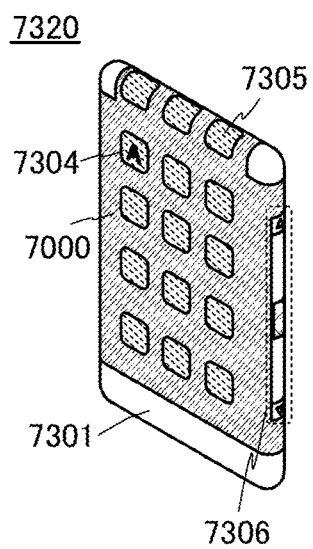

FIG. 21A1
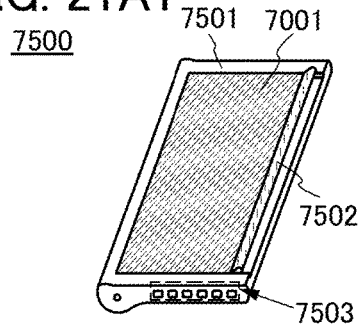
FIG. 21B
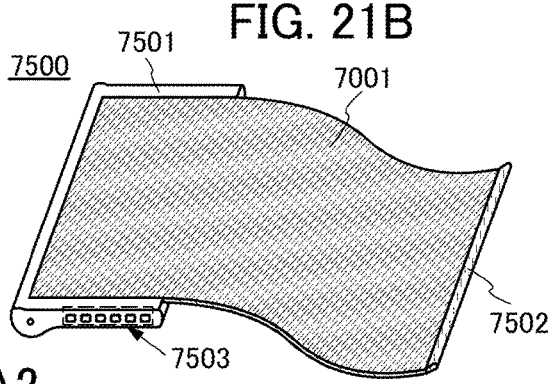
FIG. 21A2
FIG. 21C
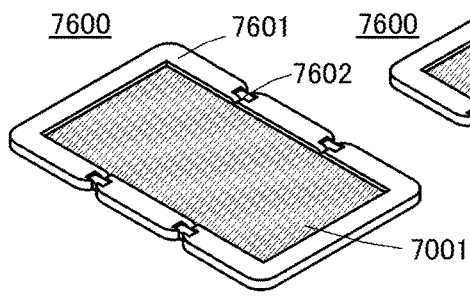
FIG. 21D
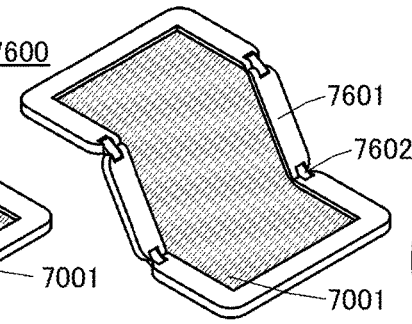
FIG. 21E
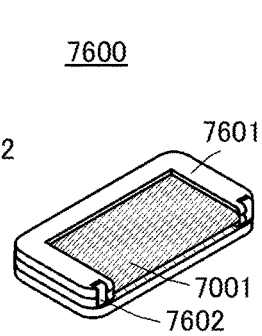
FIG. 21F
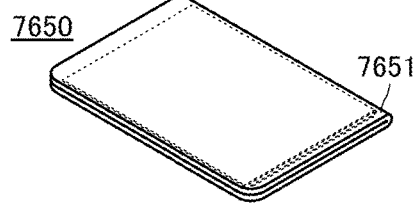
FIG. 21G
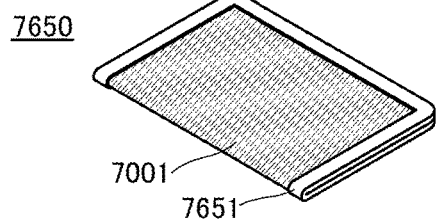
FIG. 21H
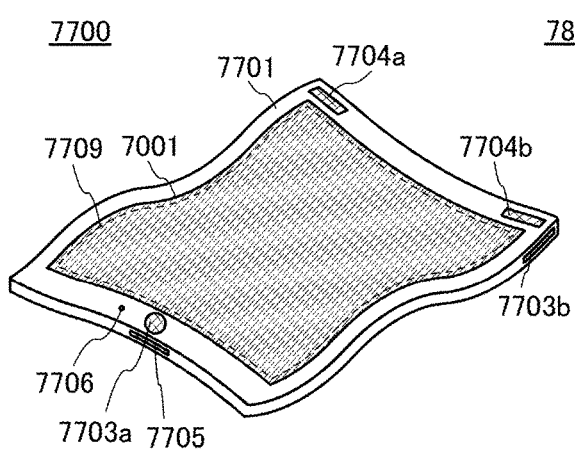
FIG. 21I
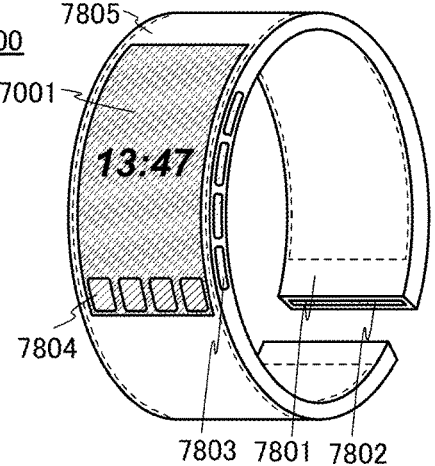

DISPLAY DEVICE

TECHNICAL FIELD

One embodiment of the present invention relates to a display device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a light-emitting device, a lighting device, a power storage device, a storage device, a method for driving any of them, and a method for manufacturing any of them.

BACKGROUND ART

In recent years, larger display devices have been required. For example, a television device for home use (also referred to as a TV or a television receiver), digital signage, and a public information display (PID) are given. Larger digital signage, PID, and the like can provide the increased amount of information, and attract more attention when used for advertisement or the like, so that the effectiveness of the advertisement is expected to be increased.

Examples of the display device include, typically, a light-emitting device including a light-emitting element such as an organic electroluminescent (EL) element or a light-emitting diode (LED), a liquid crystal display device, and an electronic paper performing display by an electrophoretic method or the like.

For example, in a basic structure of an organic EL element, a layer containing a light-emitting organic compound is provided between a pair of electrodes. By voltage application to this element, the light-emitting organic compound can emit light. A display device including such an organic EL element needs no backlight which is necessary for liquid crystal display devices and the like; therefore, thin, lightweight, high contrast, and low power consumption display devices can be obtained. For example, Patent Document 1 discloses an example of a display device including an organic EL element.

Furthermore, Patent Document 2 discloses a flexible active matrix light-emitting device in which an organic EL element and a transistor serving as a switching element are provided over a film substrate.

REFERENCE

Patent Document

[Patent Document 1] Japanese Published Patent Application No. 2002-324673

[Patent Document 2] Japanese Published Patent Application No. 2003-174153

DISCLOSURE OF INVENTION

An object of one embodiment of the present invention is to provide a display device that is suitable for increasing in size. Another object of one embodiment of the present invention is to provide a display device in which display unevenness is suppressed. Another object of one embodiment of the present invention is to provide a display device that can display an image along a curved surface.

Another object is to provide a novel display device. Another object is to provide a novel electronic device.

Note that the descriptions of these objects do not disturb the existence of other objects. In one embodiment of the present invention, there is no need to achieve all the objects. Objects other than the above objects will be apparent from and can be derived from the description of the specification and the like.

One embodiment of the present invention is a display device including a first display panel, a second display panel, a first adhesive layer, and a substrate. The first display panel includes a first region, a second region, and a barrier layer. The second display panel includes a first region, a second region, and a barrier layer. The barrier layer includes a portion overlapping with the first region and a portion overlapping with the second region. The first region includes a region transmitting visible light. The second region is configured to display an image. The barrier layer contains an inorganic insulating material, includes a region in contact with the first adhesive layer, and includes a region with a thickness of 10 nm or more and 2 µm or less. The display device includes a region in which the substrate, the first adhesive layer, the first region of the second display panel, and the second region of the first display panel overlap each other.

In the above display device, the substrate includes a portion having a first refractive index, the first adhesive layer includes a portion having a second refractive index, the barrier layer of the second display panel includes a portion having a third refractive index, and the lowest refractive index among the first refractive index to the third refractive index is preferably 80% or more of the highest refractive index thereof.

In the above display device, the first adhesive layer is preferably formed using a photocurable resin.

Another embodiment of the present invention is the above display device further including a second adhesive layer, which includes a region in contact with the second region of the first display panel. The display device also includes a region where the first region of the second display panel, the second adhesive layer, and the second region of the first display panel overlap each other.

In the above display device, the second adhesive layer includes a portion having a fourth refractive index, the barrier layer of the first display panel includes a portion having a fifth refractive index, and the lower refractive index between the fourth refractive index and the fifth refractive index is preferably 80% or more of the higher refractive index.

In the above display device, the second adhesive layer is preferably formed using a photocurable resin.

Another embodiment of the present invention is an electronic device including the above display device and a microphone, a speaker, a battery, an operation switch, or a housing.

One embodiment of the present invention can provide a display device that is suitable for increasing in size. One embodiment of the present invention can provide a display device in which display unevenness is suppressed. One embodiment of the present invention can provide a display device that can display an image along a curved surface.

Alternatively, a novel display device (display panel), a novel input/output device, or a novel electronic device can be provided. Note that the description of these effects does not disturb the existence of other effects. One embodiment of the present invention does not necessarily achieve all the above effects. Other effects will be apparent from and can be derived from the description of the specification, the drawings, the claims, and the like.

BRIEF DESCRIPTION OF DRAWINGS

In the accompanying drawings:

FIGS. 1A to 1E illustrate a display device according to one embodiment;

FIGS. 3A and 3B each illustrate a display device according to one embodiment;

FIGS. 12A to 12C illustrate display panels according to one embodiment;

FIGS. 13A and 13B illustrate a display panel and a light-emitting panel according to one embodiment;

FIGS. 20A, 20B, 20C1, 20C2, 20D, and 20E illustrate examples of an electronic device;

FIGS. 21A1, 21A2, 21B, 21C, 21D, 21E, 21F, 21G, 21H, and 21I illustrate examples of an electronic device;

BEST MODE FOR CARRYING OUT THE INVENTION

Figure 2A:
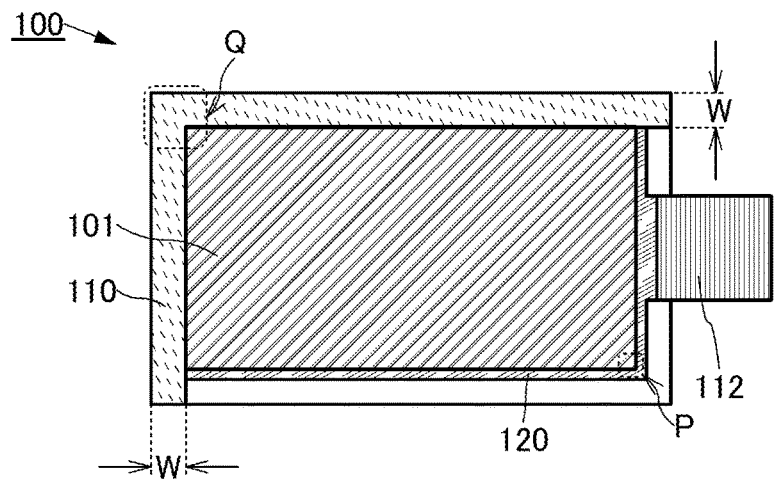
FIGS. 2A to 2C illustrate a display device according to one embodiment.

Embodiments will be described in detail with reference to drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiments below.

Note that in the structures of the invention described below, the same portions or portions having similar functions are denoted by the same reference numerals in different drawings, and description of such portions is not repeated. Further, the same hatching pattern is used for portions having similar functions, and the portions are not especially denoted by reference numerals in some cases.

Note that in each drawing described in this specification, the size, the layer thickness, or the region of each component is exaggerated for clarity in some cases. Therefore, embodiments of the present invention are not limited to such a scale.

Note that in this specification and the like, ordinal numbers such as "first", "second", and the like are used in order to avoid confusion among components and do not limit the number.

Embodiment 1

In this embodiment, structure examples of a display device of one embodiment of the present invention are described with reference to drawings.

Structure Example 1

FIG. 1A is a schematic top view of a display panel 100 that can be included in a display device of one embodiment of the present invention. FIGS. 1B and 1C are examples of schematic cross-sectional views taken along the dashed-dotted lines X1-X2 and X3-X4 in FIG. 1A, respectively.

The display panel 100 includes a display region 101, and a region 110 transmitting visible light and a region 120 blocking visible light that are adjacent to the display region 101. Furthermore, the display panel 100 is provided with a flexible printed circuit (FPC) 112 in the example illustrated in FIG. 1A.

The display region 101 has a function of displaying an image. Specifically, the display region 101 includes a plurality of pixels arranged in a matrix and can display an image. One or more display elements are provided in each pixel. As the display element, typically, a light-emitting element such as an organic EL element, a liquid crystal element, or the like can be used.

FIG. 1B is an example of a schematic cross-sectional view of the display region 101. The display panel 100 has a structure in which a light-emitting element 130 is sandwiched between a barrier layer 105 and a barrier layer 115. Furthermore, the barrier layer 105 on a light-emitting surface side is provided over the light-emitting element 130 with an adhesive layer 104 provided therebetween and is exposed at the surface of the display panel 100. Here, as an example of the display element, the light-emitting element 130 that is an organic EL element is shown.

Although the display panel 100 includes a transistor 160 in FIG. 1B, the display panel 100 does not necessarily include the transistor 160. Furthermore, although the display panel 100 is provided with a substrate 108 with an adhesive layer 118 provided therebetween, the display panel 100 is not necessarily provided with the substrate 108. Alternatively, another substrate may be provided over the barrier layer 105, in other words, the display panel 100 may be sandwiched between a pair of substrates. Alternatively, a structure in which the display panel 100 does not include the barrier layer 115 and the transistor 160 and the like are provided over the substrate 108 may be employed, for example.

The display panel 100 preferably has flexibility. Thus, the substrate 108 preferably has flexibility. When the display panel 100 has flexibility, the plurality of display panels 100 can be combined more freely.

In the region 110, for example, a pair of barrier layers included in the display panel 100, a sealant for sealing the display element sandwiched between the pair of barrier layers, and the like may be provided. Here, for members provided in the region 110, materials that transmit visible light are used. The average transmittance of light in the visible region (in a wavelength of 350 nm or more and 750 nm or less) of the region 110 is preferably greater than or equal to 70%, further preferably greater than or equal to 80%, still further preferably greater than or equal to 90%.

FIG. 1C is an example of a schematic cross-sectional view of the region 110. The barrier layer 105, the barrier layer 115, the adhesive layer 104, the adhesive layer 118, and the substrate 108 transmit visible light. In the case where a layer included in the transistor 160 and a layer positioned between the light-emitting element 130 and the transistor 160 in the display region 101 extend to the region 110, these layers also transmit visible light.

In the region 120, for example, a wiring electrically connected to the pixels included in the display region 101 is provided. In addition to the wiring, driver circuits (such as a scan line driver circuit and a signal line driver circuit) for driving the pixels may be provided. Furthermore, the region 120 includes a region where a terminal electrically connected to the FPC 112 (also referred to as a connection terminal), a wiring electrically connected to the terminal, and the like are provided.

With a structure in which the light-emitting element 130 is sandwiched between a pair of barrier layers, the reliability of the display panel 100 can be increased. Moreover, the display panel 100 does not include a substrate on the display surface side, whereby the loss of light when light emitted from the light-emitting element 130 is extracted outside can be reduced.

The barrier layer 105 is closer to the display surface than the light-emitting element 130 is; thus, the barrier layer 105 transmits visible light. In addition, the barrier layer 105 and the barrier layer 115 preferably have a function of inhibiting entry of impurities such as moisture into the light-emitting element 130. In the case where the display panel 100 does not include the barrier layer 115, a layer provided on the side of the light-emitting element 130 that is opposite to the display surface side, e.g., the substrate 108, preferably has a function of inhibiting entry of impurities. In addition, the barrier layer 105 and the barrier layer 115 may have a function of increasing the mechanical strength of the display panel 100.

The barrier layer 105 may be a single layer or a multilayer. The barrier layer 105 preferably contains an inorganic insulating material. Examples of the inorganic insulating material include aluminum nitride, aluminum oxide, aluminum nitride oxide, aluminum oxynitride, magnesium oxide, gallium oxide, silicon nitride, silicon oxide, silicon nitride oxide, silicon oxynitride, germanium oxide, zirconium oxide, lanthanum oxide, neodymium oxide, and tantalum oxide. In this specification, the nitride oxide refers to a material containing a larger amount of nitrogen than oxygen, and the oxynitride refers to a material containing a larger amount of oxygen than nitrogen. In order to prevent entry of impurities, the barrier layer 105 preferably has a thickness of 10 nm or more and 2 μm or less, further preferably has a thickness of 100 nm or more and 1 μm or less.

Alternatively, the barrier layer 105 may be formed using a resin material or a metal material. For the resin material, a material described later that can be used for the substrate 108 can be referred to. There is no particular limitation on the metal material, and aluminum, copper, iron, titanium, nickel, an alloy such as an aluminum alloy or stainless steel, or the like can be used. In the case where the barrier layer 105 contains a metal material, the barrier layer 105 may be formed to be thin enough to transmit visible light.

When the barrier layer 105 becomes thick, the mechanical strength of the display panel 100 is increased, which is preferable. In contrast, the barrier layer 105 is preferably thin so that the display panel 100 has flexibility. Thus, in order to increase the mechanical strength of the display panel 100, the barrier layer 105 preferably has a thickness of 5 μm or more and 100 μm or less, further preferably has a thickness of 20 μm or more and 50 μm or less.

The barrier layer 115 can be formed using a material similar to that of the barrier layer 105. Note that the barrier layer 115 does not necessarily transmit visible light; thus, for example, in the case where the barrier layer 105 and the barrier layer 115 are formed using a metal material, the barrier layer 115 may have a thickness larger than that of the barrier layer 105.

A display device 10 of one embodiment of the present invention includes a plurality of such display panels 100. FIG. 1D is a schematic top view of the display device 10 including three display panels 100. FIG. 1E is a cross-sectional view taken along the dashed-dotted line X5-X6 in FIG. 1D.

Hereinafter, to distinguish the display panels from each other, the same components included in the display panels from each other, or the same components relating to the display panels from each other, letters are added to reference numerals. Unless otherwise specified, "a" is added to reference numerals for a display panel and components placed on the lowest side (the side opposite to the display surface side), and to one or more display panels and components placed thereover, "b" or letters after "b" in alphabetical order are added from the lower side. Furthermore, unless otherwise specified, in describing a structure in which a plurality of display panels is included, letters are not added when a common part of the display panels or the components is described.

The display device 10 in FIGS. 1D and 1E includes a display panel 100a, a display panel 100b, a display panel 100c, a substrate 106, and an adhesive layer 107. The substrate 106 is provided to overlap with the barrier layers 105 on the uppermost surface on the display surface side of the display panels with the adhesive layer 107 provided therebetween. The barrier layers 105 (105a, 105b, and 105c) are provided in contact with the adhesive layer 107. In FIG. 1D, the substrate 106 and the adhesive layer 107 are not shown. In FIG. 1E, the barrier layers 105 (105a, 105b, and 105c) are included in the display panels 100 (100a, 100b, and 100c), respectively.

The display panel 100b is placed so that part of the display panel 100b overlaps an upper side (a display surface side) of the display panel 100a. Specifically, the display panel 100b is placed so that a region 110b transmitting visible light of the display panel 100b overlaps a display region 101a of the display panel 100a. That is, in the display device 10, the display region 101a, the region 110b, the adhesive layer 107, and the substrate 106 are provided in this order to overlap each other.

Furthermore, the display panel 100c is placed so that part of the display panel 100c overlaps an upper side (a display surface side) of the display panel 100b. Specifically, the display panel 100c is placed so that a region 110c transmitting visible light of the display panel 100c overlaps a display region 101b of the display panel 100b. That is, in the display device 10, the display region 101b, the region 110c, the adhesive layer 107, and the substrate 106 are provided in this order to overlap each other.

The region 110b transmitting visible light overlaps the display region 101a; thus, the whole display region 101a can be visually recognized from the display surface side. Similarly, the whole display region 101b can also be visually recognized from the display surface side when the region 110c overlaps the display region 101b. Therefore, a region where the display region 101a, the display region 101b, and the display region 101c are placed seamlessly can serve as a display region 11 of the display device 10.

Here, the width W of the region 110 in FIG. 1A is preferably greater than or equal to 0.5 mm and less than or equal to 150 mm, further preferably greater than or equal to 1 mm and less than or equal to 100 mm, further preferably greater than or equal to 2 mm and less than or equal to 50 mm. The region 110 serves as a sealing region, and as the width W of the region 110 is larger, the distance between an end surface of the display panel 100 and the display region 101 can become longer, so that entry of an impurity such as water into the display region 101 from the outside can be effectively inhibited. In particular, in this structure example, the region 110 is provided adjacent to the display region 101; thus, it is important to set the width W of the region 110 at an appropriate value. For example, in the case where an organic EL element is used as the display element, the width W of the region 110 is set to be greater than or equal to 1 mm, whereby deterioration of the organic EL element can be effectively suppressed. Note that also in a part other than the region 110, the distance between the end portion of the display region 101 and the end surface of the display panel 100 is preferably in the above range.

The adhesive layer 107 and the substrate 106 transmit visible light. In the display device 10, the adhesive layer 107 and the substrate 106 cover the top surfaces of the display panel 100a and the display panel 100b. By providing the adhesive layer 107 and the substrate 106 over the plurality of display panels 100, the mechanical strength of the display device 10 can be increased.

The materials of the adhesive layer 107 and the substrate 106 are preferably selected so that the lowest refractive index among the refractive indices of the adhesive layer 107, the substrate 106, and the barrier layer 105 is 80% or more, preferably 90% or more, further preferably 95% or more of the highest refractive index thereof. By using the adhesive layer 107 and the substrate 106 having such refractive indices, the refractive index difference between stacked layers (e.g., the barrier layer 105c, the adhesive layer 107, and the substrate 106) that are provided on the path of light emitted from the display panel 100 can be reduced and light can be efficiently extracted outside. Note that the barrier layer 105c is, although not shown in FIG. 1E, on the uppermost surface on the display surface side of the display panel 100c (see FIG. 1B). In FIG. 1E, the barrier layer 105c, the adhesive layer 107, and the substrate 106 are in contact with each other in this order.

In addition, the adhesive layer 107 and the substrate 106 with such refractive indices are provided to cover a step portion between the display panel 100a and the display panel 100b, whereby the step portion is not easily recognized visually, and the display quality of an image displayed on the display region 11 of the display device 10 can be increased. In this specification and the like, a refractive index refers to the average value of refractive indices in the visible region (in a wavelength of 350 nm or more and 750 nm or less).

For the adhesive layer 107, a viscous material or a curable resin such as a heat curable resin, a photocurable resin, or a two-component curable resin can be used. For instance, an acrylic resin, a urethane resin, an epoxy resin, a silicone resin, or a resin having a siloxane bond can be used. Alternatively, a material used for a resin layer 131 described later may be used for the adhesive layer 107. For the adhesive layer 104 and the adhesive layer 118, a material similar to that of the adhesive layer 107 can be used.

In particular, a photocurable resin is preferably used for the adhesive layer 107. By using the photocurable resin, the adhesive layer 107 can be cured at room temperature without damaging the light-emitting element included in the display panel 100. Furthermore, the photocurable resin is not cured until being irradiated with light; thus, the time for accurately setting the position between the display panels or the position between the substrate and the display panel can be secured after the resin is applied.

Note that the irradiation with light such as ultraviolet rays affects the characteristics of the transistor in some cases. Thus, in the case of using an ultraviolet curable resin or the like, it is preferable that a resin that requires a long time to start to be cured after the irradiation be selected and the resin be applied to a region that does not include a transistor, such as the substrate or the region 110 of the display panel 100, and then the region be irradiated with light.

As the substrate 106, a plastic substrate that is formed as a film, for example, a plastic substrate made from polyimide (PI), an aramid, polyethylene terephthalate (PET), polyethersulfone (PES), polyethylene naphthalate (PEN), polycarbonate (PC), nylon, polyetheretherketone (PEEK), polysulfone (PSF), polyetherimide (PEI), polyarylate (PAR), polybutylene terephthalate (PBT), a silicone resin, or the like can be used. The substrate 106 is preferably flexible. The substrate 106 may include a fiber or the like (e.g., a prepreg). Furthermore, the substrate 106 is not limited to the resin film, and a transparent nonwoven fabric formed by processing pulp into a continuous sheet, a sheet including an artificial spider's thread fiber containing protein called fibroin, a complex in which the transparent nonwoven fabric or the sheet and a resin are mixed, a stack of a resin film and a nonwoven fabric containing a cellulose fiber whose fiber width is 4 nm or more and 100 nm or less, or a stack of a resin film and a sheet including an artificial spider's thread fiber may be used. For the substrate 108, a material similar to that of the substrate 106 can be used.

In the display device 10 illustrated in FIG. 1E, one end portion of the display region 101a and one end portion of the display region 101b, and the other end portion of the display region 101b and one end portion of the display region 101c each are aligned; however, the display device 10 is not limited thereto. The display device 10 may include a region where the display region 101a and the display region 101b overlap and a region where the display region 101b and the display region 101c overlap.

Structure Example 2

In FIGS. 1D and 1E, the plurality of display panels 100 overlap each other in one direction; however, a plurality of display panels 100 may overlap each other in two directions of the vertical and horizontal directions.

FIG. 2A shows an example of the display panel 100 in which the shape of the region 110 is different from that in FIG. 1A. In the display panel 100 in FIG. 2A, the region 110 that transmits visible light is placed along two sides of the display region 101.

Figure 2B:
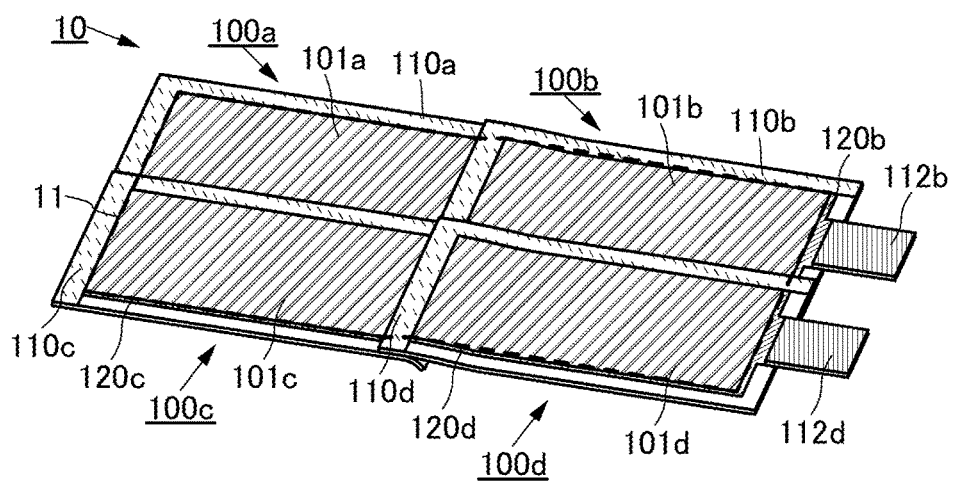
Figure 2C:
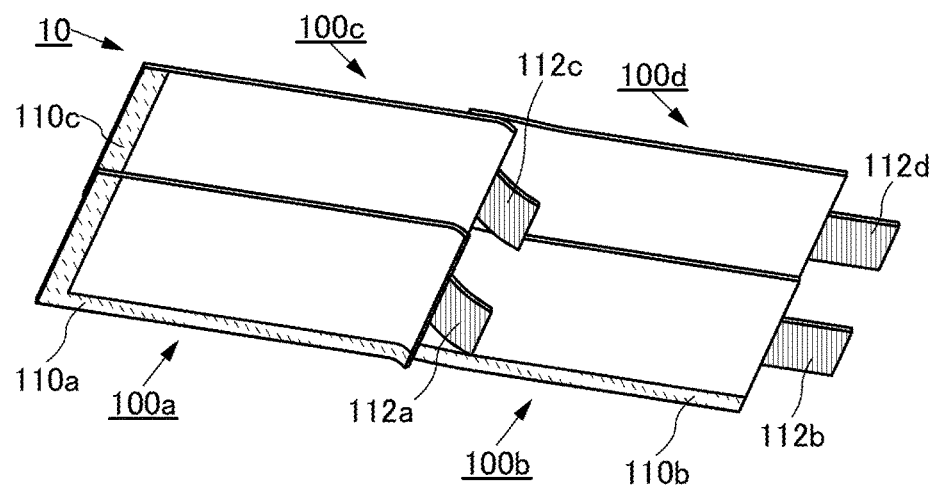

FIG. 2B is a schematic perspective view of the display device 10 in which the display panels 100 in FIG. 2A are arranged two by two in both vertical and horizontal directions. FIG. 2C is a schematic perspective view of the display device 10 when seen from a side opposite to the display surface side. In FIGS. 2B and 2C, the substrate 106 and the adhesive layer 107 are not shown.

In FIGS. 2B and 2C, part of the region 110b of the display panel 100b overlaps a region along a short side of the display region 101a of the display panel 100a. In addition, part of the region 110c of the display panel 100c overlaps a region along a long side of the display region 101a of the display panel 100a. Moreover, the region 110d of the display panel 100d overlaps both a region along a long side of the display region 101b of the display panel 100b and a region along a short side of the display region 101c of the display panel 100c.

Therefore, as illustrated in FIG. 2B, a region where the display region 101a, the display region 101b, the display region 101c, and the display region 101d are placed seamlessly can serve as the display region 11 of the display device 10.

Here, it is preferable that the display panel 100 have flexibility. As is the case of the display panel 100a in FIGS. 2B and 2C, part of the display panel 100a on the FPC 112a side is curved when the FPC 112a and the like are provided on the display surface side, whereby the FPC 112a can be placed under the display region 101b of the adjacent display panel 100b so as to overlap with the display region 101b, for example. As a result, the FPC 112a can be placed without physical interference with the rear surface of the display panel 100b. Furthermore, when the display panel 100a and the display panel 100b overlap and are bonded to each other, it is not necessary to consider the thickness of the FPC 112a; thus, the difference in height between the top surface of the region 110b of the display panel 100b and the top surface of the display region 101a of the display panel 100a can be reduced. As a result, the end portion over the display region 101a of the display panel 100b can be prevented from being visually recognized.

Moreover, each display panel 100 has flexibility, whereby the display panel 100b can be curved gently so that the top surface of the display region 101b of the display panel 100b and the top surface of the display region 101a of the display panel 100a are equal to each other in height. Thus, the heights of the display regions can be equal to each other except in the vicinity of the region where the display panel 100a and the display panel 100b overlap each other, so that the display quality of an image displayed on the display region 11 of the display device 10 can be improved.

Although the relationship between the display panel 100a and the display panel 100b is taken as an example in the above description, the same can apply to the relationship between any two adjacent display panels.

Furthermore, to reduce the step between two adjacent display panels 100, the thickness of the display panel 100 is preferably small. For example, the thickness of the display panel 100 is preferably less than or equal to 1 mm, further preferably less than or equal to 300 μm, still further preferably less than or equal to 100 μm.

FIG. 3A is a schematic top view of the display device 10 in FIGS. 2B and 2C when seen from the display surface side.

Here, when the region 110 of one display panel 100 does not have sufficiently high transmittance of light in the visible region (in a wavelength of greater than or equal to 350 nm and less than or equal to 750 nm), luminance of a displayed image may be decreased depending on the number of display panels 100 overlapping the display regions 101. For example, in a region A in FIG. 3A, one display panel 100c overlaps the display region 101a of the display panel 100a. In a region B, the three display panels 100 (the display panels 100b, 100c and 100d) overlap the display region 101a of the display panel 100a.

In this case, it is preferable that data of the displayed image be corrected so that the gray scale of the pixels is locally increased depending on the number of display panels 100 overlapping the display regions 101. In this manner, a decrease in the display quality of the image displayed on the display region 11 of the display device 10 can be suppressed.

Alternatively, the position of the display panel 100 placed in the upper portion may be shifted, whereby the number of display panels 100 overlapping the display regions 101 of the lower display panels 100 can be reduced.

In FIG. 3B, the display panel 100c and the display panel 100d placed on the display panel 100a and the display panel 100b are relatively shifted in one direction (X direction) by the distance of the width W of the region 110. At this time, there are two kinds of regions: a region C in which two display panels 100 overlap a display region 101 of another display panel 100; and a region D in which one display panel 100 overlaps a display region 101 of another display panel 100.

In the case where the display panel 100 placed in the upper portion is relatively shifted, the shape of the contour of a region in which the display regions 101 of the display panels 100 are combined is different from a rectangular shape. Thus, in the case where the shape of the display region 11 of the display device 10 is set to a rectangular shape as illustrated in FIG. 3B, the display device 10 may be driven so that no image is displayed on the display regions 101 of the display panels 100 that are placed outside the display region 11. Here, considering the number of pixels in a region where an image is not displayed, more pixels than the number obtained by dividing the number of all the pixels in the display region 11 by the number of display panels 100 may be provided in the display region 101 of the display panel 100.

Although the distance of relative shift of each display panel 100 is set to an integral multiple of the width W of the region 110 in the above example, the distance is not limited thereto, and may be set as appropriate in consideration of the shape of the display panel 100, the shape of the display region 11 of the display device 10, in which the display panels 100 are combined, and the like.

[Cross-Sectional Structure Example]

Figure 4A:
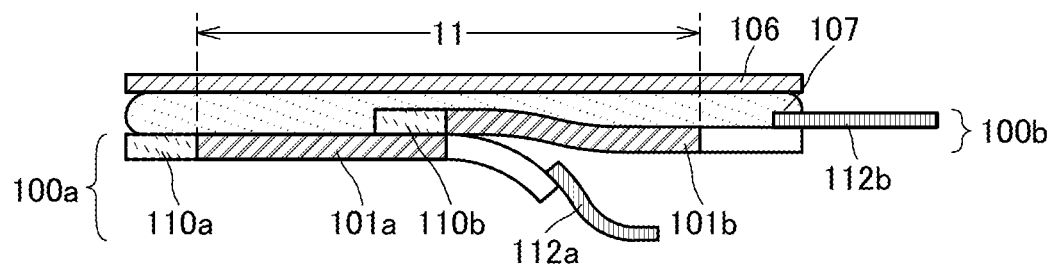
FIGS. 4A to 4D each illustrate a display device according to one embodiment.

FIG. 4A is a schematic cross-sectional view of the display device 10 when the two display panels 100 in FIG. 1A are bonded to each other. In FIG. 4A, the FPC 112a and an FPC 112b are connected to the display panel 100a and the display panel 100b on the display surface side, respectively.

Figure 4B:
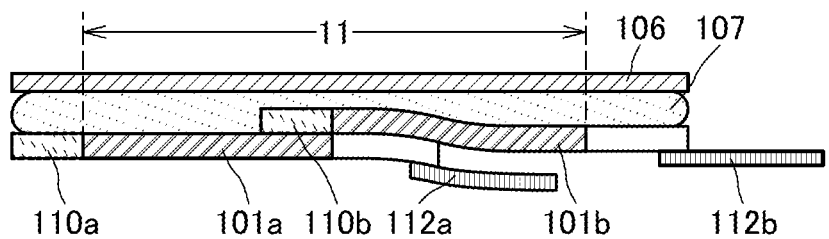

Alternatively, as illustrated in FIG. 4B, the FPC 112a and the FPC 112b may be connected to the display panel 100a and the display panel 100b on a side opposite to the display surface side, respectively. With this structure, the end portion of the display panel 100a positioned on the lower side can be attached to the rear surface of the display panel 100b; thus, the attachment area can be increased and the mechanical strength of the attached portion can be increased.

Figure 4C:
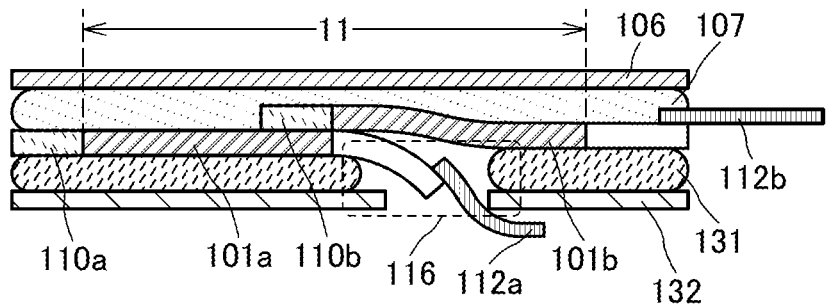

Alternatively, as illustrated in FIG. 4C, a resin layer 131 may be provided on a surface opposite to the display surfaces of the display panel 100a and the display panel 100*b*, and a protective substrate 132 may be provided with the resin layer 131 provided between the protective substrate 132 and each of the display panels 100*a* and 100*b*. Here, the resin layer 131 may serve as an adhesive layer for bonding the protective substrate 132 to the display device 10. With such a structure, the mechanical strength of the display device 10 can be further increased.

As a material used for the resin layer 131, for example, an organic resin such as an epoxy resin, an aramid resin, an acrylic resin, a polyimide resin, a polyamide resin, or a polyamide-imide resin can be used.

As the protective substrate 132, a substrate similar to the above-described substrate 106 can be used.

As illustrated in FIG. 4C, an opening portion 116 for extracting the FPC 112*a* is preferably provided in the resin layer 131 and the protective substrate 132, which are located on the rear surface sides of the display panels 100*a* and 100*b*.

Note that the resin layer 131 and the protective substrate 132, which are provided on the side opposite to the display surface, do not necessarily have a transmitting property to visible light, and a material which absorbs or reflects visible light may be used. When the resin layer 131 and the adhesive layer 107, or the protective substrate 132 and the substrate 106 have the same materials, manufacturing cost can be reduced.

Figure 4D:
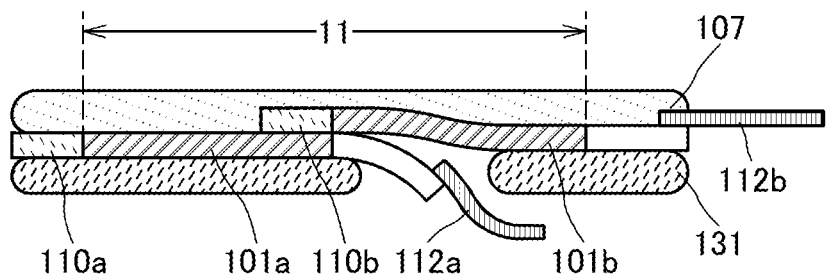

Note that in the case where the adhesive layer 107 and/or the resin layer 131 are thick enough to keep the mechanical strength of the display device 10, the substrate 106 and/or the protective substrate 132 are not necessarily provided. Alternatively, in the case where one of the adhesive layer 107 and the resin layer 131 is thick enough to keep the mechanical strength of the display device 10, the substrate 106 and the protective substrate 132 are not necessarily provided and the other of the adhesive layer 107 and the resin layer 131 is not necessarily provided. FIG. 4D is a cross-sectional view in the case where the display device 10 does not include the substrate 106 and the protective substrate 132. In the case where the display device 10 does not include the substrate 106 as in FIG. 4D, the amount of light emitted from the light-emitting elements included in the display panels 100*a* and 100*b* can be increased as compared with the case in FIG. 4A because of no light attenuation in the substrate 106.

Figure 5A:
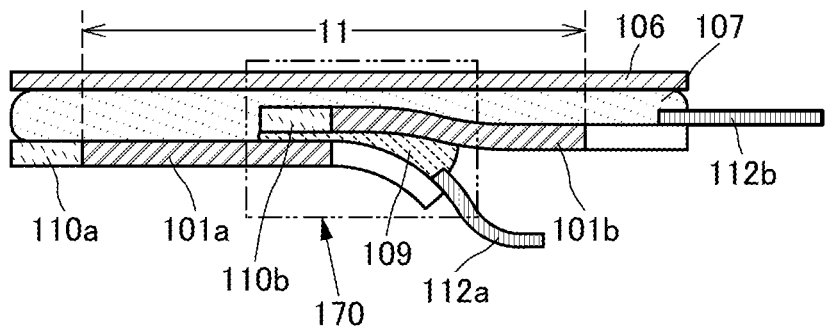
FIGS. 5A to 5D each illustrate a display device according to one embodiment.

Alternatively, as illustrated in FIG. 5A, the display panel 100*a* and the display panel 100*b* may be bonded to each other with the adhesive layer 109. The display panel 100*a* includes the barrier layer 105*a* on the uppermost surface on the display surface side; thus, in the display device 10 in FIG. 5A, the barrier layer 105*a* is in contact with the adhesive layer 109.

Figure 5B:
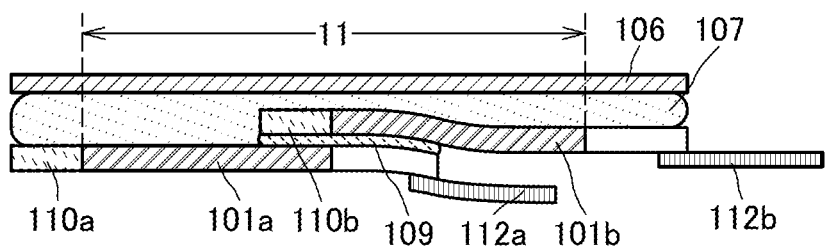

At this time, by providing the adhesive layer 109 to cover part of the FPC 112*a*, the mechanical strength at a connection portion between the display panel 100*a* and the FPC 112*a* can be increased, and defects such as peeling of the FPC 112*a* can be reduced. Furthermore, in FIG. 5B, the display device 10 includes the adhesive layer 109, and the FPC 112*a* and the FPC 112*b* are provided on surfaces opposite to the display surfaces of the display panel 100*a* and the display panel 100*b*, respectively.

For the adhesive layer 109, a material similar to that of the adhesive layer 107 is preferably used. Here, the material of the adhesive layer 109 is preferably selected so that the lower refractive index between the refractive indices of the adhesive layer 109 and the barrier layer 105*a* is 80% or more, preferably 90% or more, further preferably 95% or more of the higher refractive index. By using the adhesive layer 109 having such a refractive index, the light emitted from the light-emitting elements in the display region 101*a* in a region overlapping with the region 110*b* that transmits visible light can be efficiently extracted outside.

The structure of the adhesive layer 107 and the adhesive layer 109 in the display device 10 is not limited to that shown in FIG. 5A. The above structure varies in accordance with a method of bonding the display panel 100*a*, the display panel 100*b*, and the substrate 106.

Figure 5C:
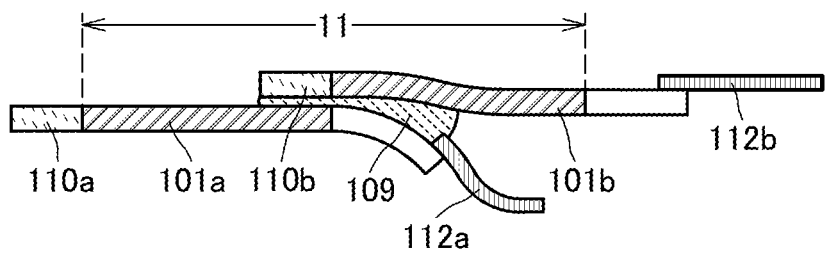

For example, first, the display panel 100*a* provided with the FPC 112*a* is bonded to the display panel 100*b* provided with the FPC 112*b* with the adhesive layer 109 (see FIG. 5C). Then, the substrate 106 is bonded to the display panels 100*a* and 100*b* with the adhesive layer 107, so that the adhesive layer 107 and the adhesive layer 109 in the display device 10 have a structure as shown in FIG. 5A.

Figure 5D:
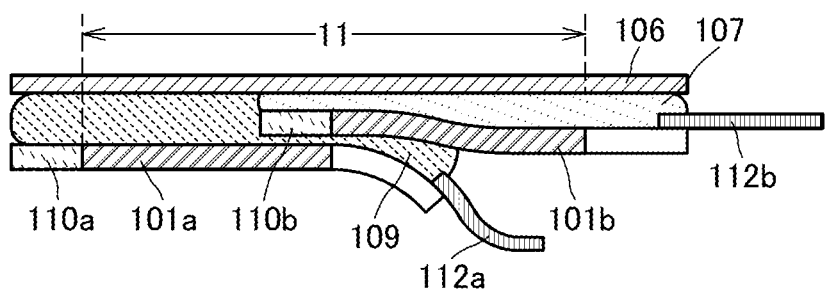

Alternatively, the display panel 100*b* provided with the FPC 112*b* is bonded to the substrate 106 with the adhesive layer 107. Then, the display panel 100*a* provided with the FPC 112*a* is bonded to the substrate 106 and the display panel 100*b* with the adhesive layer 109. In this case, the adhesive layer 107 and the adhesive layer 109 in the display device 10 have a structure as shown in FIG. 5D.

Note that in the case where the display panels 100*a* and 100*b* each include the substrate 108 and thus have a certain mechanical strength, the substrate 106 and the adhesive layer 107 are not necessarily included in the display device 10 as in FIG. 5C. When the display device 10 does not include the substrate 106, the light emitted from the light-emitting elements included in the display panels 100*a* and 100*b* can be extracted more efficiently.

[Structure Example of Display Region]

Figure 6A:
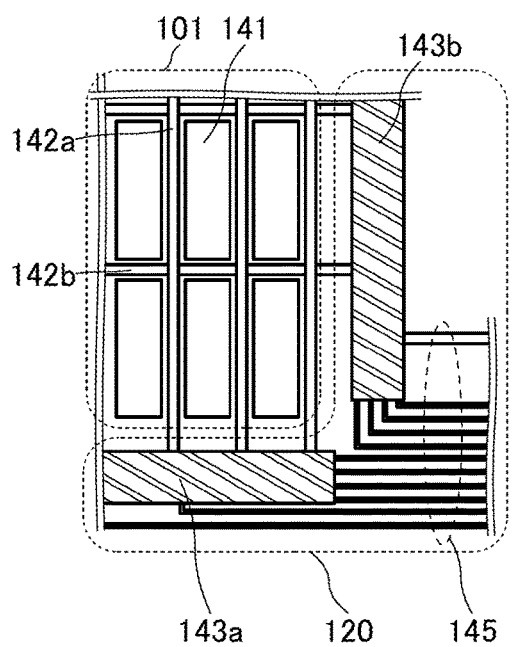
FIGS. 6A to 6C illustrate a display panel according to one embodiment.
Figure 6B:
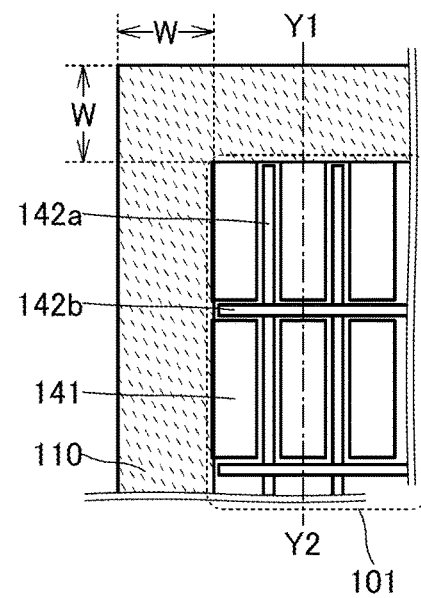

Next, a structure example of the display region 101 of the display panel 100 is described. FIG. 6A is a schematic top view in which a region P in FIG. 2A is enlarged, and FIG. 6B is a schematic top view in which a region Q in FIG. 2A is enlarged.

As illustrated in FIG. 6A, in the display region 101, a plurality of pixels 141 is arranged in a matrix. In the case where the display panel 100 which is capable of full color display with three colors of red, blue, and green is formed, the pixel 141 can display any of the three colors. Alternatively, a pixel which can display white or yellow in addition to the three colors may be provided. A region including the pixels 141 corresponds to the display region 101.

One pixel 141 is electrically connected to a wiring 142*a* and a wiring 142*b*. The plurality of wirings 142*a* each intersects with the wiring 142*b*, and is electrically connected to a circuit 143*a*. The plurality of wirings 142*b* is electrically connected to a circuit 143*b*. One of the circuits 143*a* and 143*b* can function as a scan line driver circuit, and the other can function as a signal line driver circuit. A structure without one of the circuits 143*a* and 143*b* or both of them may be employed.

In FIG. 6A, a plurality of wirings 145 electrically connected to the circuit 143*a* or the circuit 143*b* is provided. The wiring 145 is electrically connected to an FPC 123 in a region not shown in the figure and has a function of supplying a signal from the outside to the circuits 143*a* and 143*b*.

In FIG. 6A, a region including the circuit 143*a*, the circuit 143*b*, and the plurality of wirings 145 corresponds to the region 120 blocking visible light.

In FIG. 6B, a region outside the pixel 141 provided closest to the end corresponds to the region 110 transmitting visible light. The region 110 does not include the members blocking visible light, such as the pixel 141, the wiring 142*a*, and the wiring 142b. Note that in the case where part of the pixel 141, the wiring 142a, or the wiring 142b transmits visible light, the part of the pixel 141, the wiring 142a, or the wiring 142b may be provided to extend to the region 110.

Here, the width W of the region 110 indicates the narrowest width of the region 110 provided in the display panel 100 in some cases. In the case where the width W of the display panel 100 varies depending on the positions, the shortest length can be referred to as the width W. In FIG. 6B, the distance between the pixel 141 and the end surface of the substrate (that is, the width W of the region 110) in the vertical direction is the same as that in the horizontal direction.

Figure 6C:
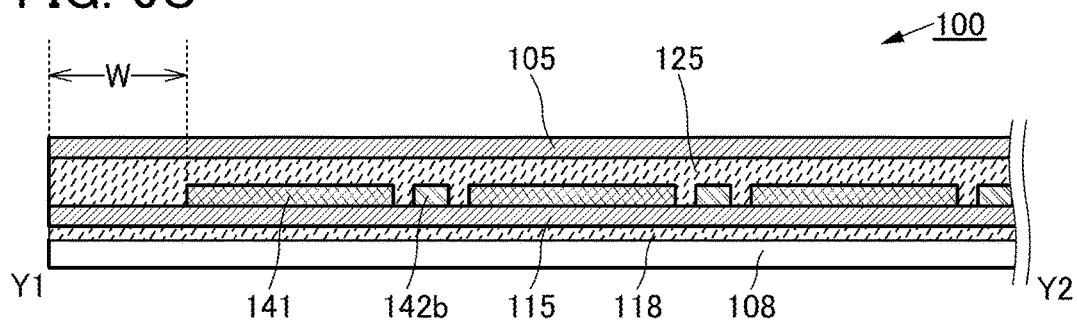

FIG. 6C is a schematic cross-sectional view taken along the dashed-dotted line Y1-Y2 in FIG. 6B. The display panel 100 illustrated in FIG. 6C includes a pair of barrier layers (the barrier layer 105 and the barrier layer 115) each of which transmits visible light. The barrier layer 105 and the barrier layer 115 are bonded to each other with an adhesive layer 125, and the substrate 108 is bonded to the barrier layer 115 with the adhesive layer 118. The pixel 141, the wiring 142b, and the like are formed over the barrier layer 115.

As illustrated in FIGS. 6B and 6C, in the case where the pixel 141 is positioned closest to the end of the display region 101, the width W of the region 110 transmitting visible light is the distance between the end portion of the barrier layer 105 or the substrate 108 and the end portion of the pixel 141.

Note that the end portion of the pixel 141 refers to the end portion of the member that is positioned closest to the end and blocks visible light in the pixel 141. Alternatively, in the case where a light-emitting element including a layer containing a light-emitting organic compound between a pair of electrodes (also referred to as an organic EL element) is used as the pixel 141, the end portion of the pixel 141 may be any of the end portion of the lower electrode, the end portion of the layer containing a light-emitting organic compound, and the end portion of the upper electrode.

Figure 7A:
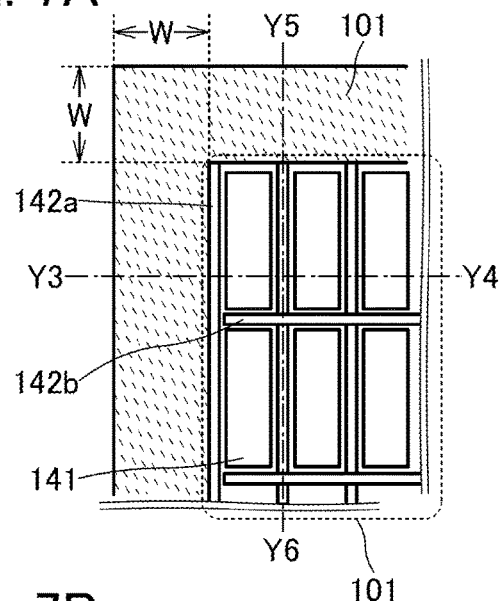
FIGS. 7A to 7C illustrate a display panel according to one embodiment.
Figure 7B:
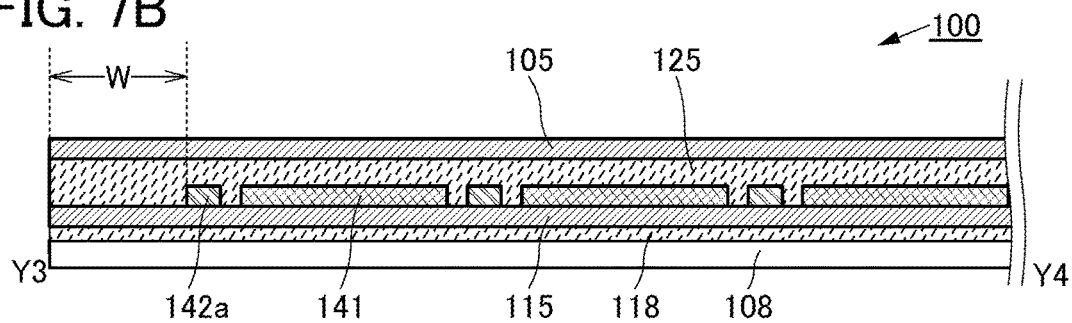

FIG. 7A shows the case where the position of the wiring 142a is different from that in FIG. 6B. FIG. 7B is a schematic cross-sectional view taken along dashed-dotted line Y3-Y4 in FIG. 7A, and FIG. 7C is a schematic cross-sectional view taken along dashed-dotted line Y5-Y6 in FIG. 7A.

Figure 7C:
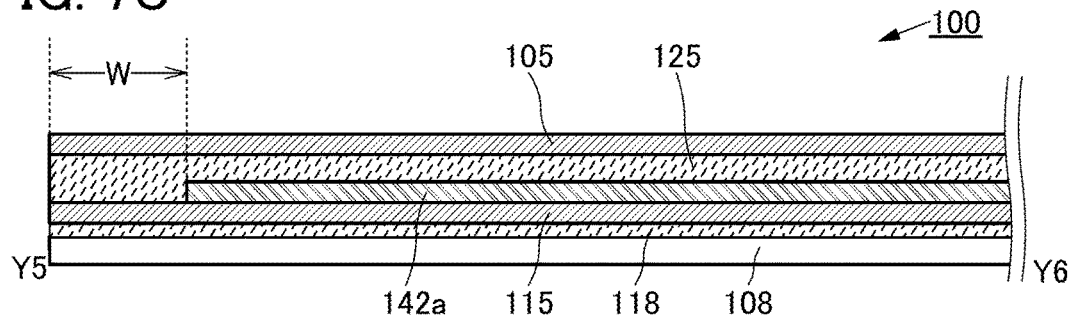

As illustrated in FIGS. 7A to 7C, in the case where the wiring 142a is positioned closest to the end of the display region 101, the width W of the region 110 transmitting visible light is the distance between the end portion of the barrier layer 105 or the substrate 108 and the end portion of the wiring 142a. In the case where the wiring 142a transmits visible light, the region 110 may include a region where the wiring 142a is provided.

Here, in the case where the density of pixels provided in the display region 101 of the display panel 100 is high, misalignment may occur when the two display panels 100 are bonded.

Figure 8A:
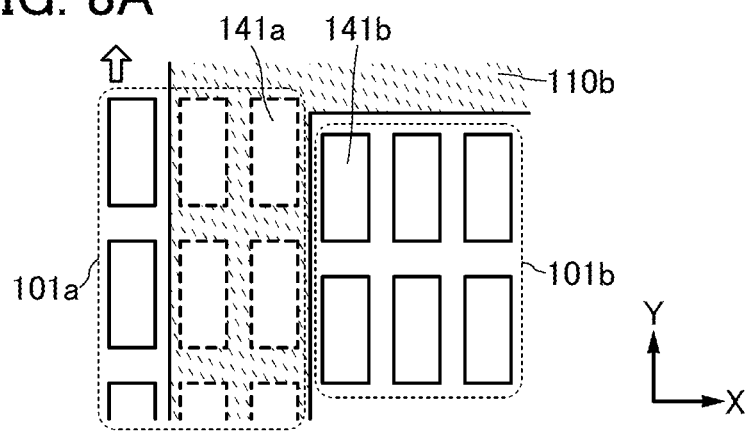
FIGS. 8A to 8C each illustrate a positional relationship between display panels according to one embodiment.

FIG. 8A shows a positional relationship between the display region 101a of the display panel 100a provided on the lower side and the display region 101b of the display panel 100b provided on the upper side, seen from the display surface side. FIG. 8A shows the vicinities of the corner portions of the display regions 101a and 101b. Part of the display region 101a is covered with the region 110b.

Figure 8B:
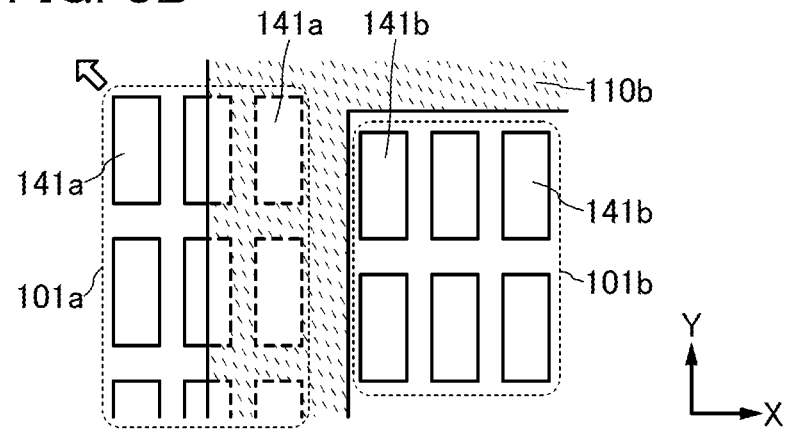

FIG. 8A shows an example in which adjacent pixels 141a and 141b are relatively deviated in one direction (Y direction). The arrow in the drawing denotes a direction in which the display panel 100a is deviated from the display panel 100b. FIG. 8B shows an example in which the adjacent pixels 141a and 141b are relatively deviated in a vertical direction and a horizontal direction (X direction and Y direction).

In the examples of FIGS. 8A and 8B, the distances deviated in the vertical direction and the horizontal direction are each shorter than the length of one pixel. In this case, image data of the image displayed on either one of the display regions 101a and 101b is corrected depending on the deviation distance, whereby the display quality can be maintained. Specifically, when the deviation makes the distance between the pixels smaller, the data is corrected so that the gray level (luminance) of the pixels is low, and when the deviation makes the distance between the pixels larger, the data is corrected so that the gray level (luminance) of the pixels is high. Alternatively, when the pixels are deviated by a distance of more than one pixel, the data is corrected so that the pixel positioned on a lower side is not driven and the image data is shifted by one column.

Figure 8C:
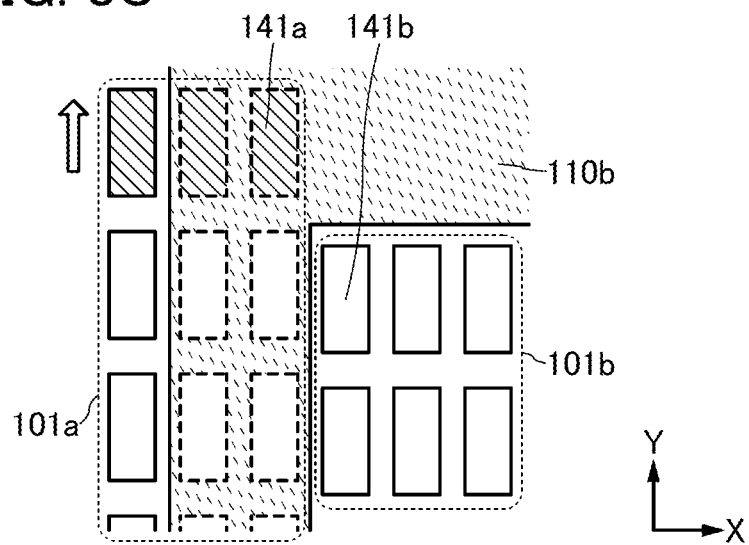

FIG. 8C shows an example in which the pixels 141a and 141b, which should be adjacent, are relatively deviated in one direction (Y direction) by a distance of more than one pixel. When the deviation of more than one pixel occurs, the pixels are driven so that projecting pixels (pixels which are hatched) are not displayed. Note that the same applies to the case where the deviation direction is the X direction.

When the plurality of display panels 100 are bonded, in order to suppress misalignment, each of the display panels 100 is preferably provided with an alignment marker or the like. Alternatively, a projection and a depression may be formed on the surfaces of the display panels 100, and the projection and the depression may be attached to each other in a region where the two display panels 100 overlap.

Furthermore, in consideration of alignment accuracy, it is preferable that pixels more than the pixels to be used be placed in advance in the display region 101 of the display panel 100. For example, it is preferable that one or more, preferably three or more, further preferably five or more extra pixel columns along either one or both of a scan line and a signal line be provided in addition to the pixel columns used for display.

Application Example

In the display device 10 of one embodiment of the present invention, by increasing the number of display panels 100, the area of the display region 11 can be increased unlimitedly. Thus, the display device 10 can be favorably used for applications for displaying a large image, such as digital signage and a PID.

Figure 9A:
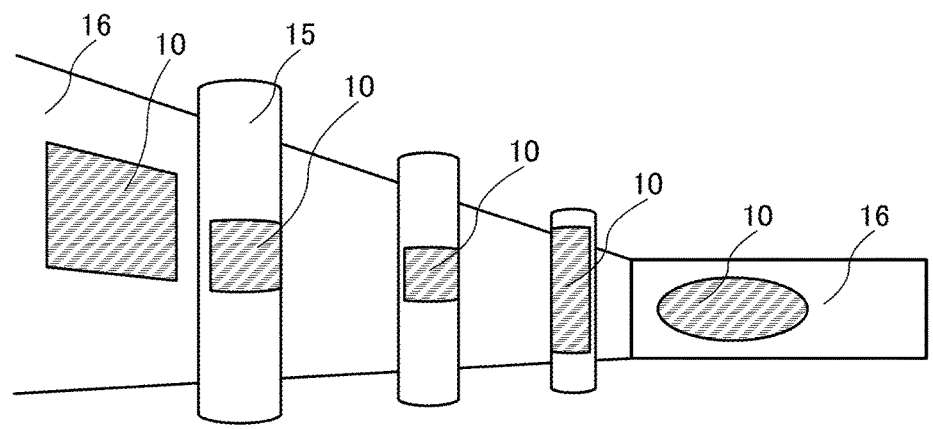
FIGS. 9A and 9B illustrate application examples of a display device according to one embodiment.

FIG. 9A shows an example in which the display device 10 of one embodiment of the present invention is used for a column 15 and a wall 16. A flexible display panel is used as the display panel 100 included in the display device 10, whereby the display device 10 can be placed along a curved surface.

Here, as the number of display panels 100 included in the display device 10 is increased, the circuit size of a wiring board for supplying a signal that drives each display panel 100 is increased. Moreover, as the area of the display device 10 is increased, a longer wiring is needed; thus, signal delay easily occurs, which may adversely affect the display quality.

Thus, each of the plurality of display panels 100 included in the display device 10 is preferably provided with a wireless module that supplies a signal for driving the display panel 100.

Figure 9B:
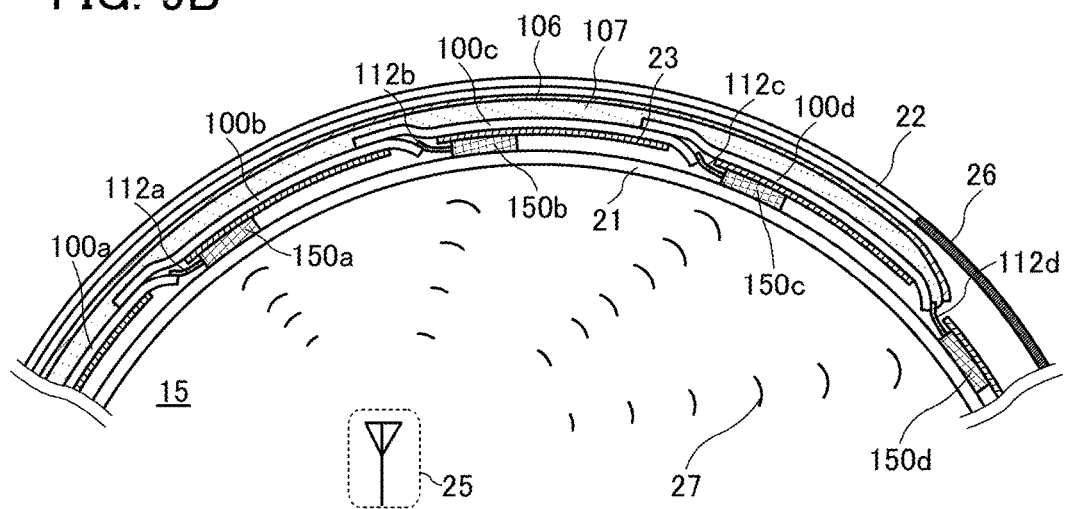

FIG. 9B shows an example of a cross section of the column 15 in the case where the display device 10 is placed on the surface of the cylinder column 15. The display device 10 including the plurality of display panels 100 is placed between an interior member 21 and an exterior member 22 and is curved along the surface of the column 15.

One display panel 100 is electrically connected to the wireless module 150 (i.e. one of the wireless modules 150a to 150d in FIG. 9B) through the FPC 112. The display panel 100 is supported by the top surface side of a supporting member 23 provided between the interior member 21 and the exterior member 22, and the wireless module 150 is placed on the lower surface side of the supporting member 23. The display panel 100 and the wireless module 150 are electrically connected to each other through the FPC 112 through an opening provided in the supporting member 23. Furthermore, the substrate 106 is provided over the plurality of display panels 100 (100a, 100b, 100c, and 100d in FIG. 9B) with the adhesive layer 107 provided therebetween.

In FIG. 9B, part of the exterior member 22 is provided with a light-blocking portion 26. The light-blocking portion 26 is provided to cover a region other than the display region of the display device 10, whereby the region cannot be visually recognized by a viewer.

The wireless module 150 receives a wireless signal 27 transmitted from an antenna 25 provided inside or outside the column 15. Furthermore, the wireless module 150 has a function of extracting a signal for driving the display panel 100 from the wireless signal 27 and supplying the signal to the display panel 100. As the signal for driving the display panel 100, the power supply potential, the synchronization signal (the clock signal), the image signal, and the like are given.

For example, each of the wireless modules 150 has an identification number. The wireless signal 27 transmitted from the antenna 25 includes a signal that specifies the identification number and a signal for driving the display panel 100. When the identification number included in the wireless signal 27 corresponds to the identification number of the wireless module 150, the wireless module 150 receives the signal for driving the display panel 100 and supplies the signal to the display panel 100 through the FPC 112; in this manner, different images can be displayed on the respective display panels 100.

The wireless module 150 may be an active wireless module to which power is supplied from the wireless signal 27, or may be a passive wireless module in which a battery and the like are incorporated. In the case of using the passive wireless module, the incorporated battery can be charged by transmitting and receiving electric power (this operation is also referred to as contactless power transmission, non-contact power transmission, wireless power supply, or the like) using an electromagnetic induction method, a magnetic resonance method, an electric wave method, or the like.

With such a structure, even in a large display device 10, the signal for driving each of the display panels 100 is not delayed, and the display quality can be increased. Furthermore, the display device 10 is driven by the wireless signal 27; thus, when the display device 10 is placed on the wall and the column, construction for leading a wiring through the wall and the column, and the like are unnecessary, so that the display device 10 can be easily placed in any locations. For the same reason, the placement position of the display device 10 can be easily changed.

Note that in the above, one wireless module 150 is connected to one display panel 100; however, one wireless module 150 may be connected to two or more display panels 100.

For example, the display device of one embodiment of the present invention includes at least two display panels, and includes at least a first wireless module that extracts a first signal from a received wireless signal and supplies the signal to a first display panel, and a second wireless module that extracts a second signal from the wireless signal and supplies the signal to a second display panel.

At least part of this embodiment can be implemented in combination with any of the other embodiments described in this specification as appropriate.

Embodiment 2

In this embodiment, structure examples of a display panel which can be used in a display device of one embodiment of the present invention are described with reference to drawings.

Although a display panel mainly including an organic EL element is described in this embodiment as an example, a display panel which can be used in a display device of one embodiment of the present invention is not limited to this example. A light-emitting panel or a display panel including another light-emitting element or display element which will be described later in this embodiment as an example can also be used in a display device of one embodiment of the present invention.

Structure Example 1

Figure 10A:
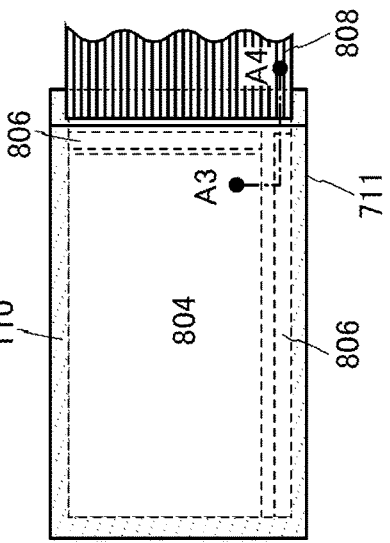
FIGS. 10A to 10C illustrate display panels according to one embodiment.
Figure 10B:
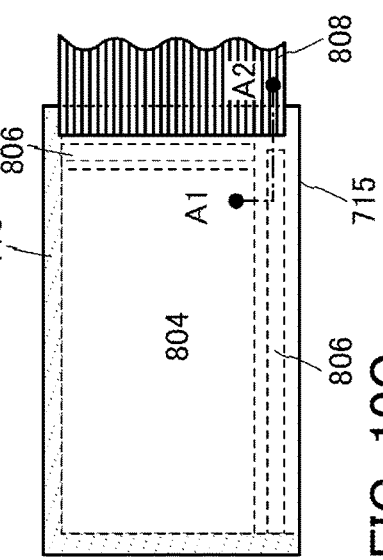
Figure 10C:
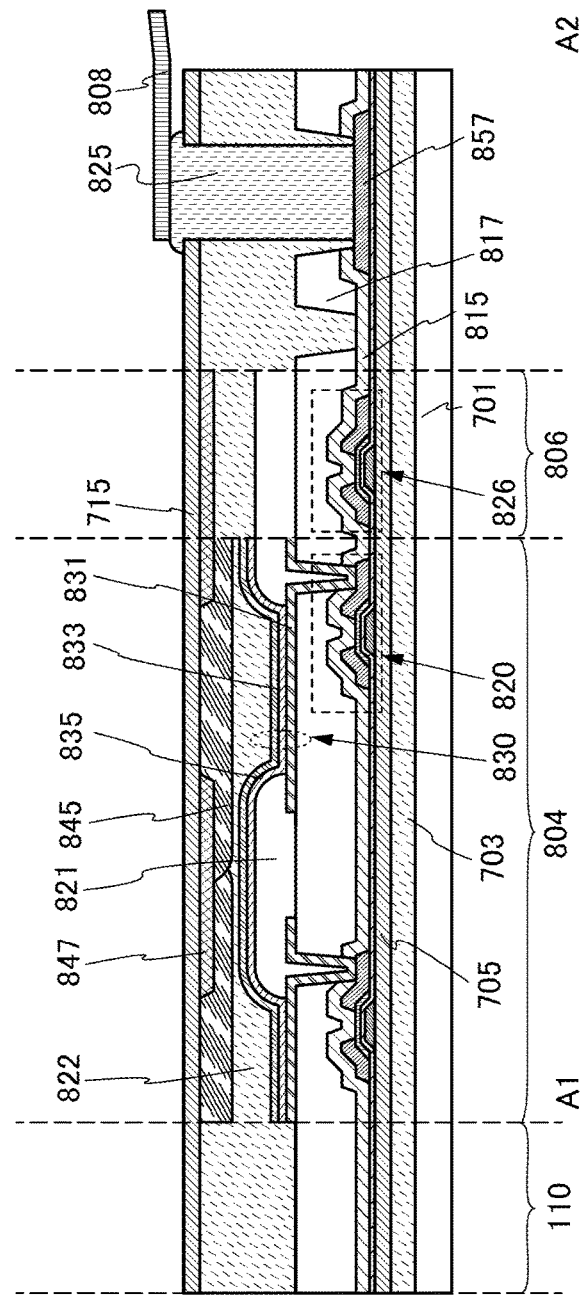

FIG. 10A is a plan view of the display panel, and FIG. 10C is an example of a cross-sectional view taken along the dashed-dotted line A1-A2 in FIG. 10A. FIG. 10C also shows an example of a cross-sectional view of the region 110 that transmits visible light.

The display panel in Structure Example 1 is a top-emission display panel using a color filter method. In this embodiment, the display panel can have a structure in which subpixels of three colors of red (R), green (G), and blue (B), for example, express one color; a structure in which subpixels of four colors of R, G, B, and white (W) express one color; a structure in which subpixels of four colors of R, G, B, and yellow (Y) express one color; or the like. There is no particular limitation on color elements, and colors other than R, G, B, W, and Y may be used. For example, cyan, magenta, or the like may be used.

The display panel illustrated in FIG. 10A includes the region 110 that transmits visible light, a light-emitting portion 804, a driver circuit portion 806, and an FPC 808. The region 110 that transmits visible light is adjacent to the light-emitting portion 804 and is provided along the two sides of the light-emitting portion 804.

The display panel in FIG. 10C includes a substrate 701, an adhesive layer 703, a barrier layer 705, a plurality of transistors (e.g. transistors 820 and 826), a conductive layer 857, an insulating layer 815, an insulating layer 817, a plurality of light-emitting elements, an insulating layer 821, an adhesive layer 822, a coloring layer 845, a light-blocking layer 847, and a barrier layer 715. The adhesive layer 822 and the barrier layer 715 transmit visible light. Light-emitting elements and transistors included in the light-emitting portion 804 and the driver circuit portion 806 are sealed with the barrier layer 705, the barrier layer 715, and the adhesive layer 822.

The light-emitting portion 804 includes a transistor 820 and a light-emitting element 830 over the substrate 701 with the adhesive layer 703 and the barrier layer 705 provided therebetween. The light-emitting element 830 includes a lower electrode 831 over the insulating layer 817, an EL layer 833 over the lower electrode 831, and an upper electrode 835 over the EL layer 833. The lower electrode 831 is electrically connected to a source electrode or a drain electrode of the transistor 820. An end portion of the lower electrode 831 is covered with the insulating layer 821. The lower electrode 831 preferably reflects visible light. The upper electrode 835 transmits visible light.

In addition, the light-emitting portion 804 includes the coloring layer 845 overlapping with the light-emitting element 830 and the light-blocking layer 847 overlapping with the insulating layer 821. The space between the light-emitting element 830 and the coloring layer 845 is filled with the adhesive layer 822.

The insulating layer 815 has an effect of inhibiting diffusion of impurities to a semiconductor included in the transistors 820 and 826. As the insulating layer 817, an insulating layer having a planarization function is preferably selected in order to reduce surface unevenness due to the transistor.

The driver circuit portion 806 includes a plurality of transistors over the substrate 701 with the adhesive layer 703 and the barrier layer 705 provided therebetween. In FIG. 10C, the transistor 826 included in the driver circuit portion 806 is illustrated.

The barrier layer 705 and the barrier layer 715 are preferably highly resistant to moisture, in which case entry of impurities such as water into the light-emitting element 830 or the transistor 820 can be inhibited, leading to higher reliability of the display panel. When the display panel includes a substrate, the surface of the display panel can be protected from a physical impact, which is preferable. The substrate 701 is bonded to the barrier layer 705 with the adhesive layer 703.

In the display panel in FIG. 10C, the substrate 701 is provided on the side opposite to the display surface side; however, the substrate may be provided on the display surface side or a pair of substrates may be provided on the display surface side and the side opposite to the display surface side. Note that a substrate having high light transmittance is provided on the display surface side or the substrate is not provided, whereby the light from the light-emitting element 830 can be efficiently extracted outside.

As a method for forming a stack in which the barrier layer 715 is exposed at the surface, a method in which a stack including a barrier layer and the like is formed over a support substrate and then the support substrate is separated can be used. The separation method of the substrate is described later.

The conductive layer 857 is electrically connected to an external input terminal through which a signal (e.g., a video signal, a clock signal, a start signal, or a reset signal) or a potential from the outside is transmitted to the driver circuit portion 806. Here, an example in which the FPC 808 is provided as the external input terminal is described. To prevent an increase in the number of manufacturing steps, the conductive layer 857 is preferably formed using the same material and the same step(s) as those of the electrode or the wiring in the light-emitting portion or the driver circuit portion. Here, an example is described in which the conductive layer 857 is formed using the same material and the same step(s) as those of the electrodes of the transistor 820.

In the display panel in FIG. 10C, the FPC 808 is positioned over the barrier layer 715. The connector 825 is connected to the conductive layer 857 through an opening provided in the barrier layer 715, the adhesive layer 822, the insulating layer 817, and the insulating layer 815. The connector 825 is also connected to the FPC 808. The FPC 808 and the conductive layer 857 are electrically connected to each other via the connector 825.

Figure 11:
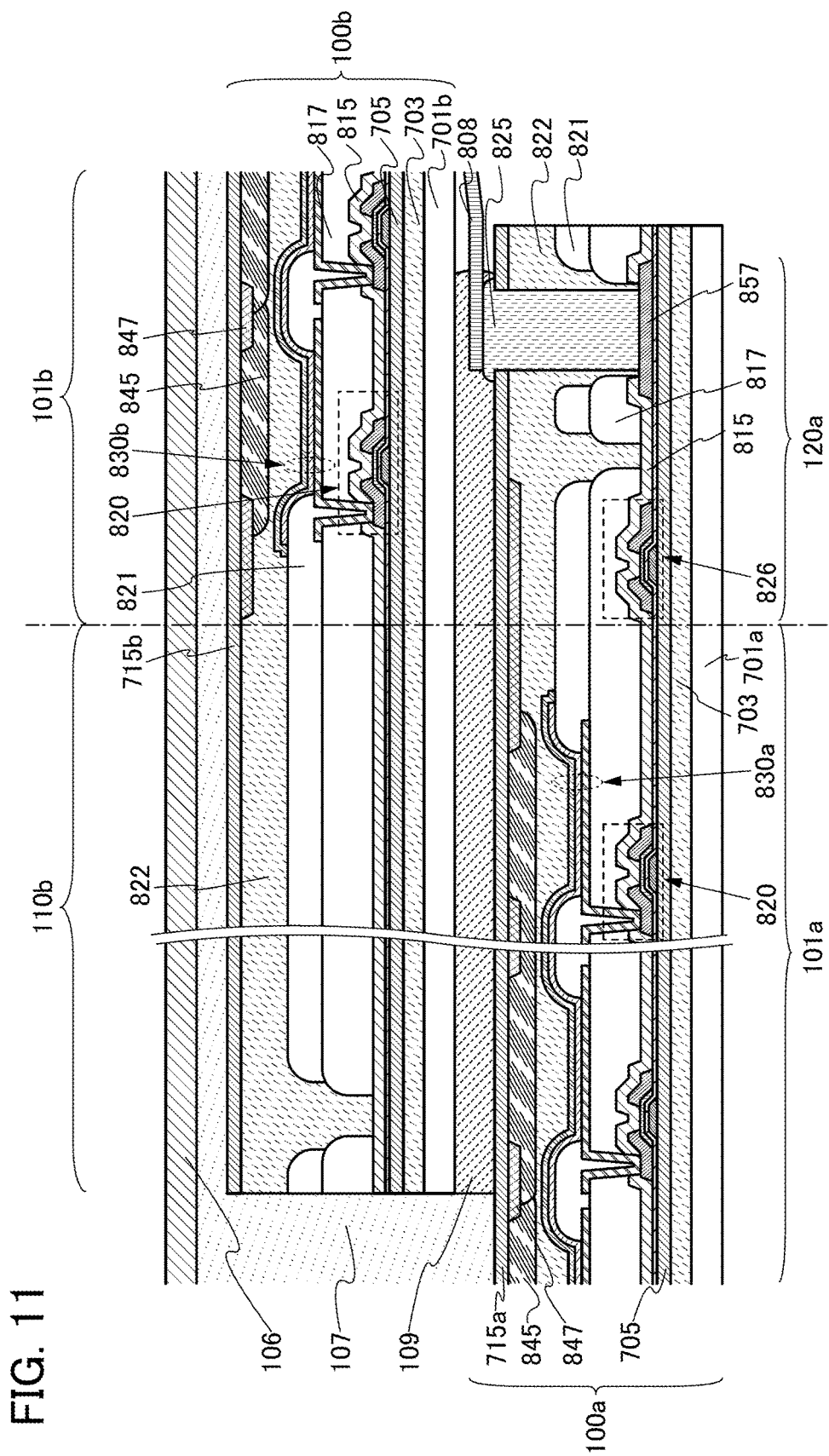
FIG. 11 illustrates a display device according to one embodiment.

FIG. 11 illustrates an example of a cross-sectional view of a display device in which two display panels illustrated in FIG. 10C overlap each other. FIG. 11 shows the display region 101a (corresponding to the light-emitting portion 804 in FIG. 10A) and a region 120a that blocks visible light (corresponding to the driver circuit portion 806 or the like in FIG. 10A) of the display panel 100a on the lower side, and the display region 101b (corresponding to the light-emitting portion 804 in FIG. 10A) and the region 110b that transmits visible light (corresponding to the region 110 that transmits visible light in FIG. 10A) of the display panel 100b on the upper side. Note that the cross-sectional view in FIG. 11 is also an example of the region 170 in FIG. 5A that is shown in the cross-sectional structure example of the display device 10 described in Embodiment 1.

In the display device in FIG. 11, the display panel positioned on the display surface side (the upper side) includes the region 110b that transmits visible light and is adjacent to the display region 101b. Furthermore, the display region 101a of the lower display panel and the region 110b of the upper display panel that transmits visible light overlap each other. Thus, a non-display region between the display regions of the two overlapping display panels can be reduced and even removed. As a result, a large-sized display device in which a joint portion of the display panels is hardly seen by the user can be obtained.

Furthermore, in the display device in FIG. 11, the adhesive layer 107 and the substrate 106 are provided in this order from and in contact with the display surface side of the display panel 100b. In the display panel 100b, a barrier layer 715b is provided on the uppermost surface on the display surface side. Here, the difference of the refractive index between the substrate 106, the adhesive layer 107, and the barrier layer 715b is reduced, whereby the light emitted from the light-emitting element 830b can be efficiently extracted outside. Specifically, the lowest refractive index among the refractive indices of the substrate 106, the adhesive layer 107, and the barrier layer 715b is 80% or more, preferably 90% or more, further preferably 95% or more of the highest refractive index thereof.

For example, for the substrate 106, the adhesive layer 107, and the barrier layer 715b, a plastic film (with a refractive index of approximately 1.5), a two-component-mixture-type epoxy resin (with a refractive index of approximately 1.52), and silicon oxide (with a refractive index of approximately 1.46) are used, respectively, whereby the refractive index difference between these stacked layers can be reduced and the light emitted from the light-emitting element 830b can be efficiently extracted.

Furthermore, in the display device in FIG. 11, the adhesive layer 109, which transmits visible light and has a small difference in refractive index from the barrier layer 715a, is provided between the display region 101a and the region 110b that transmits visible light. As a result, entry of air between the display region 101a and the region 110b that transmits visible light can be inhibited and light reflected at an interface due to the difference of refractive indices can be reduced. Then, the light emitted from the light-emitting element 830a can be efficiently extracted and display unevenness and luminance unevenness in the display device can be reduced.

Specifically, the lower refractive index between the refractive indices of the adhesive layer 109 and the barrier layer 715a is 80% or more, preferably 90% or more, further preferably 95% or more of the higher refractive index. As well as the refractive index difference between the adhesive layer 109 and the barrier layer 715a, the refractive index difference between stacked layers, such as the substrate 701b, that are provided on the path of light emitted from the light-emitting element 830a is reduced, whereby the light can be extracted more efficiently from the light-emitting element 830a.

Moreover, in the display device in FIG. 11, the display panels 100a and 100b are bonded to each other with the adhesive layer 109, and the display panels 100a and 100b and the substrate 106 are bonded to each other with the adhesive layer 107. With such a structure, as compared with the structure in which a substrate is provided on the display surface side of each display panel, the mechanical strength of the display device can be increased and the extraction efficiency of light emitted from the display device can be improved.

Structure Example 2

FIG. 10B is a plan view of the display panel, and FIG. 12A is an example of a cross-sectional view taken along the dashed-dotted line A3-A4 in FIG. 10B. The display panel in Structure Example 2 is a top-emission display panel using a color filter method, which differs from the display panel in Structure Example 1. Here, only different points from those of Structure Example 1 are described and the description of the same points as Structure Example 1 is omitted.

FIG. 10B illustrates an example in which the region 110 that transmits visible light is provided along three sides of the display panel. On two sides of the three sides, the region 110 that transmits visible light is adjacent to the light-emitting portion 804.

The display panel illustrated in FIG. 12A differs from the display panel in FIG. 10C in the following points.

The display panel illustrated in FIG. 12A includes insulating layers 817a and 817b and a conductive layer 856 over the insulating layer 817a. The source electrode or the drain electrode of the transistor 820 and the lower electrode of the light-emitting element 830 are electrically connected to each other through the conductive layer 856.

The display panel in FIG. 12A includes a spacer 823 over the insulating layer 821. The spacer 823 can adjust the distance between the substrate 701 and the substrate 711.

The display panel in FIG. 12A includes an overcoat 849 covering the coloring layer 845 and the light-blocking layer 847. The space between the light-emitting element 830 and the overcoat 849 is filled with the adhesive layer 822.

In the display panel in FIG. 12A, the substrate 711 is provided over the barrier layer 715 with the adhesive layer 713 provided therebetween. Although the substrate 701 and the substrate 711 have different sizes in this structure, the substrate 701 and the substrate 711 may have the same size.

Note that as illustrated in FIG. 12B, the light-emitting element 830 may include an optical adjustment layer 832 between the lower electrode 831 and the EL layer 833. It is preferable to use a conductive material that transmits visible light for the optical adjustment layer 832. Owing to the combination of a color filter (the coloring layer) and a microcavity structure (the optical adjustment layer), light with high color purity can be extracted from the display device of one embodiment of the present invention. The thickness of the optical adjustment layer may be varied depending on the color of the sub-pixel.

Structure Example 3

FIG. 10B is a plan view of the display panel, and FIG. 12C is an example of a cross-sectional view taken along the dashed-dotted line A3-A4 in FIG. 10B. The display panel in Structure Example 3 is a top-emission display device using a separate coloring method.

The display panel in FIG. 12C includes the substrate 701, the adhesive layer 703, the barrier layer 705, a plurality of transistors (e.g. transistors 820 and 826), the conductive layer 857, the insulating layer 815, the insulating layer 817, a plurality of light-emitting elements, the insulating layer 821, the spacer 823, the adhesive layer 822, the barrier layer 715, and the substrate 711. The adhesive layer 822, the barrier layer 715, and the substrate 711 transmit visible light.

In the display panel in FIG. 12C, the connector 825 is positioned over the insulating layer 815. The connector 825 is connected to the conductive layer 857 through an opening provided in the insulating layer 815. Moreover, the connector 825 is connected to the FPC 808. The FPC 808 and the conductive layer 857 are electrically connected to each other with the connector 825 provided therebetween.

Structure Example 4

FIG. 10B is a plan view of the display panel, and FIG. 13A is an example of a cross-sectional view taken along the dashed-dotted line A3-A4 in FIG. 10B. The display panel in Structure Example 4 is a bottom-emission display panel using a color filter method.

The display panel in FIG. 13A includes the barrier layer 705, a plurality of transistors (e.g. transistors 820, 824, and 826), the conductive layer 857, the insulating layer 815, the coloring layer 845, the insulating layer 817a, the insulating layer 817b, the conductive layer 856, a plurality of light-emitting elements, the insulating layer 821, the adhesive layer 822, and the substrate 711. The barrier layer 705, the insulating layer 815, the insulating layer 817a, and the insulating layer 817b transmit visible light.

The light-emitting portion 804 includes the transistor 820, the transistor 824, and the light-emitting element 830 over the barrier layer 705. The light-emitting element 830 includes the lower electrode 831 over the insulating layer 817b, the EL layer 833 over the lower electrode 831, and the upper electrode 835 over the EL layer 833. The lower electrode 831 is electrically connected to a source electrode or a drain electrode of the transistor 820. An end portion of the lower electrode 831 is covered with the insulating layer 821. The upper electrode 835 preferably reflects visible light. The lower electrode 831 transmits visible light. The coloring layer 845 that overlaps with the light-emitting element 830 can be provided anywhere; for example, the coloring layer 845 may be provided between the insulating layers 817a and 817b or between the insulating layers 815 and 817a.

The driver circuit portion 806 includes a plurality of transistors over the barrier layer 705. In FIG. 13A, two of the transistors 826 included in the driver circuit portion 806 is illustrated.

The barrier layer 705 is preferably highly resistant to moisture, in which case impurities such as water can be prevented from entering the light-emitting element 830, the transistor 820, or the transistor 824, leading to higher reliability of the display panel.

The conductive layer 857 is electrically connected to an external input terminal through which a signal or a potential from the outside is transmitted to the driver circuit portion 806. Here, an example in which the FPC 808 is provided as the external input terminal is described. Here, an example is described in which the conductive layer 857 is formed using the same material and the same step(s) as those of the conductive layer 856.

The display panel in FIG. 13A has a structure in which the FPC is extracted from the side opposite to the display surface side. Thus, in the case where the display panel is used as the display panel included in the display device 10 described in Embodiment 1, the display panel in FIG. 13A can be used in the structure illustrated in FIG. 4B or FIG. 5B.

Structure Example 5

FIG. 13B shows an example of a light-emitting panel different from those of Structure Examples 1 to 4.

A light-emitting panel in FIG. 13B includes the substrate 701, the adhesive layer 703, the barrier layer 705, a conductive layer 814, a conductive layer 857a, a conductive layer 857b, the light-emitting element 830, the insulating layer 821, the adhesive layer 822, the barrier layer 715, and the substrate 711.

The conductive layer 857a and the conductive layer 857b, which are external connection electrodes of the light-emitting panel, can each be electrically connected to an FPC or the like.

The light-emitting element 830 includes the lower electrode 831, the EL layer 833, and the upper electrode 835. The end portion of the lower electrode 831 is covered with the insulating layer 821. The light-emitting element 830 has a bottom emission structure, a top emission structure, or a dual emission structure. The electrode, the substrate, the insulating layer, and the like through each of which light is extracted transmit visible light. The conductive layer 814 is electrically connected to the lower electrode 831.

The substrate through which light is extracted may have, as a light extraction structure, a hemispherical lens, a micro lens array, a film provided with an uneven surface structure, a light diffusing film, or the like. For example, a substrate having the light extraction structure can be formed by bonding the above lens or film to a resin substrate with an adhesive or the like having substantially the same refractive index as the substrate or the lens or film.

The conductive layer 814 is preferably, though not necessarily, provided because voltage drop due to the resistance of the lower electrode 831 can be inhibited. In addition, for a similar purpose, a conductive layer electrically connected to the upper electrode 835 may be provided over the insulating layer 821, the EL layer 833, the upper electrode 835, or the like.

The conductive layer 814 can be formed to have a single-layer structure or a stacked-layer structure using a material selected from copper, titanium, tantalum, tungsten, molybdenum, chromium, neodymium, scandium, nickel, or aluminum, an alloy material containing any of these materials as its main component, and the like. The thickness of the conductive layer 814 can be greater than or equal to 0.1 µm and less than or equal to 3 µm, preferably greater than or equal to 0.1 µm and less than or equal to 0.5 µm, for example.

[Examples of Materials and Formation Method]

Next, materials and the like that can be used for the display panel or the light-emitting panel are described. Note that description of the components already described in this specification and the like is omitted in some cases.

For each of the substrates, a material such as glass, quartz, an organic resin, a metal, or an alloy can be used. The substrate through which light is extracted from the light-emitting element is formed using a material which transmits the light.

In particular, a flexible substrate is preferably used. For example, an organic resin; or glass, a metal, or an alloy that is thin enough to have flexibility can be used.

An organic resin, which has a specific gravity smaller than that of glass, is preferably used for the flexible substrate, in which case the display panel can be lightweight as compared with the case where glass is used.

The substrate is preferably formed using a material with high toughness. In that case, a display panel with high impact resistance that is less likely to be broken can be provided. For example, when an organic resin substrate or a thin metal or alloy substrate is used, the display panel can be lightweight and unlikely to be broken as compared with the case where a glass substrate is used.

A metal material and an alloy material, which have high thermal conductivity, are preferable because they can easily conduct heat to the whole substrate and accordingly can prevent a local temperature rise in the display panel. The thickness of a substrate using a metal material or an alloy material is preferably greater than or equal to 10 µm and less than or equal to 200 µm, further preferably greater than or equal to 20 µm and less than or equal to 50 µm.

There is no particular limitation on a material of the metal substrate or the alloy substrate, but it is preferable to use, for example, aluminum, copper, nickel, or a metal alloy such as an aluminum alloy or stainless steel.

Furthermore, when a material with high thermal emissivity is used for the substrate, the surface temperature of the display panel can be prevented from rising, leading to inhibition of breakage or a decrease in reliability of the display panel. For example, the substrate may have a stacked-layer structure of a metal substrate and a layer with high thermal emissivity (the layer can be formed using a metal oxide or a ceramic material, for example).

As a flexible material, for example, the materials of the substrate 106 described in Embodiment 1 can be given.

The flexible substrate may have a stacked-layer structure in which a hard coat layer (e.g., a silicon nitride layer) by which a surface of the display panel is protected from damage, a layer which can disperse pressure (e.g., an aramid resin layer), or the like is stacked over a layer of any of the above-mentioned materials.

The flexible substrate may be formed by stacking a plurality of layers. When a glass layer is used, a barrier property against water and oxygen can be improved and thus a highly reliable display panel can be provided.

For example, a flexible substrate in which a glass layer, an adhesive layer, and an organic resin layer are stacked from the side closer to a light-emitting element can be used. The thickness of the glass layer is greater than or equal to 20 µm and less than or equal to 200 µm, preferably greater than or equal to 25 µm and less than or equal to 100 µm. With such a thickness, the glass layer can have both a high barrier property against water and oxygen and high flexibility. The thickness of the organic resin layer is greater than or equal to 10 µm and less than or equal to 200 µm, preferably greater than or equal to 20 µm and less than or equal to 50 µm. By providing such an organic resin layer outside the glass layer, occurrence of a crack or a break in the glass layer can be inhibited and mechanical strength can be improved. With the substrate that includes such a composite material of a glass material and an organic resin, a highly reliable flexible display panel can be provided.

Here, a method for forming a flexible display panel is described.

For convenience, a structure including a pixel and a driver circuit, a structure including an optical member such as a color filter, a structure including a touch sensor, or a structure including a functional member is referred to as an element layer. An element layer includes a display element, for example, and may include a wiring electrically connected to a display element or an element such as a transistor used in a pixel or a circuit in addition to the display element.

Here, a support provided with an insulating surface over which an element layer is formed is called a base material.

As a method for forming an element layer over a flexible base material, there are a method in which an element layer is formed directly over a base material, and a method in which an element layer is formed over a supporting base material that is different from the base material and has stiffness and then the element layer is separated from the supporting base material and transferred to the base material.

In the case where a material of the base material can withstand heating temperature in the process for forming the element layer, it is preferred that the element layer be formed directly over the base material, in which case a manufacturing process can be simplified. At this time, the element layer is preferably formed in a state where the base material is fixed to the supporting base material, in which case the transfer of the element layer in a device and between devices can be easy.

In the case of employing the method in which the element layer is formed over the supporting base material and then transferred to the base material, first, a separation layer and an insulating layer are stacked over a supporting base material, and then the element layer is formed over the insulating layer. Then, the element layer is separated from the supporting base material and then transferred to the base material. At this time, a material is selected such that separation at an interface between the supporting base material and the separation layer, at an interface between the separation layer and the insulating layer, or in the separation layer occurs. With such a method, the element layer can be formed at temperatures higher than the upper temperature limit of the base material, which improves the reliability of the display panel.

For example, it is preferable that stacked layers of a layer including a high-melting-point metal material, such as tungsten, and a layer including an oxide of the metal material be used as the separation layer, and stacked layers of a plurality of layers as the insulating layer, such as a silicon nitride layer and a silicon oxynitride layer be used over the separation layer. By using a high-melting-point metal material, a high-temperature process can be performed to form the element layer, resulting in high reliability. For example, impurities contained in the element layer can be further reduced, and the crystallinity of a semiconductor or the like included in the element layer can be further increased. For the base material, any of the above flexible materials can be preferably used.

Note that the display panels illustrated in FIG. 10C and FIG. 13A, which have a structure in which the base material is not provided on the display surface side, can be fabricated by omitting the step of transferring the element layer to the base material after separating the element layer from the support base material. In the case where the display panel and the light-emitting panel described in Embodiment 2 are fabricated by this fabrication method, the barrier layers 705 and 715 serve as insulating layers at interfaces with separation layers before the support base material is separated.

Examples of the separation include peeling off by application of mechanical power, removal of the separation layer by etching, or separation by dripping of a liquid into part of the separation interface to penetrate the entire separation interface.

The separation layer is not necessarily provided in the case where separation can occur at an interface between the supporting base material and the insulating layer. For example, glass may be used as the supporting base material, an organic resin such as polyimide may be used as the insulating layer, a separation trigger may be formed by locally heating part of the organic resin by laser light or the like, and separation may be performed at an interface between the glass and the insulating layer. Alternatively, it is possible that a layer containing a material with high thermal conductivity (e.g., a metal or a semiconductor) is provided between the supporting base material and the insulating layer containing an organic resin, and this layer is heated by current so that separation easily occurs, and then separation is performed. In this case, the insulating layer containing an organic resin can also be used as the base material.

As the adhesive layer, a variety of curable resins such as a reactive curable resin, a thermosetting resin, an anaerobic resin, and a photo curable resin such as an ultraviolet curable resin can be used. Examples of such resins include an epoxy resin, an acrylic resin, a silicone resin, a phenol resin, a polyimide resin, an imide resin, a polyvinyl chloride (PVC) resin, a polyvinyl butyral (PVB) resin, an ethylene vinyl acetate (EVA) resin, and the like. In particular, a material with low moisture permeability, such as an epoxy resin, is preferable. Alternatively, a two-component-mixture-type resin may be used. Further alternatively, an adhesive sheet or the like may be used.

Furthermore, the resin may include a drying agent. For example, a substance which adsorbs moisture by chemical adsorption, such as an oxide of an alkaline earth metal (e.g., calcium oxide or barium oxide), can be used. Alternatively, a substance that adsorbs moisture by physical adsorption, such as zeolite or silica gel, may be used. The drying agent is preferably included, in which case entry of impurities such as moisture into the light-emitting element can be inhibited and the reliability of the display panel can be improved.

In addition, a filler with a high refractive index or a light scattering member is mixed into the resin, in which case the efficiency of light extraction from the light-emitting element can be improved. For example, titanium oxide, barium oxide, zeolite, zirconium, or the like can be used.

Insulating films with high resistance to moisture are preferably used for the barrier layer 705 and the barrier layer 715. Alternatively, the barrier layer 705 and the barrier layer 715 preferably have a function of preventing diffusion of impurities to a light-emitting element.

As an insulating film having an excellent moisture-proof property, a film containing nitrogen and silicon (e.g., a silicon nitride film or a silicon nitride oxide film), a film containing nitrogen and aluminum (e.g., an aluminum nitride film), or the like can be used. Alternatively, a silicon oxide film, a silicon oxynitride film, an aluminum oxide film, or the like can be used. Alternatively, for the insulating film, the material that is used for the barrier layer 105 described in Embodiment 1 can be referred to.

For example, the water vapor transmittance of the insulating film having an excellent moisture-proof property is lower than or equal to $1\times10^{-5}$ [g/(m$^2$·day)], preferably lower than or equal to $1\times10^{-6}$ [g/(m$^2$·day)], further preferably lower than or equal to $1\times10^{-7}$ [g/(m$^2$·day)], still further preferably lower than or equal to $1\times10^{-8}$ [g/(m$^2$·day)].

In the display panel, it is necessary that at least one of the barrier layers 705 and 715, which is on the light-emitting surface side, transmit light emitted from the light-emitting element. In the case where the display panel includes the barrier layers 705 and 715, one of the barrier layers 705 and 715, which transmits light emitted from the light-emitting element, preferably has higher average transmittance than the other in a wavelength of 350 nm or more and 750 nm or less.

The barrier layers 705 and 715 each preferably include oxygen, nitrogen, and silicon. The barrier layers 705 and 715 each preferably include, for example, silicon oxynitride. Moreover, the barrier layers 705 and 715 each preferably include silicon nitride or silicon nitride oxide. It is preferable that the barrier layers 705 and 715 be each formed using a silicon oxynitride film and a silicon nitride film, which are in contact with each other. The silicon oxynitride film and the silicon nitride film are alternately stacked so that antiphase interference occurs more often in a visible region, whereby the stack can have higher transmittance of light in the visible region.

There is no particular limitation on the structure of the transistor in the display panel. For example, a forward staggered transistor or an inverted staggered transistor may be used. Furthermore, a top-gate transistor or a bottom-gate transistor may be used. A semiconductor material used for the transistors is not particularly limited, and for example, silicon, germanium, or an organic semiconductor can be used. Alternatively, an oxide semiconductor containing at least one of indium, gallium, and zinc, such as an In—Ga—Zn-based metal oxide, may be used.

There is no particular limitation on the crystallinity of a semiconductor material used for the transistors, and an amorphous semiconductor or a semiconductor having crystallinity (a microcrystalline semiconductor, a polycrystalline semiconductor, a single-crystal semiconductor, or a semiconductor partly including crystal regions) may be used. It is preferable that a semiconductor having crystallinity be used, in which case deterioration of the transistor characteristics can be inhibited.

For stable characteristics of the transistor, a base film is preferably provided. The base film can be formed to have a single-layer structure or a stacked-layer structure using an inorganic insulating film such as a silicon oxide film, a silicon nitride film, a silicon oxynitride film, or a silicon nitride oxide film. The base film can be formed by a sputtering method, a chemical vapor deposition (CVD) method (e.g., a plasma CVD method, a thermal CVD method, or a metal organic CVD (MOCVD) method), an atomic layer deposition (ALD) method, a coating method, a printing method, or the like. Note that the base film is not necessarily provided. In each of the above structure examples, the barrier layer 705 can serve as a base film of the transistor.

As the light-emitting element, a self-luminous element can be used, and an element whose luminance is controlled by current or voltage is included in the category of the light-emitting element. For example, a light-emitting diode (LED), an organic EL element, an inorganic EL element, or the like can be used.

The light-emitting element may have any of a top emission structure, a bottom emission structure, and a dual emission structure. A conductive film that transmits visible light is used as the electrode through which light is extracted. A conductive film that reflects visible light is preferably used as the electrode through which light is not extracted.

The conductive film that transmits visible light can be formed using, for example, indium oxide, indium tin oxide (ITO), indium zinc oxide, zinc oxide (ZnO), or zinc oxide to which gallium is added. Alternatively, a film of a metal material such as gold, silver, platinum, magnesium, nickel, tungsten, chromium, molybdenum, iron, cobalt, copper, palladium, or titanium; an alloy containing any of these metal materials; a nitride of any of these metal materials (e.g., titanium nitride); or the like can be formed thin so as to transmit visible light. Alternatively, a stacked film of any of the above materials can be used as the conductive layer. For example, a stacked film of ITO and an alloy of silver and magnesium is preferably used, in which case conductivity can be increased. Further alternatively, graphene or the like may be used.

For the conductive film that reflects visible light, for example, a metal material, such as aluminum, gold, platinum, silver, nickel, tungsten, chromium, molybdenum, iron, cobalt, copper, or palladium or an alloy including any of these metal materials can be used. Lanthanum, neodymium, germanium, or the like may be added to the metal material or the alloy. Furthermore, an alloy containing aluminum (an aluminum alloy) such as an alloy of aluminum and titanium, an alloy of aluminum and nickel, an alloy of aluminum and neodymium, or an alloy of aluminum, nickel, and lanthanum (Al—Ni—La), or an alloy containing silver such as an alloy of silver and copper, an alloy of silver, palladium, and copper (Ag—Pd—Cu, also referred to as APC), or an alloy of silver and magnesium can be used for the conductive film. An alloy of silver and copper is preferable because of its high heat resistance. Moreover, a metal film or a metal oxide film is stacked on an aluminum alloy film, whereby oxidation of the aluminum alloy film can be suppressed. Examples of a material for the metal film or the metal oxide film are titanium and titanium oxide. Alternatively, the conductive film having a property of transmitting visible light and a film containing any of the above metal materials may be stacked. For example, a stacked film of silver and ITO or a stacked film of an alloy of silver and magnesium and ITO can be used.

The electrodes may be formed separately by an evaporation method or a sputtering method. Alternatively, a discharging method such as an ink-jet method, a printing method such as a screen printing method, or a plating method may be used.

When a voltage higher than the threshold voltage of the light-emitting element is applied between the lower electrode 831 and the upper electrode 835, holes are injected to the EL layer 833 from the anode side and electrons are injected to the EL layer 833 from the cathode side. The injected electrons and holes are recombined in the EL layer 833 and a light-emitting substance contained in the EL layer 833 emits light.

The EL layer 833 includes at least a light-emitting layer. In addition to the light-emitting layer, the EL layer 833 may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

For the EL layer 833, either a low molecular compound or a high molecular compound can be used, and an inorganic compound may also be used. Each of the layers included in the EL layer 833 can be formed by any of the following methods: an evaporation method (including a vacuum evaporation method), a transfer method, a printing method, an inkjet method, a coating method, and the like.

The light-emitting element 830 may contain two or more kinds of light-emitting substances. Thus, for example, a light-emitting element that emits white light can be achieved. For example, a white emission can be obtained by selecting light-emitting substances so that two or more kinds of light-emitting substances emit light of complementary colors. A light-emitting substance that emits red (R) light, green (G) light, blue (B) light, yellow (Y) light, or orange (O) light or a light-emitting substance that emits light containing spectral components of two or more of R light, G light, and B light can be used, for example. A light-emitting substance that emits blue light and a light-emitting substance that emits yellow light may be used, for example. At this time, the emission spectrum of the light-emitting substance that emits yellow light preferably contains spectral components of G light and R light. The emission spectrum of the light-emitting element 830 preferably has two or more peaks in the wavelength range in a visible region (e.g., greater than or equal to 350 nm and less than or equal to 750 nm or greater than or equal to 400 nm and less than or equal to 800 nm).

The EL layer 833 may include a plurality of light-emitting layers. In the EL layer 833, the plurality of light-emitting layers may be stacked in contact with one another or may be stacked with a separation layer provided therebetween. The separation layer may be provided between a fluorescent layer and a phosphorescent layer, for example.

The separation layer can be provided, for example, to prevent energy transfer by the Dexter mechanism (particularly triplet energy transfer) from a phosphorescent material or the like in an excited state which is generated in the phosphorescent layer to a fluorescent material or the like in the fluorescent layer. The thickness of the separation layer may be several nanometers. Specifically, the thickness of the separation layer may be greater than or equal to 0.1 nm and less than or equal to 20 nm, greater than or equal to 1 nm and less than or equal to 10 nm, or greater than or equal to 1 nm and less than or equal to 5 nm. The separation layer contains a single material (preferably, a bipolar substance) or a plurality of materials (preferably, a hole-transport material and an electron-transport material).

The separation layer may be formed using a material contained in a light-emitting layer in contact with the separation layer. This facilitates the manufacture of the light-emitting element and reduces the drive voltage. For example, in the case where the phosphorescent layer includes a host material, an assist material, and a phosphorescent material (guest material), the separation layer may be formed using the host material and the assist material. In other words, the separation layer includes a region not containing the phosphorescent material and the phosphorescent layer includes a region containing the phosphorescent material in the above structure. Accordingly, the separation layer and the phosphorescent layer can be evaporated separately depending on whether a phosphorescent material is used or not. With such a structure, the separation layer and the phosphorescent layer can be formed in the same chamber. Thus, the manufacturing costs can be reduced.

Moreover, the light-emitting element 830 may be a single element including one EL layer or a tandem element in which EL layers are stacked with a charge generation layer provided therebetween.

The light-emitting element is preferably provided between a pair of insulating films having an excellent moisture-proof property. In that case, entry of an impurity such as moisture into the light-emitting element can be inhibited, leading to inhibition of a decrease in the reliability of the display panel.

As the insulating layer 815, for example, an inorganic insulating film such as a silicon oxide film, a silicon oxynitride film, or an aluminum oxide film can be used. For example, as the insulating layer 817, the insulating layer 817a, and the insulating layer 817b, an organic material such as polyimide, acrylic, polyamide, polyimide amide, or a benzocyclobutene-based resin can be used. Alternatively, a low-dielectric constant material (a low-k material) or the like can be used. Furthermore, each insulating layer may be formed by stacking a plurality of insulating films.

The insulating layer 821 is formed using an organic insulating material or an inorganic insulating material. As the resin, for example, a polyimide resin, a polyamide resin, an acrylic resin, a siloxane resin, an epoxy resin, or a phenol resin can be used. It is particularly preferable that the insulating layer 821 be formed using a photosensitive resin material to have an opening portion over the lower electrode 831 so that a side wall of the opening portion is formed as an inclined surface with a continuous curvature.

There is no particular limitation on the method for forming the insulating layer 821; a photolithography method, a sputtering method, an evaporation method, a droplet discharging method (e.g., an inkjet method), a printing method (e.g., a screen printing method or an off-set printing method), or the like may be used.

The spacer 823 can be formed using an inorganic insulating material, an organic insulating material, a metal material, or the like. As the inorganic insulating material and the organic insulating material, for example, a variety of materials that can be used for the insulating layer can be used. As the metal material, titanium, aluminum, or the like can be used. When the spacer 823 containing a conductive material is electrically connected to the upper electrode 835, a potential drop due to the resistance of the upper electrode 835 can be inhibited. The spacer 823 may have either a tapered shape or an inverse tapered shape.

For example, a conductive layer functioning as an electrode or a wiring of the transistor, an auxiliary electrode of the light-emitting element, or the like, which is used for the display panel, can be formed to have a single-layer structure or a stacked-layer structure using any of metal materials such as molybdenum, titanium, chromium, tantalum, tungsten, aluminum, copper, neodymium, and scandium, and an alloy material containing any of these elements. Alternatively, the conductive layer may be formed using a conductive metal oxide. As the conductive metal oxide, indium oxide (e.g., $In_2O_3$), tin oxide (e.g., $SnO_2$), ZnO, ITO, indium zinc oxide (e.g., $In_2O_3$—ZnO), or any of these metal oxide materials in which silicon oxide is contained can be used.

The coloring layer is a colored layer that transmits light in a specific wavelength range. For example, a color filter for transmitting light in a red, green, blue, or yellow wavelength range can be used. Each coloring layer is formed in a desired position with any of various materials by a printing method, an inkjet method, an etching method using a photolithography method, or the like. In a white sub-pixel, a resin such as a transparent resin or a white resin may be provided so as to overlap with the light-emitting element.

The light-blocking layer is provided between the adjacent coloring layers. The light-blocking layer blocks light emitted from an adjacent light-emitting element to inhibit color mixture between adjacent light-emitting elements. Here, the coloring layer is provided such that its end portion overlaps with the light-blocking layer, whereby light leakage can be reduced. As the light-blocking layer, a material that can block light from the light-emitting element can be used; for example, a black matrix is formed using a resin material containing a metal material, pigment, or dye. Note that it is preferable to provide the light-blocking layer in a region other than the light-emitting portion, such as a driver circuit portion, in which case undesired leakage of guided light or the like can be inhibited.

Furthermore, an overcoat covering the coloring layer and the light-blocking layer may be provided. The overcoat can prevent an impurity and the like contained in the coloring layer from being diffused into the light-emitting element. The overcoat is formed with a material that transmits light emitted from the light-emitting element; for example, an inorganic insulating film such as a silicon nitride film or a silicon oxide film, an organic insulating film such as an acrylic film or a polyimide film can be used, and further, a stacked-layer structure of an organic insulating film and an inorganic insulating film may be employed.

In the case where upper surfaces of the coloring layer and the light-blocking layer are coated with a material of the adhesive layer, a material which has high wettability with respect to the material of the adhesive layer is preferably used as the material of the overcoat. For example, an oxide conductive film such as an ITO film or a metal film such as an Ag film which is thin enough to transmit visible light is preferably used as the overcoat.

As the connector, any of a variety of anisotropic conductive films (ACF), anisotropic conductive pastes (ACP), and the like can be used.

In this specification and the like, a display element, a display panel which is a panel including a display element, a light-emitting element, and a light-emitting panel which is a panel including a light-emitting element can employ various modes or can include various elements. Examples of a display element, a display panel, a light-emitting element, or a light-emitting panel include a display medium whose contrast, luminance, reflectivity, transmittance, or the like is changed by electrical or magnetic effect, such as an EL element (e.g., an EL element including organic and inorganic materials, an organic EL element, or an inorganic EL element), an LED (e.g., a white LED, a red LED, a green LED, or a blue LED), a transistor (a transistor which emits light depending on current), an electron emitter, a liquid crystal element, electronic ink, an electrophoretic element, a grating light valve (GLV), a plasma display panel (PDP), a display element including a micro electro mechanical system (MEMS), a digital micromirror device (DMD), a digital micro shutter (DMS), an interferometric modulator display (IMOD) element, an MEMS shutter display element, optical interference type MEMS display element, an electrowetting element, a piezoelectric ceramic display, and a display element including a carbon nanotube. Note that examples of a display panel having an EL element include an EL display. Examples of a display panel having an electron emitter include a field emission display (FED) and an SED-type flat panel display (SED: surface-conduction electron-emitter display). Examples of a display panel having a liquid crystal element include a liquid crystal display (e.g., a transmissive liquid crystal display, a transflective liquid crystal display, a reflective liquid crystal display, a direct-view liquid crystal display, or a projection liquid crystal display). Examples of a display panel having electronic ink, ELECTRONIC LIQUID POWDER (registered trademark), or an electrophoretic element include electronic paper. In the case of a transflective liquid crystal display or a reflective liquid crystal display, some of or all of pixel electrodes function as reflective electrodes. For example, some or all of pixel electrodes are formed to contain aluminum or silver. Furthermore, in such a case, a memory circuit such as an SRAM can be provided under the reflective electrodes, leading to lower power consumption. Note that in the case of using an LED, graphene or graphite may be provided under an electrode or a nitride semiconductor of the LED. Graphene or graphite may be a multilayer film in which a plurality of layers are stacked. As described above, provision of graphene or graphite enables easy formation of a nitride semiconductor film thereover, such as an n-type GaN semiconductor layer including crystals. Furthermore, a p-type GaN semiconductor layer including crystals or the like can be provided thereover, and thus the LED can be formed. Note that an MN layer may be provided between the n-type GaN semiconductor layer including crystals and graphene or graphite. The GaN semiconductor layers included in the LED may be formed by MOCVD. Note that when the graphene is provided, the GaN semiconductor layers included in the LED can also be formed by a sputtering method.

For example, in this specification and the like, an active matrix method in which an active element (a non-linear element) is included in a pixel or a passive matrix method in which an active element is not included in a pixel can be used.

In the active matrix method, not only a transistor but also a variety of active elements can be used. For example, an MIM (metal insulator metal), a TFD (thin film diode), or the like can also be used. Since such an element has few numbers of manufacturing steps, manufacturing cost can be reduced or yield can be improved. Alternatively, since the size of these elements is small, the aperture ratio can be improved, so that power consumption can be reduced or higher luminance can be achieved.

Since an active element is not used in the passive matrix method, the number of manufacturing steps can be reduced, so that manufacturing cost can be reduced or the yield can be improved. Alternatively, since an active element is not used in the passive matrix method, the aperture ratio can be improved, so that power consumption can be reduced or higher luminance can be achieved, for example.

Note that the light-emitting panel of one embodiment of the present invention may be used as a display panel or as a lighting panel. For example, it may be used as a light source such as a backlight or a front light, that is, a lighting panel for a display panel.

As described above, by using the display panel including a region that transmits visible light described as an example in this embodiment, a large-sized display device in which a joint portion of the display panels is hardly seen and display unevenness is reduced can be obtained.

This embodiment can be combined with any other embodiment as appropriate.

Embodiment 3

In this embodiment, a touch panel that can be used in a display device of one embodiment of the present invention will be described with reference to drawings. Note that the above description can be referred to for the components of the touch panel, which are similar to those of the display panel described in Embodiment 2. Although a touch panel including a light-emitting element is described as an example in this embodiment, one embodiment of the present invention is not limited thereto. For example, a touch panel including another element (e.g., a display element), the example of which is shown in Embodiment 2, can also be used in the display device of one embodiment of the present invention.

Structure Example 1

Figure 14A:
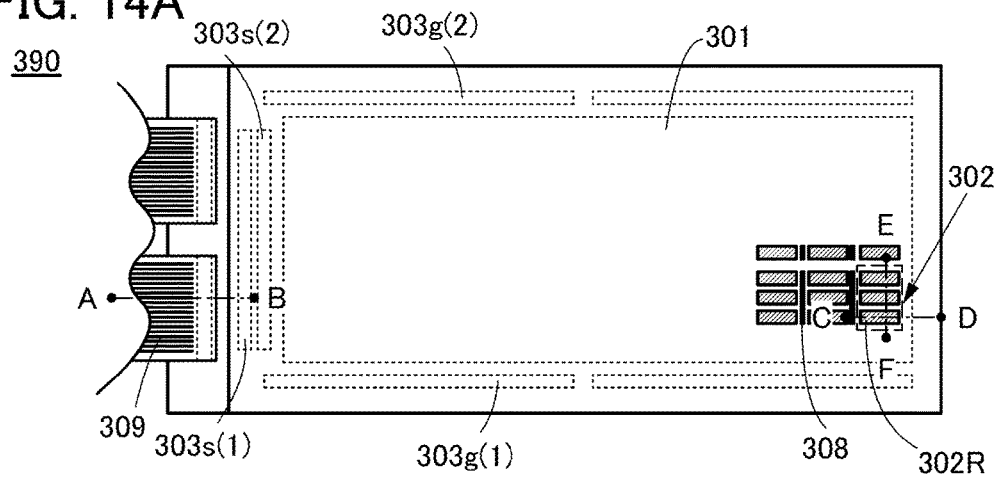
FIGS. 14A to 14C illustrate a touch panel according to one embodiment.
Figure 14B:
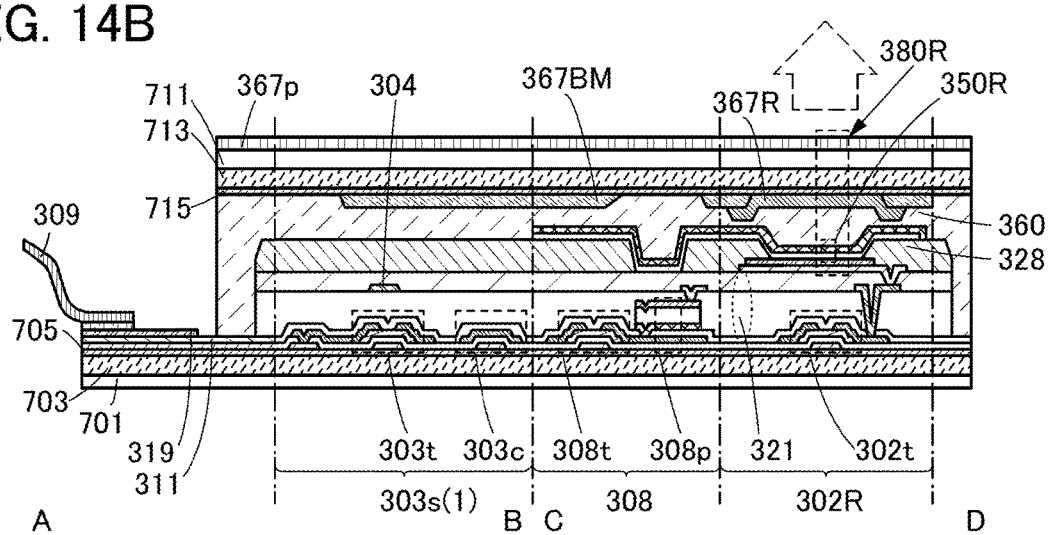
Figure 14C:
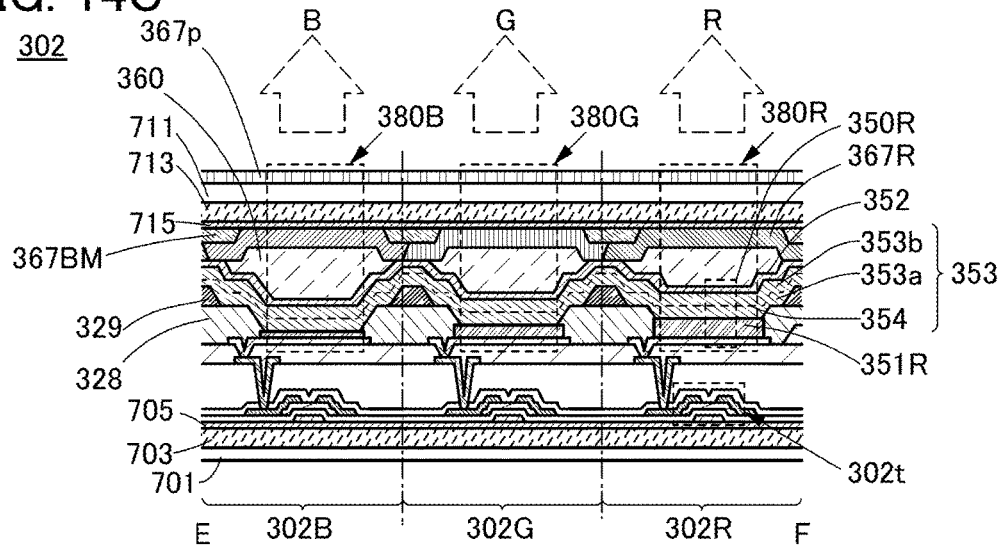

FIG. 14A is a top view of the touch panel. FIG. 14B is a cross-sectional view taken along the dashed-dotted line A-B and the dashed-dotted line C-D in FIG. 14A. FIG. 14C is a cross-sectional view taken along the dashed-dotted line E-F in FIG. 14A.

A touch panel 390 illustrated in FIG. 14A includes a display portion 301 (serving also as an input portion), a scan line driver circuit 303g(1), an imaging pixel driver circuit 303g(2), an image signal line driver circuit 303s(1), and an imaging signal line driver circuit 303s(2).

The display portion 301 includes a plurality of pixels 302 and a plurality of imaging pixels 308.

The pixel 302 includes a plurality of sub-pixels. Each sub-pixel includes a light-emitting element and a pixel circuit.

The pixel circuits can supply electric power for driving the light-emitting element. The pixel circuits are electrically connected to wirings through which selection signals are supplied. The pixel circuits are also electrically connected to wirings through which image signals are supplied.

The scan line driver circuit 303g(1) can supply selection signals to the pixels 302.

The image signal line driver circuit 303s(1) can supply image signals to the pixels 302.

A touch sensor can be formed using the imaging pixels 308. Specifically, the imaging pixels 308 can sense a touch of a finger or the like on the display portion 301.

The imaging pixels 308 include photoelectric conversion elements and imaging pixel circuits.

The imaging pixel circuits can drive photoelectric conversion elements. The imaging pixel circuits are electrically connected to wirings through which control signals are supplied. The imaging pixel circuits are also electrically connected to wirings through which power supply potentials are supplied.

Examples of the control signal include a signal for selecting an imaging pixel circuit from which a recorded imaging signal is read, a signal for initializing an imaging pixel circuit, and a signal for determining the time it takes for an imaging pixel circuit to sense light.

The imaging pixel driver circuit 303g(2) can supply control signals to the imaging pixels 308.

The imaging signal line driver circuit 303s(2) can read out imaging signals.

As illustrated in FIGS. 14B and 14C, the touch panel 390 includes the substrate 701, the adhesive layer 703, the barrier layer 705, the substrate 711, the adhesive layer 713, and the barrier layer 715. The substrates 701 and 711 are bonded to each other with an adhesive layer 360.

The substrate 701 and the barrier layer 705 are bonded to each other with the adhesive layer 703. The substrate 711 and the barrier layer 715 are bonded to each other with the adhesive layer 713.

The substrates 701 and 711 are preferably flexible.

Embodiment 2 can be referred to for materials used for the substrates, the adhesive layers, and the insulating layers.

Each of the pixels 302 includes the sub-pixel 302R, a sub-pixel 302G, and a sub-pixel 302B (see FIG. 14C). The sub-pixel 302R includes a light-emitting module 380R, the sub-pixel 302G includes a light-emitting module 380G, and the sub-pixel 302B includes a light-emitting module 380B.

For example, the sub-pixel 302R includes the light-emitting element 350R and the pixel circuit. The pixel circuit includes a transistor 302t that can supply electric power to the light-emitting element 350R. Furthermore, the light-emitting module 380R includes the light-emitting element 350R and an optical element (e.g., a coloring layer 367R that transmits red light).

The light-emitting element 350R includes a lower electrode 351R, an EL layer 353, and an upper electrode 352, which are stacked in this order (see FIG. 14C).

The EL layer 353 includes a first EL layer 353a, an intermediate layer 354, and a second EL layer 353b, which are stacked in this order.

Note that a microcavity structure can be provided for the light-emitting module 380R so that light with a specific wavelength can be efficiently extracted. Specifically, an EL layer may be provided between a film that reflects visible light and a film that partly reflects and partly transmits visible light, which are provided so that light with a specific wavelength can be efficiently extracted.

The light-emitting module 380R, for example, includes the adhesive layer 360 that is in contact with the light-emitting element 350R and the coloring layer 367R.

The coloring layer 367R is positioned in a region overlapping with the light-emitting element 350R. Accordingly, part of light emitted from the light-emitting element 350R passes through the adhesive layer 360 and the coloring layer 367R, each of which has a higher refractive index than air, and is emitted to the outside of the light-emitting module 380R as indicated by an arrow in FIG. 14B or 14C.

The touch panel 390 includes a light-blocking layer 367BM. The light-blocking layer 367BM is provided so as to surround the coloring layer (e.g., the coloring layer 367R).

The touch panel 390 includes an anti-reflective layer 367p positioned in a region overlapping with the display portion 301. As the anti-reflective layer 367p, a circular polarizing plate can be used, for example.

The touch panel 390 includes an insulating layer 321. The insulating layer 321 covers the transistor 302t and the like. Note that the insulating layer 321 can be used as a layer for planarizing unevenness caused by the pixel circuits and the imaging pixel circuits. An insulating layer on which a layer that can inhibit diffusion of impurities to the transistor 302t and the like is stacked can be used as the insulating layer 321.

The touch panel 390 includes a partition 328 that overlaps with an end portion of the lower electrode 351R. In addition, a spacer 329 that controls the distance between the substrate 701 and the substrate 711 is provided on the partition 328.

The image signal line driver circuit 303s(1) includes a transistor 303t and a capacitor 303c. Note that the driver circuit can be formed in the same process and over the same substrate as those of the pixel circuits. As illustrated in FIG. 14B, the transistor 303t may include a second gate 304 over the insulating layer 321. The second gate 304 may be electrically connected to a gate of the transistor 303t, or different potentials may be supplied to these gates. Alternatively, if necessary, the second gate 304 may be provided for a transistor 308t, the transistor 302t, or the like.

The imaging pixels 308 each include a photoelectric conversion element 308p and an imaging pixel circuit. The imaging pixel circuit can sense light received by the photoelectric conversion element 308p. The imaging pixel circuit includes the transistor 308t.

For example, a PIN photodiode can be used as the photoelectric conversion element 308p.

The touch panel 390 includes a wiring 311 through which a signal is supplied. The wiring 311 is provided with a terminal 319. Note that an FPC 309 through which a signal such as an image signal or a synchronization signal is supplied is electrically connected to the terminal 319. Note that a printed wiring board (PWB) may be attached to the FPC 309.

Note that transistors such as the transistors 302t, 303t, and 308t can be formed in the same process. Alternatively, the transistors may be formed in different processes.

Structure Example 2

Figure 15A:
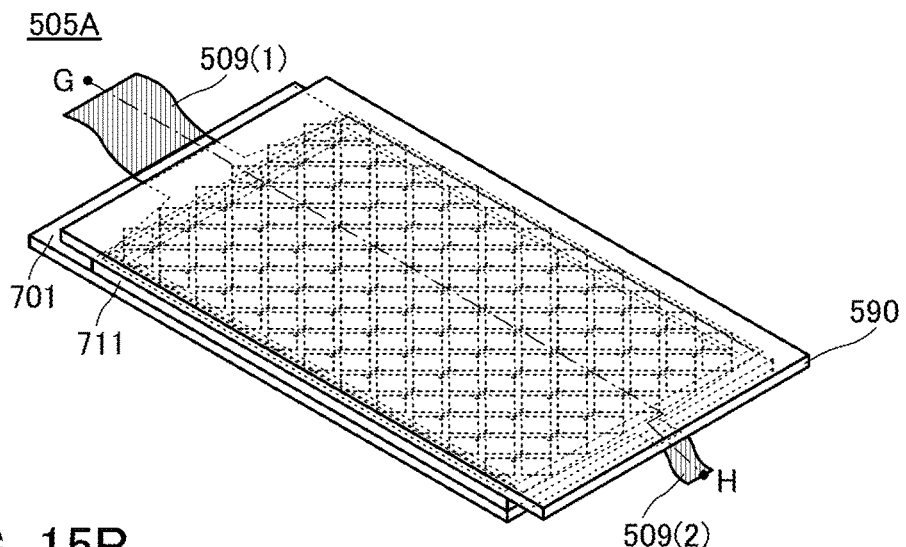
FIGS. 15A and 15B illustrate a touch panel according to one embodiment.
Figure 15B:
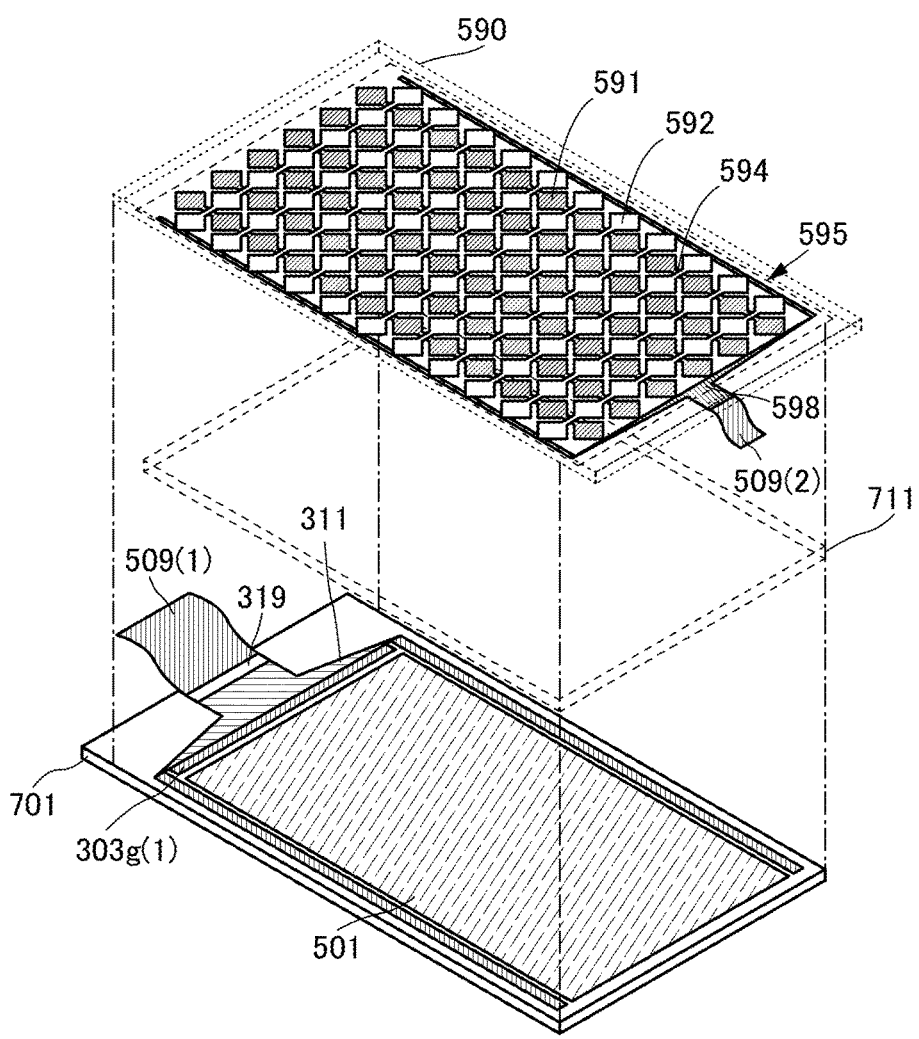
Figure 16A:
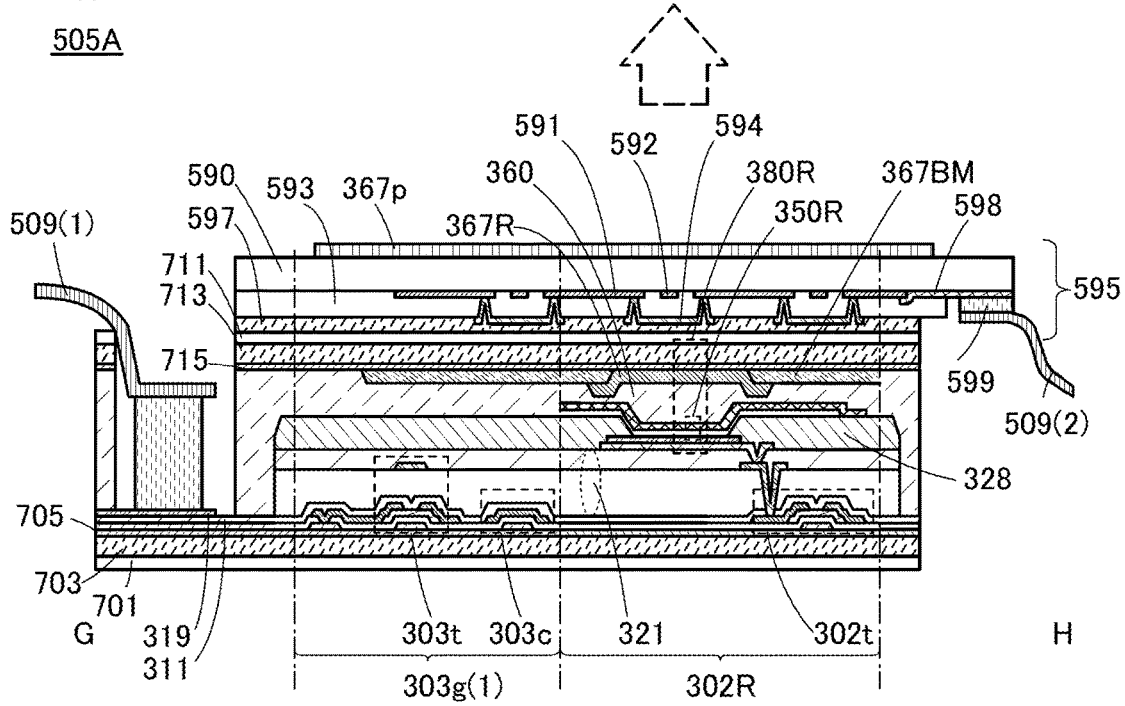
FIGS. 16A to 16C illustrate a touch panel according to one embodiment.

FIGS. 15A and 15B are perspective views of a touch panel 505A. Note that FIGS. 15A and 15B illustrate only main components for simplicity. FIG. 16A is a cross-sectional view taken along the dashed-dotted line G-H in FIG. 15A.

As illustrated in FIGS. 15A and 15B, the touch panel 505A includes a display portion 501, the scan line driver circuit 303g(1), a touch sensor 595, and the like. Furthermore, the touch panel 505A includes the substrate 701, the substrate 711, and a substrate 590.

The touch panel 505A includes a plurality of pixels and a plurality of wirings 311. The plurality of wirings 311 can supply signals to the pixels. The plurality of wirings 311 are led to a peripheral portion of the substrate 701, and part of the plurality of wirings 311 form the terminal 319. The terminal 319 is electrically connected to an FPC 509(1).

The touch panel 505A includes the touch sensor 595 and a plurality of wirings 598. The plurality of wirings 598 are electrically connected to the touch sensor 595. The plurality of wirings 598 are led to a peripheral portion of the substrate 590, and part of the plurality of wirings 598 form a terminal. The terminal is electrically connected to an FPC 509(2). Note that in FIG. 15B, electrodes, wirings, and the like of the touch sensor 595 provided on the back side of the substrate 590 (the side facing the substrate 701) are indicated by solid lines for clarity.

As the touch sensor 595, for example, a capacitive touch sensor can be used. Examples of the capacitive touch sensor include a surface capacitive touch sensor and a projected capacitive touch sensor. An example of using a projected capacitive touch sensor is described here.

Examples of the projected capacitive touch sensor include a self capacitive touch sensor and a mutual capacitive touch sensor, which differ mainly in the driving method. The use of a mutual capacitive type is preferred because multiple points can be sensed simultaneously.

Note that a variety of sensors that can sense the closeness or the contact of a sensing target such as a finger can be used as the touch sensor 595.

The projected capacitive touch sensor 595 includes electrodes 591 and electrodes 592. The electrodes 591 are electrically connected to any of the plurality of wirings 598, and the electrodes 592 are electrically connected to any of the other wirings 598.

The electrodes 592 each have a shape of a plurality of quadrangles arranged in one direction with one corner of a quadrangle connected to one corner of another quadrangle as illustrated in FIGS. 15A and 15B.

The electrodes 591 each have a quadrangular shape and are arranged in a direction intersecting with the direction in which the electrodes 592 extend. Note that the plurality of electrodes 591 is not necessarily arranged in the direction orthogonal to one electrode 592 and may be arranged to intersect with one electrode 592 at an angle of less than 90 degrees.

The wiring 594 intersects with the electrode 592. The wiring 594 electrically connects two electrodes 591 between which the electrode 592 is positioned. The intersecting area of the electrode 592 and the wiring 594 is preferably as small as possible. Such a structure allows a reduction in the area of a region where the electrodes are not provided, reducing unevenness in transmittance. As a result, unevenness in luminance of light from the touch sensor 595 can be reduced.

Note that the shapes of the electrodes 591 and the electrodes 592 are not limited to the above-mentioned shapes and can be any of a variety of shapes. For example, the plurality of electrodes 591 may be provided so that space between the electrodes 591 are reduced as much as possible, and a plurality of electrodes 592 may be provided with an insulating layer sandwiched between the electrodes 591 and the electrodes 592 and may be spaced apart from each other to form a region not overlapping with the electrodes 591. In that case, between two adjacent electrodes 592, it is preferable to provide a dummy electrode which is electrically insulated from these electrodes, whereby the area of a region having a different transmittance can be reduced.

As illustrated in FIG. 16A, the touch panel 505A includes the substrate 701, the adhesive layer 703, the barrier layer 705, the substrate 711, the adhesive layer 713, and the barrier layer 715. The substrates 701 and 711 are bonded to each other with the adhesive layer 360.

An adhesive layer 597 bonds the substrate 590 to the substrate 711 so that the touch sensor 595 overlaps with the display portion 501. The adhesive layer 597 transmits visible light.

The electrodes 591 and the electrodes 592 are formed using a conductive material that transmits visible light. As a light-transmitting conductive material, a conductive oxide such as indium oxide, indium tin oxide, indium zinc oxide, zinc oxide, or zinc oxide to which gallium is added can be used. Note that a film including graphene may be used as well. The film including graphene can be formed, for example, by reducing a film including graphene oxide. As a reducing method, a method with application of heat or the like can be employed.

The resistance of a material used for conductive films such as the electrodes 591, the electrodes 592, and the wiring 594, i.e., a wiring and an electrode in the touch panel, is preferably low. Examples of the material include ITO, indium zinc oxide, ZnO, silver, copper, aluminum, a carbon nanotube, and graphene. Alternatively, a metal nanowire including a number of conductors with an extremely small width (for example, a diameter of several nanometers) may be used. Examples of such a metal nanowire include an Ag nanowire, a Cu nanowire, and an Al nanowire. In the case of using an Ag nanowire, light transmittance of 89% or more and a sheet resistance of 40 ohm/square or more and 100 ohm/square or less can be achieved. Note that a metal nanowire, a carbon nanotube, graphene, or the like may be used for an electrode of the display element, e.g., a pixel electrode or a common electrode because of its high transmittance.

The electrodes 591 and the electrodes 592 may be formed by depositing a light-transmitting conductive material on the substrate 590 by a sputtering method and then removing an unnecessary portion by a variety of patterning technique such as photolithography.

The electrodes 591 and the electrodes 592 are covered with an insulating layer 593. Furthermore, openings reaching the electrodes 591 are formed in the insulating layer 593, and the wiring 594 electrically connects the adjacent electrodes 591. A light-transmitting conductive material can be favorably used as the wiring 594 because the aperture ratio of the touch panel can be increased. Moreover, a material with higher conductivity than the conductivities of the electrodes 591 and the electrodes 592 can be favorably used for the wiring 594 because electric resistance can be reduced.

Note that an insulating layer covering the insulating layer 593 and the wiring 594 may be provided to protect the touch sensor 595.

Furthermore, a connection layer 599 electrically connects the wirings 598 to the FPC 509(2).

The display portion 501 includes a plurality of pixels arranged in a matrix. Each pixel has the same structure as Structure Example 1; thus, description is omitted.

Any of various kinds of transistors can be used in the touch panel. A structure in the case of using bottom-gate transistors is illustrated in FIGS. 16A and 16B.

For example, a semiconductor layer containing an oxide semiconductor, amorphous silicon, or the like can be used in the transistor 302t and the transistor 303t illustrated in FIG. 16A.

Figure 16B:
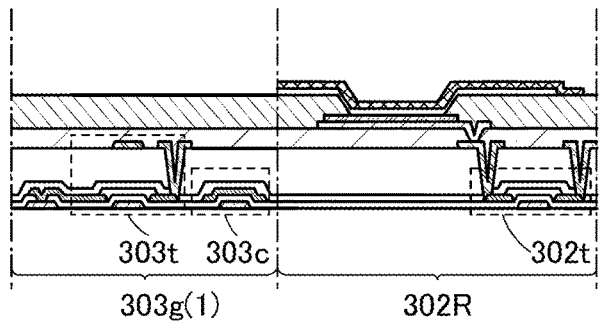

For example, a semiconductor layer containing polycrystalline silicon that is obtained by crystallization process such as laser annealing can be used in the transistor 302t and the transistor 303t illustrated in FIG. 16B.

Figure 16C:
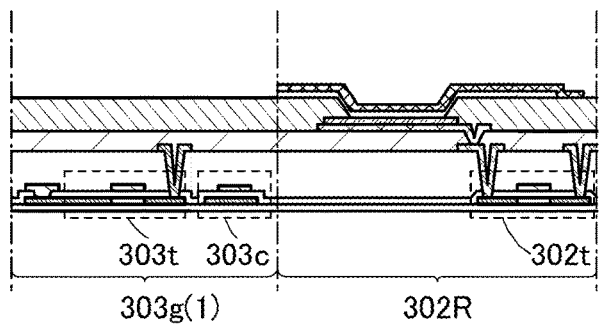

A structure in the case of using top-gate transistors is illustrated in FIG. 16C.

For example, a semiconductor layer including polycrystalline silicon, a single crystal silicon film that is transferred from a single crystal silicon substrate, or the like can be used in the transistor 302t and the transistor 303t illustrated in FIG. 16C.

Structure Example 3

Figure 17A:
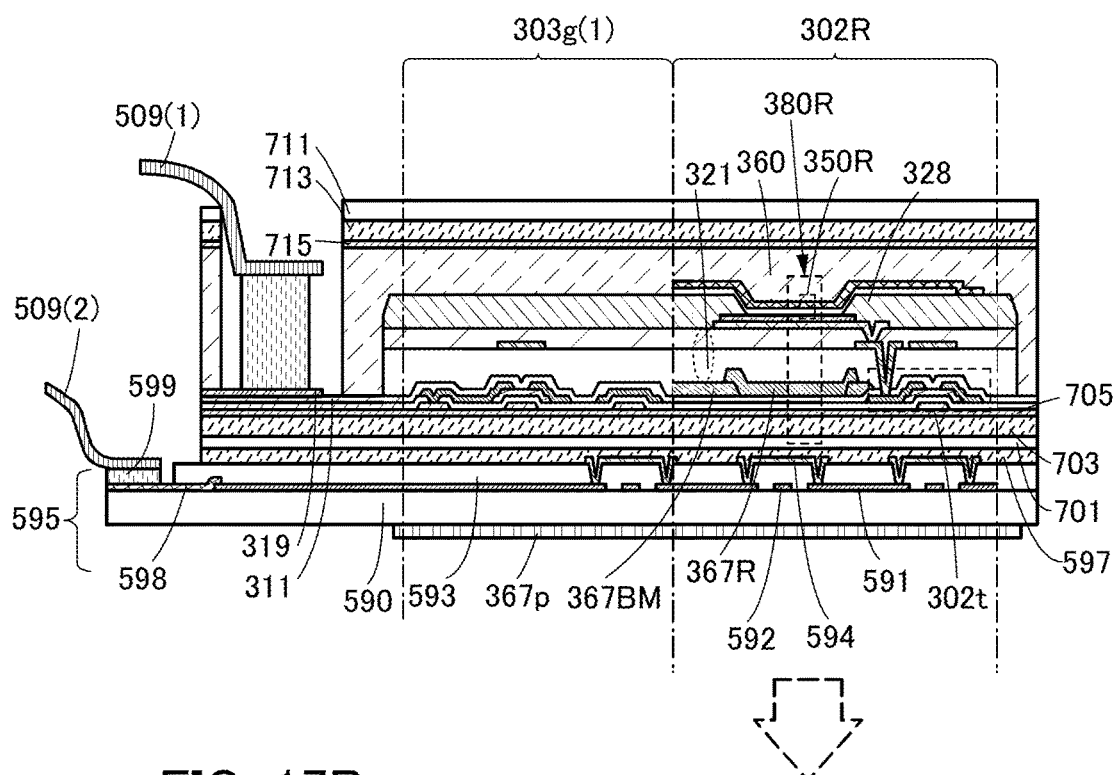
FIGS. 17A to 17C illustrate a touch panel according to one embodiment.
Figure 17B:
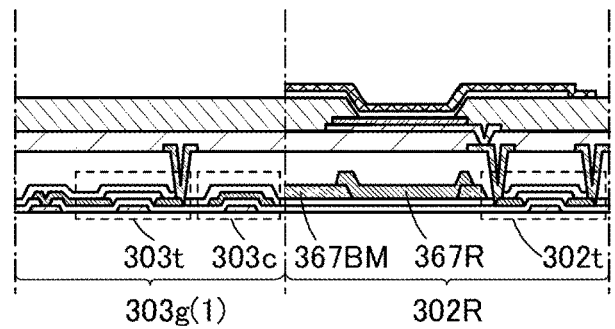
Figure 17C:
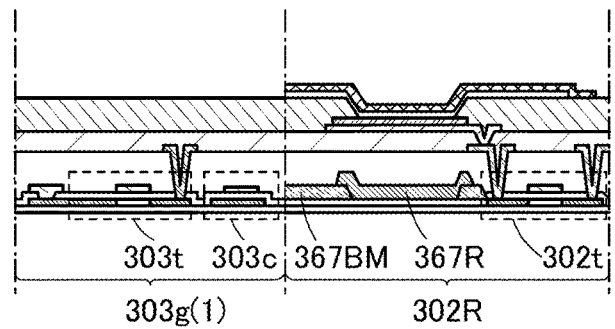

FIGS. 17A to 17C are cross-sectional views of a touch panel 505B. The touch panel 505B described in this embodiment is different from the touch panel 505A in Structure Example 2 in that received image data is displayed on the side where the transistors are provided, that the touch sensor is provided on the substrate 701 side of the display portion, and that the FPC 509(2) is provided on the same side as the FPC 509(1). Different structures will be described in detail below, and the above description is referred to for the other similar structures.

The coloring layer 367R is positioned in a region overlapping with the light-emitting element 350R. The light-emitting element 350R illustrated in FIG. 17A emits light to the side where the transistor 302t is provided. Accordingly, part of light emitted from the light-emitting element 350R passes through the coloring layer 367R and is emitted to the outside of the light-emitting module 380R as indicated by an arrow in FIG. 17A.

The touch panel 505B includes the light-blocking layer 367BM on the light extraction side. The light-blocking layer 367BM is provided so as to surround the coloring layer (e.g., the coloring layer 367R).

The touch sensor 595 is provided not on the substrate 711 side but on the substrate 701 side (see FIG. 17A).

The adhesive layer 597 bonds the substrate 590 to the substrate 701 so that the touch sensor 595 overlaps with the display portion. The adhesive layer 597 transmits visible light.

Note that a structure in the case of using bottom-gate transistors in the display portion 501 is illustrated in FIGS. 17A and 17B.

For example, a semiconductor layer containing an oxide semiconductor, amorphous silicon, or the like can be used in the transistor 302t and the transistor 303t illustrated in FIG. 17A.

For example, a semiconductor layer containing polycrystalline silicon can be used in the transistor 302t and the transistor 303t illustrated in FIG. 17B.

A structure in the case of using top-gate transistors is illustrated in FIG. 17C.

For example, a semiconductor layer containing polycrystalline silicon, a single crystal silicon film that is transferred, or the like can be used in the transistor 302t and the transistor 303t illustrated in FIG. 17C.

Structure Example 4

Figure 18:
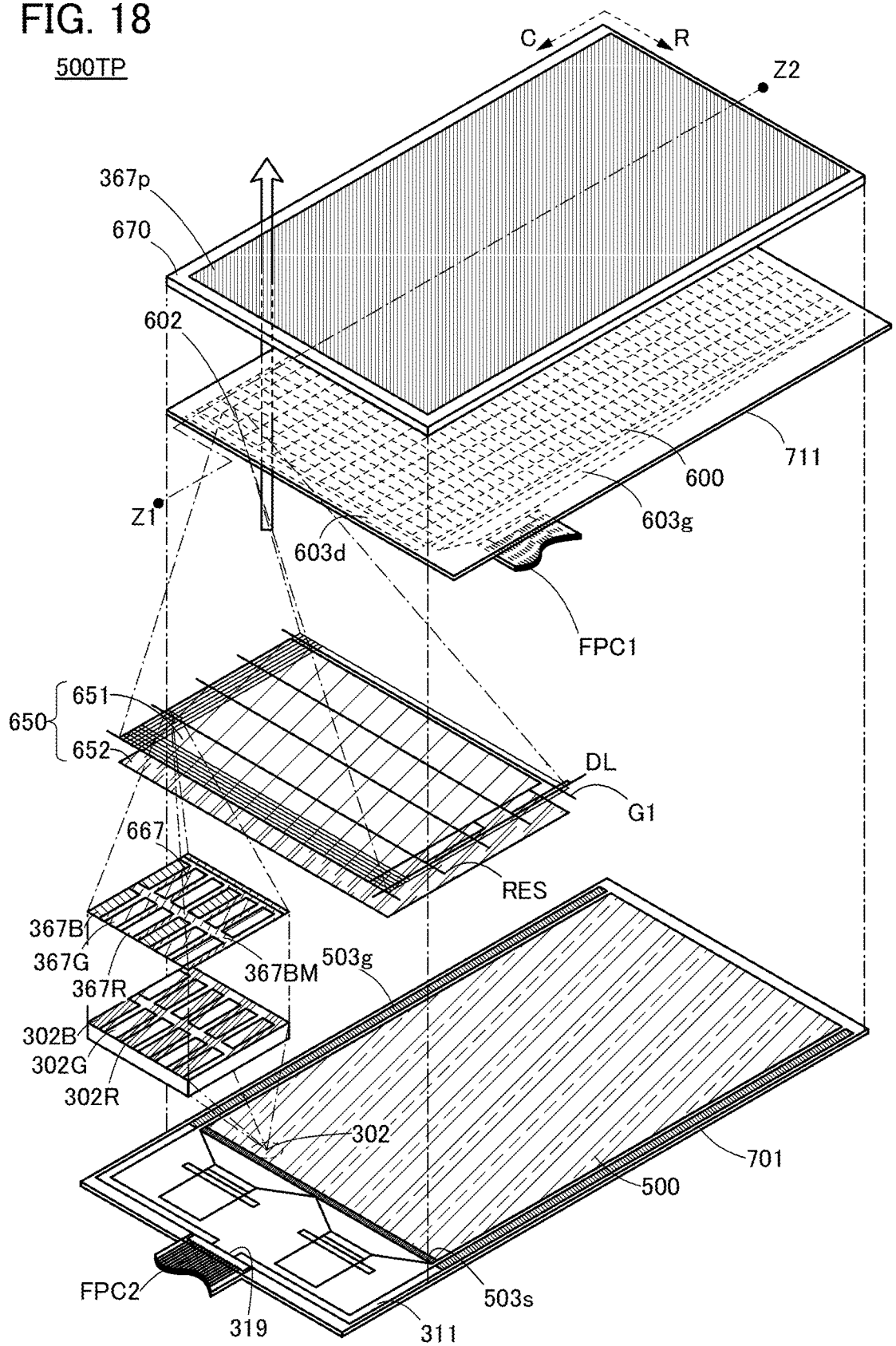
FIG. 18 illustrates a touch panel according to one embodiment.
Figure 19:
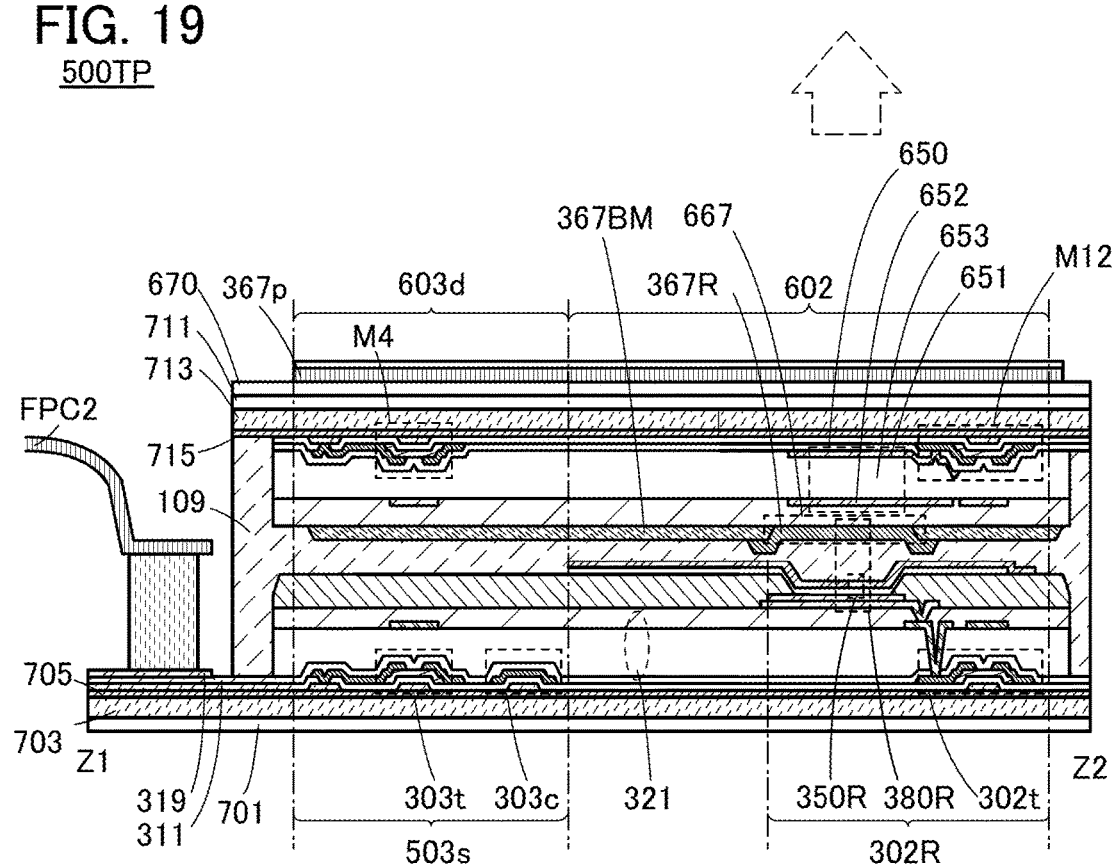
FIG. 19 illustrates a touch panel according to one embodiment.

As illustrated in FIG. 18, a touch panel 500TP includes a display portion 500 and an input portion 600 that overlap each other. FIG. 19 is a cross-sectional view taken along the dashed-dotted line Z1-Z2 in FIG. 18.

Individual components included in the touch panel 500TP are described below. Note that these units cannot be clearly distinguished and one unit also serves as another unit or include part of another unit in some cases. Note that the touch panel 500TP in which the input portion 600 overlaps with the display portion 500 is also referred to as a touch panel.

The input portion 600 includes a plurality of sensing units 602 arranged in a matrix. The input portion 600 also includes a selection signal line G1, a control line RES, a signal line DL, and the like.

The selection signal line G1 and the control line RES are electrically connected to the plurality of sensing units 602 that are arranged in the row direction (indicated by the arrow R in FIG. 18). The signal line DL is electrically connected to the plurality of sensing units 602 that are arranged in the column direction (indicated by the arrow C in FIG. 18).

The sensing unit 602 senses an object that is close thereto or in contact therewith and supplies a sensing signal. For example, the sensing unit 602 senses, for example, capacitance, illuminance, magnetic force, electric waves, or pressure and supplies data based on the sensed physical quantity. Specifically, a capacitor, a photoelectric conversion element, a magnetic sensing element, a piezoelectric element, a resonator, or the like can be used as the sensing element.

The sensing unit 602 senses, for example, a change in capacitance between the sensing unit 602 and an object close thereto or an object in contact therewith.

Note that when an object having a dielectric constant higher than that of the air, such as a finger, comes close to a conductive film in the air, the capacitance between the finger and the conductive film changes. The sensing unit 602 can sense the capacitance change and supply sensing data.

For example, distribution of charge occurs between the conductive film and the capacitor owing to the change in the electrostatic capacitance, so that the voltage across the capacitor is changed. This voltage change can be used as the sensing signal.

The sensing unit 602 is provided with a sensor circuit. The sensor circuit is electrically connected to the selection signal line G1, the control line RES, the signal line DL, or the like.

The sensor circuit includes a transistor, a sensor element, and/or the like. For example, a conductive film and a capacitor electrically connected to the conductive film can be used for the sensor circuit. A capacitor and a transistor electrically connected to the capacitor can also be used for the sensor circuit.

For example, a capacitor 650 including an insulating layer 653, and a first electrode 651 and a second electrode 652 between which the insulating layer 653 is provided can be used for the sensor circuit (see FIG. 19). Specifically, the voltage between the electrodes of the capacitor 650 changes when an object approaches the conductive film which is electrically connected to one electrode of the capacitor 650.

The sensing unit 602 includes a switch that can be turned on or off in accordance with a control signal. For example, a transistor M12 can be used as the switch.

A transistor which amplifies a sensing signal can be used in the sensing unit 602.

Transistors manufactured through the same process can be used as the transistor that amplifies a sensing signal and the switch. This allows the input portion 600 to be provided through a simplified process.

The sensing unit 602 includes a plurality of window portions 667 arranged in a matrix. The window portions 667 transmit visible light. A light-blocking layer BM may be provided between the window portions 667.

A coloring layer is provided in a position overlapping with the window portion 667 in the touch panel 500TP. The coloring layer transmits light of a predetermined color. Note that the coloring layer can be referred to as a color filter. For example, a coloring layer 367B transmitting blue light, a coloring layer 367G transmitting green light, and a coloring layer 367R transmitting red light can be used. Alternatively, a coloring layer transmitting yellow light or white light may be used.

The display portion 500 includes the plurality of pixels 302 arranged in a matrix. The pixel 302 is positioned so as to overlap with the window portions 667 of the input portion 600. The pixels 302 may be arranged at higher resolution than the sensing units 602. Each pixel has the same structure as Structure Example 1; thus, description is omitted.

The touch panel 500TP includes the input portion 600 that includes the plurality of sensing units 602 arranged in a matrix and the window portions 667 transmitting visible light, the display portion 500 that includes the plurality of pixels 302 overlapping with the window portions 667, and the coloring layers between the window portions 667 and the pixels 302. Each of the sensing units includes a switch that can reduce interference in another sensing unit.

Thus, sensing data obtained by each sensor unit can be supplied together with the positional information of the sensor unit. In addition, sensing data can be supplied in relation to the positional data of the pixel for displaying an image. In addition, the sensor unit which does not supply the sensing data is not electrically connected to a signal line, whereby interference with the sensor unit which supplies a sensing signal can be reduced. Consequently, the novel touch panel 500TP that is highly convenient or highly reliable can be provided.

For example, the input portion 600 of the touch panel 500TP can sense sensing data and supply the sensing data together with the positional data. Specifically, a user of the touch panel 500TP can make a variety of gestures (e.g., tap, drag, swipe, and pinch-in operation) using, as a pointer, his/her finger or the like on the input portion 600.

The input portion 600 can sense a finger or the like that comes close to or is in contact with the input portion 600 and supply sensing data including a sensed position, path, or the like.

An arithmetic unit determines whether or not supplied data satisfies a predetermined condition on the basis of a program or the like and executes an instruction associated with a predetermined gesture.

Thus, a user of the input portion 600 can make the predetermined gesture with his/her finger or the like and make the arithmetic unit execute an instruction associated with the predetermined gesture.

For example, first, the input portion 600 of the touch panel 500TP selects one sensing unit X from the plurality of sensing units that can supply sensing data to one signal line. Then, electrical continuity between the signal line and the sensing units other than the sensing unit X is not established. This can reduce interference of the other sensing units in the sensing unit X.

Specifically, interference of sensing elements of the other sensing units in a sensing element of the sensing unit X can be reduced.

For example, in the case where a capacitor and a conductive film to which one electrode of the capacitor is electrically connected are used for the sensing element, interference of the potentials of the conductive films of the other sensing units in the potential of the conductive film of the sensing unit X can be reduced.

Thus, the touch panel 500TP can drive the sensing unit and supply sensing data independently of its size. The touch panel 500TP can have a variety of sizes, for example, ranging from a size for a hand-held device to a size for an electronic blackboard.

The touch panel 500TP can be folded and unfolded. Even in the case where interference of the other sensing units in the sensing unit X is different between the folded state and the unfolded state, the sensing unit can be driven and sensing data can be supplied without dependence on the state of the touch panel 500TP.

The display portion 500 of the touch panel 500TP can be supplied with display data. For example, an arithmetic unit can supply the display data.

In addition to the above structure, the touch panel 500TP can have the following structure.

The touch panel 500TP may include a driver circuit 603g or a driver circuit 603d. In addition, the touch panel 500TP may be electrically connected to an FPC1.

The driver circuit 603g can supply selection signals at predetermined timings, for example. Specifically, the driver circuit 603g supplies selection signals to the selection signal lines G1 row by row in a predetermined order. Any of a variety of circuits can be used as the driver circuit 603g. For example, a shift register, a flip flop circuit, a combination circuit, or the like can be used.

The driver circuit 603d supplies sensing data on the basis of a sensing signal supplied from the sensing unit 602. Any of a variety of circuits can be used as the driver circuit 603d. For example, a circuit that can form a source follower circuit or a current mirror circuit by being electrically connected to the sensing circuit in the sensing unit can be used as the driver circuit 603d. In addition, an analog-to-digital converter circuit that converts a sensing signal into a digital signal may be provided in the driver circuit 603d.

The FPC1 supplies a timing signal, a power supply potential, or the like and is supplied with a sensing signal.

The touch panel 500TP may include a driver circuit 503g, a driver circuit 503s, a wiring 311, and a terminal 319. In addition, the touch panel 500TP may be electrically connected to an FPC2.

In addition, a protective layer 670 that prevents damage and protects the touch panel 500TP may be provided. For example, a ceramic coat layer or a hard coat layer can be used as the protective layer 670. Specifically, a layer containing aluminum oxide or a UV curable resin can be used.

In the case of a transflective liquid crystal display or a reflective liquid crystal display, some of or all of pixel electrodes function as reflective electrodes. For example, some or all of pixel electrodes are formed to contain aluminum, silver, or the like.

Furthermore, a memory circuit such as an SRAM can be provided under the reflective electrodes, leading to lower power consumption. A structure suitable for employed display elements can be selected from among a variety of structures of pixel circuits.

The touch panel described in this embodiment can be used instead of the display panel 100 included in the display device 10 in Embodiment 1. In this case, a touch panel with a structure in which a plurality of FPCs connected to the touch panel are extracted from the same side, such as the touch panel 390 and the touch panel 505B, can be preferably used. Note that in the case where a touch panel is used instead of the display panel 100, the display device 10 can be referred to as an input/output device.

The adhesive layer 107 that bonds the plurality of touch panels to the substrate 106 is preferably provided so that the top surfaces of the touch sensors 595 (or the input portions 600) of these touch panels are level with each other and the top surfaces are parallel to the substrate 106. The distances between the surface of the input/output device (i.e., the surface of the substrate 106) and the touch sensors 595 (or the input portions 600) of the touch panels are made the same, whereby location dependence of detection sensitivity can be reduced.

This embodiment can be combined with any other embodiment as appropriate.

Embodiment 4

In this embodiment, electronic devices and lighting devices of one embodiment of the present invention will be described with reference to drawings.

With the use of the display device, the display panel, or the touch panel of one embodiment of the present invention, a highly reliable electronic device or lighting device including a curved surface can be fabricated. Furthermore, with the use of the display device, the display panel, or the touch panel of one embodiment of the present invention, a highly reliable electronic device or lighting device having flexibility can be fabricated.

Examples of electronic devices include a television set (also referred to as a television or a television receiver), a monitor of a computer or the like, a digital camera, a digital video camera, a digital photo frame, a mobile phone (also referred to as a mobile phone device), a portable game machine, a portable information terminal, an audio reproducing device, a large game machine such as a pinball machine, and the like.

The electronic device or the lighting device of one embodiment of the present invention has flexibility and therefore can be incorporated along a curved inside-outside wall surface of a house or a building or a curved interior/exterior surface of a car.

Furthermore, the electronic device of one embodiment of the present invention may include a secondary battery. It is preferable that the secondary battery be capable of being charged by non-contact power transmission.

Examples of the secondary battery include a lithium ion secondary battery such as a lithium polymer battery using a gel electrolyte (lithium ion polymer battery), a lithium ion battery, a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. When a signal is received by the antenna, the electronic device can display an image, data, or the like on a display portion. When the electronic device includes a secondary battery, the antenna may be used for contactless power transmission.

FIGS. 20A, 20B, 20C1, 20C2, 20D, and 20E illustrate an example of an electronic device including a display portion 7000 with a curved surface. The display surface of the display portion 7000 is bent, and images can be displayed on the bent display surface. Note that the display portion 7000 may be flexible.

The display portion 7000 is formed using the display device, the display panel, or the touch panel of one embodiment of the present invention.

One embodiment of the present invention makes it possible to provide a highly reliable electronic device having a curved display portion.

FIG. 20A illustrates an example of a mobile phone. A mobile phone 7100 includes a housing 7101, the display portion 7000, operation buttons 7103, an external connection port 7104, a speaker 7105, a microphone 7106, and the like.

The mobile phone 7100 illustrated in FIG. 20A includes a touch sensor in the display portion 7000. Moreover, operations such as making a call and inputting a letter can be performed by touch on the display portion 7000 with a finger, a stylus, or the like.

With the operation buttons 7103, power ON or OFF can be switched. In addition, types of images displayed on the display portion 7000 can be switched; switching images from a mail creation screen to a main menu screen, for example.

FIG. 20B illustrates an example of a television set. In the television set 7200, the display portion 7000 is incorporated into the housing 7201. Here, the housing 7201 is supported by a stand 7203.

The television set 7200 illustrated in FIG. 20B can be operated with an operation switch of the housing 7201 or a separate remote controller 7211. Furthermore, the display portion 7000 may include a touch sensor. The display portion 7000 can be performed by touching the display portion with a finger or the like. Furthermore, the remote controller 7211 may be provided with a display portion for displaying data output from the remote controller 7211. With operation keys or a touch panel of the remote controller 7211, channels and volume can be controlled and images displayed on the display portion 7000 can be controlled.

Note that the television set 7200 may be provided with a receiver, a modem, and the like. A general television broadcast can be received with the receiver. Further, when the television set is connected to a communication network with or without wires via the modem, one-way (from a transmitter to a receiver) or two-way (between a transmitter and a receiver or between receivers) data communication can be performed.

FIGS. 20C1, 20C2, 20D, and 20E illustrate an example of a portable information terminal. Each of the portable information terminals includes a housing 7301 and the display portion 7000. Furthermore, each of the portable information terminals may also include an operation button, an external connection port, a speaker, a microphone, an antenna, a battery, or the like. The display portion 7000 is provided with a touch sensor. An operation of the portable information terminal can be performed by touching the display portion 7000 with a finger, a stylus, or the like.

FIG. 20C1 is a perspective view of a portable information terminal 7300. FIG. 20C2 is a top view of the portable information terminal 7300. FIG. 20D is a perspective view of a portable information terminal 7310. FIG. 20E is a perspective view of a portable information terminal 7320.

Each of the portable information terminals illustrated in this embodiment functions as, for example, one or more of a telephone set, a notebook, and an information browsing system. Specifically, each of the portable information terminals can be used as a smartphone. Each of the portable information terminals illustrated in this embodiment is capable of executing a variety of applications such as mobile phone calls, e-mailing, reading and editing texts, music reproduction, Internet communication, and a computer game, for example.

The portable information terminals 7300, 7310, and 7320 can display characters and image information on its plurality of surfaces. For example, as illustrated in FIGS. 20C1 and 20D, three operation buttons 7302 can be displayed on one surface, and information 7303 indicated by a rectangle can be displayed on another surface. FIGS. 20C1 and 20C2 illustrate an example in which information is displayed at the top of the portable information terminal. FIG. 20D illustrates an example in which information is displayed on the side of the portable information terminal. Information may be displayed on three or more surfaces of the portable information terminal. FIG. 20E illustrates an example where information 7304, information 7305, and information 7306 are displayed on different surfaces.

Examples of the information include notification from a social networking service (SNS), display indicating reception of an e-mail or an incoming call, the title of an e-mail or the like, the sender of an e-mail or the like, the date, the time, remaining battery, and the reception strength of an antenna. Alternatively, the operation button, an icon, or the like may be displayed in place of the information.

For example, a user of the portable information terminal 7300 can see the display (here, the information 7303) with the portable information terminal 7300 put in a breast pocket of his/her clothes.

Specifically, a caller's phone number, name, or the like of an incoming call is displayed in a position that can be seen from above the portable information terminal 7300. Thus, the user can see the display without taking out the portable information terminal 7300 from the pocket and decide whether to answer the call.

FIGS. 21A1, 21A2, 21B, 21C, 21D, 21E, 21F, 21G, 21H, and 21I each illustrate an example of a portable information terminal including a display portion 7001 having flexibility.

The display portion 7001 is formed using the display device, the display panel, or the touch panel of one embodiment of the present invention. For example, a display device, a display panel, or a touch panel that can be bent with a radius of curvature of greater than or equal to 0.01 mm and less than or equal to 150 mm can be used. The display portion 7001 may include a touch sensor so that the portable information terminal can be operated by touching the display portion 7001 with a finger or the like.

One embodiment of the present invention makes it possible to provide a highly reliable electronic device including a display portion having flexibility.

FIGS. 21A1 and 21A2 are a perspective view and a side view illustrating an example of the portable information terminal, respectively. A portable information terminal 7500 includes a housing 7501, a display portion 7001, a display portion pull 7502, operation buttons 7503, or the like.

The portable information terminal 7500 includes a rolled flexible display portion 7001 in the housing 7501.

The portable information terminal 7500 can receive a video signal with a control portion incorporated therein and can display the received video on the display portion 7001. Furthermore, the portable information terminal 7500 incorporates a battery. Moreover, a terminal portion for connecting a connector may be included in the housing 7501 so that a video signal or power can be directly supplied from the outside with a wiring.

By pressing the operation buttons 7503, power ON/OFF, switching of displayed videos, and the like can be performed. Although FIGS. 21A1, 21A2, and 21B illustrate an example where the operation buttons 7503 are positioned on a side surface of the portable information terminal 7500, one embodiment of the present invention is not limited thereto. The operation buttons 7503 may be placed on the same surface as a display surface (a front surface) or an opposite surface to the display surface of the portable information terminal 7500.

FIG. 21B illustrates the portable information terminal 7500 in a state where the display portion 7001 is pulled out with the display portion pull 7502. Videos can be displayed on the display portion 7001 in this state. In addition, the portable information terminal 7500 may perform different displays in the state where part of the display portion 7001 is rolled as shown in FIG. 21A1 and in the state where the display portion 7001 is pulled out with the display portion pull 7502 as shown in FIG. 21B. For example, in the state shown in FIG. 21A1, the rolled portion of the display portion 7001 is put in a non-display state, which results in a reduction in power consumption of the portable information terminal 7500.

Note that a reinforcement frame may be provided for a side portion of the display portion 7001 so that the display portion 7001 has a flat display surface when pulled out.

Note that in addition to this structure, a speaker may be provided for the housing so that sound is output with an audio signal received together with a video signal.

FIGS. 21C to 21E illustrate an example of a foldable portable information terminal. FIG. 21C illustrates a portable information terminal 7600 that is opened. FIG. 21D illustrates the portable information terminal 7600 that is being opened or being folded. FIG. 21E illustrates the portable information terminal 7600 that is folded. The portable information terminal 7600 is highly portable when folded, and is highly browsable when opened because of a seamless large display area.

A display portion 7001 is supported by three housings 7601 joined together by hinges 7602. By folding the portable information terminal 7600 at a connection portion between two housings 7601 with the hinges 7602, the portable information terminal 7600 can be reversibly changed in shape from an opened state to a folded state.

FIGS. 21F and 21G illustrate an example of a foldable portable information terminal. FIG. 21F illustrates a portable information terminal 7650 that is folded so that the display portion 7001 is on the inside. FIG. 21G illustrates the portable information terminal 7650 that is folded so that the display portion 7001 is on the outside. The portable information terminal 7650 includes the display portion 7001 and a non-display portion 7651. When the portable information terminal 7650 is not used, the portable information terminal 7650 is folded so that the display portion 7001 is on the inside, whereby the display portion 7001 can be prevented from being contaminated or damaged.

FIG. 21H illustrates an example of a flexible portable information terminal. A portable information terminal 7700 includes a housing 7701 and the display portion 7001. In addition, the portable information terminal 7700 may include buttons 7703a and 7703b which serve as input means, speakers 7704a and 7704b which serve as sound output means, an external connection port 7705, a microphone 7706, or the like. A flexible battery 7709 can be mounted on the portable information terminal 7700. The battery 7709 may be arranged to overlap with the display portion 7001, for example.

The housing 7701, the display portion 7001, the battery 7709 are flexible. Thus, it is easy to curve the portable information terminal 7700 into a desired shape or to twist the portable information terminal 7700. For example, the portable information terminal 7700 can be curved so that the display portion 7001 is on the inside or in the outside. The portable information terminal 7700 can be used in a rolled state. Since the housing 7701 and the display portion 7001 can be transformed freely in this manner, the portable information terminal 7700 is less likely to be broken even when the portable information terminal 7700 falls down or external stress is applied to the portable information terminal 7700.

The portable information terminal 7700 can be used effectively in various situations because the portable information terminal 7700 is lightweight. For example, the portable information terminal 7700 can be used in the state where the upper portion of the housing 7701 is suspended by a clip or the like, or in the state where the housing 7701 is fixed to a wall by magnets or the like.

FIG. 21I illustrates an example of a wrist-watch-type portable information terminal. The portable information terminal 7800 includes a band 7801, a display portion 7001, an input-output terminal 7802, operation buttons 7803, or the like. The band 7801 has a function of a housing. In addition, a flexible battery 7805 can be mounted on the portable information terminal 7800. The battery 7805 may overlap with the display portion 7001 and the band 7801, for example.

The band 7801, the display portion 7001, and the battery 7805 have flexibility. Thus, the portable information terminal 7800 can be easily curved to have a desired shape.

With the operation buttons 7803, a variety of functions such as time setting, ON/OFF of the power, ON/OFF of wireless communication, setting and cancellation of manner mode, and setting and cancellation of power saving mode can be performed. For example, the functions of the operation button 7803 can be set freely by the operating system incorporated in the portable information terminal 7800.

By touching an icon 7804 displayed on the display portion 7001 with a finger or the like, application can be started.

The portable information terminal 7800 can employ near field communication that is a communication method based on an existing communication standard. In that case, for example, mutual communication between the portable information terminal 7800 and a headset capable of wireless communication can be performed, and thus hands-free calling is possible.

Alternatively, the portable information terminal 7800 may include the input-output terminal 7802. In the case where the input-output terminal 7802 is included, data can be directly transmitted to and received from another information terminal via a connector. Charging through the input-output terminal 7802 is also possible. Note that charging of the portable information terminal described as an example in this embodiment can be performed by non-contact power transmission without using the input-output terminal.

Figure 22A:
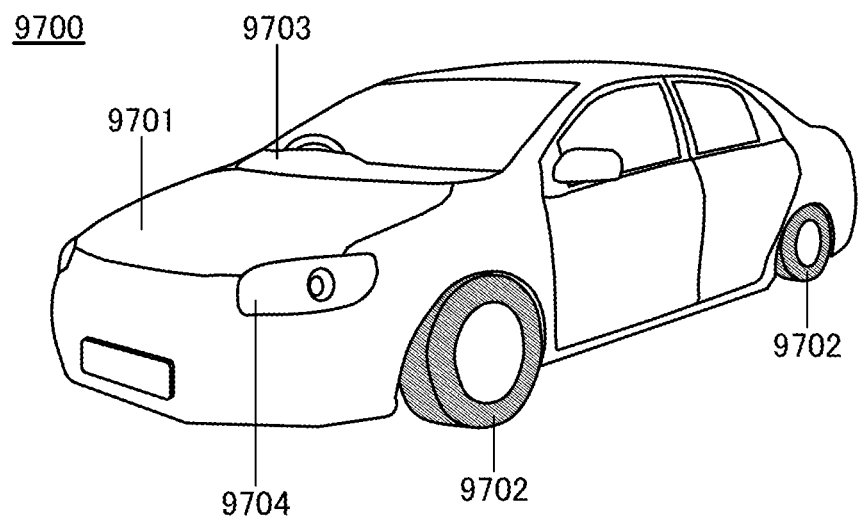
FIGS. 22A and 22B illustrate an example of an electronic device.
Figure 22B:
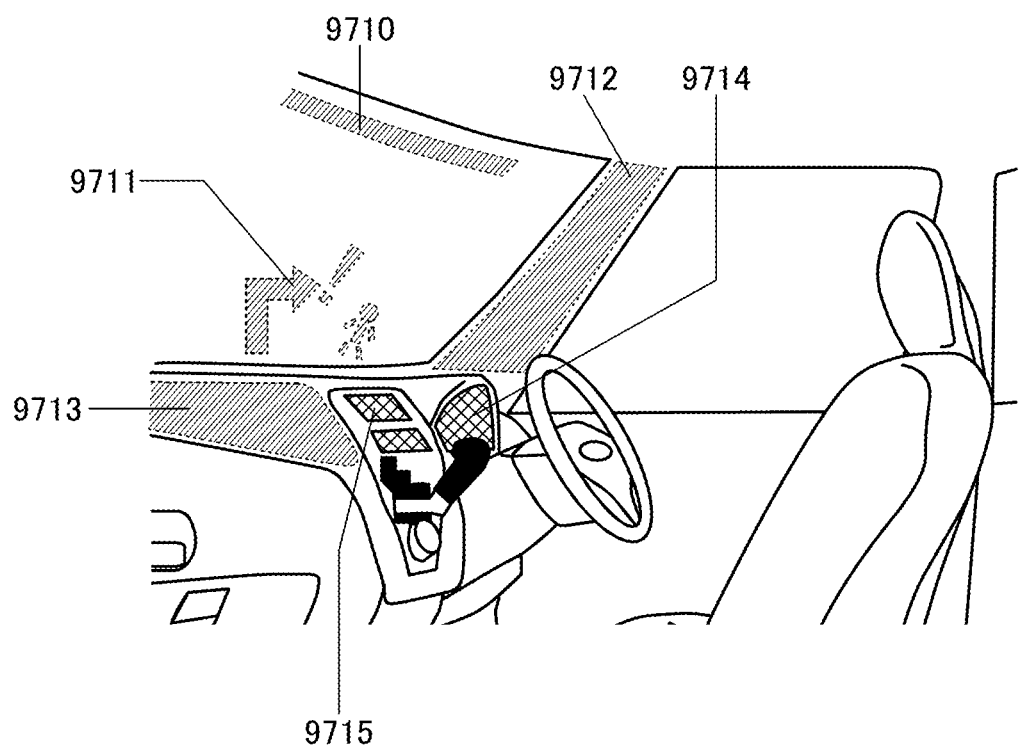

FIG. 22A is an external view of an automobile 9700. FIG. 22B illustrates a driver's seat of the automobile 9700. The automobile 9700 includes a car body 9701, wheels 9702, a dashboard 9703, lights 9704, and the like. The display device of one embodiment of the present invention can be used in a display portion or the like of the automobile 9700. For example, the display device of one embodiment of the present invention can be used in display portions 9710 to 9715 illustrated in FIG. 22B.

The display portion 9710 and the display portion 9711 are display devices provided in an automobile windshield. The display device of one embodiment of the present invention can be a see-through display device, through which the opposite side can be seen, by using a light-transmitting conductive material for its electrodes. Such a see-through display device does not hinder driver's vision during driving the automobile 9700. Therefore, the display device of one embodiment of the present invention can be provided in the windshield of the automobile 9700. Note that in the case where a transistor or the like for driving the display device is provided in the display device, a transistor having light-transmitting properties, such as an organic transistor using an organic semiconductor material or a transistor using an oxide semiconductor, is preferably used.

The display portion 9712 is a display device provided on a pillar portion. For example, an image taken by an imaging unit provided in the car body is displayed on the display portion 9712, whereby the view hindered by the pillar portion can be compensated. The display portion 9713 is a display device provided on the dashboard. For example, an image taken by an imaging unit provided in the car body is displayed on the display portion 9713, whereby the view hindered by the dashboard can be compensated. That is, by displaying an image taken by an imaging unit provided on the outside of the automobile, blind areas can be eliminated and safety can be increased. Displaying an image to compensate for the area which a driver cannot see, makes it possible for the driver to confirm safety easily and comfortably.

Figure 23:
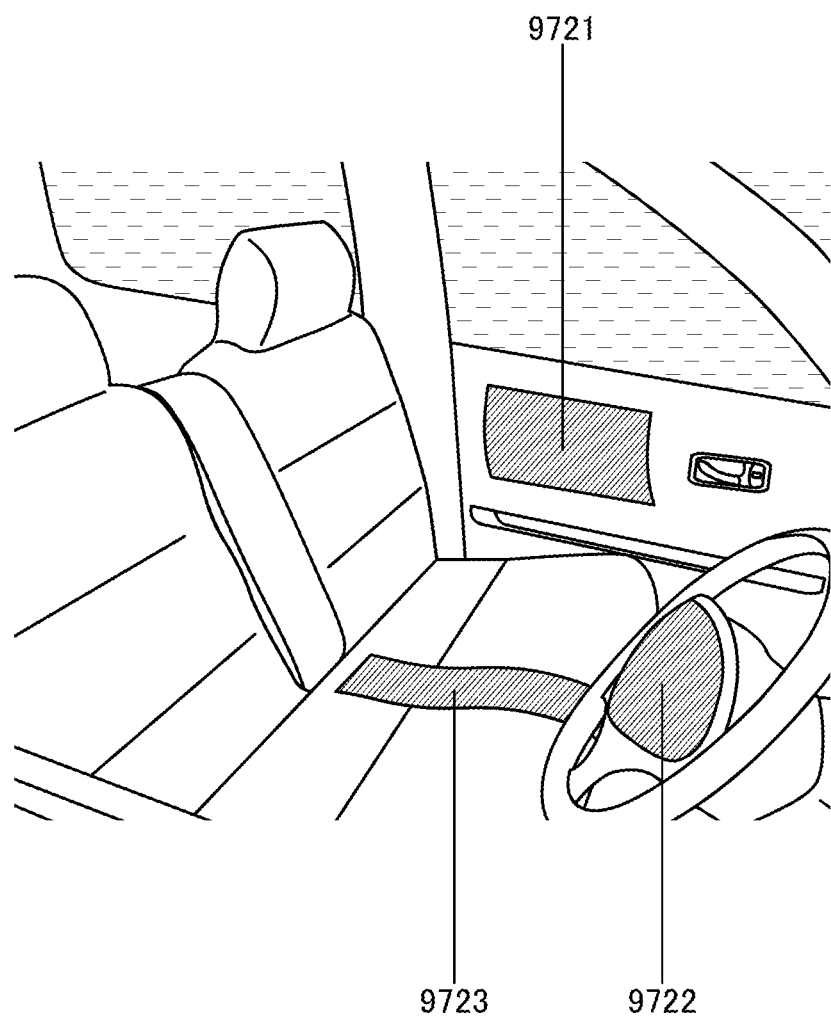
FIG. 23 illustrates an example of an electronic device.

FIG. 23 illustrates the inside of a car in which bench seats are used for a driver seat and a front passenger seat. A display portion 9721 is a display device provided in a door portion. For example, an image taken by an imaging unit provided in the car body is displayed on the display portion 9721, whereby the view hindered by the door can be compensated. A display portion 9722 is a display device provided in a steering wheel. A display portion 9723 is a display device provided in the middle of a seating face of the bench seat. Note that the display device can be used as a seat heater by providing the display device on the seating face or backrest and by using heat generation of the display device as a heat source.

The display portion 9714, the display portion 9715, and the display portion 9722 can display a variety of kinds of information such as navigation data, a speedometer, a tachometer, a mileage, a fuel meter, a gearshift indicator, and air-condition setting. The content, layout, or the like of the display on the display portions can be changed freely by a user as appropriate. The information listed above can also be displayed on the display portions 9710 to 9713, 9721, and 9723. The display portions 9710 to 9715 and 9721 to 9723 can also be used as lighting devices. The display portions 9710 to 9715 and 9721 to 9723 can also be used as heating devices.

This embodiment can be implemented in an appropriate combination with any of the other embodiments.

It is needless to say that one embodiment of the present invention is not limited to the above-described electronic devices and lighting devices as long as the display device of one embodiment of the present invention is included.

The structures, methods, and the like described in this embodiment can be used in appropriate combination with any of the structures, methods, and the like described in the other embodiments.

REFERENCE NUMERALS

10: display device, 11: display region, 15: column, 16: wall, 21: interior member, 22: exterior member, 23: supporting member, 25: antenna, 26: light-blocking portion, 27: wireless signal, 100: display panel, 100a: display panel, 100b: display panel, 100c: display panel, 100d: display panel, 101: display region, 101a: display region, 101b: display region, 101c: display region, 101d: display region, 104: adhesive layer, 105: barrier layer, 105a: barrier layer, 105b: barrier layer, 105c: barrier layer, 106: substrate, 107: adhesive layer, 108: substrate, 109: adhesive layer, 110: region, 110b: region, 110c: region, 110d: region, 112: FPC, 112a: FPC, 112b: FPC, 115: barrier layer, 116: opening portion, 118: adhesive layer, 120: region, 120a: region, 123: FPC, 125: adhesive layer, 130: light-emitting element, 131: resin layer, 132: protective substrate, 141: pixel, 141a: pixel, 141b: pixel, 142a: wiring, 142b: wiring, 143a: circuit, 143b: circuit, 145: wiring, 150: wireless module, 160: transistor, 170: region, 301: display portion, 302: pixel, 302B: sub-pixel, 302G: sub-pixel, 302R: sub-pixel, 302t: transistor, 303c: capacitor, 303g(1): scan line driver circuit, 303g(2): imaging pixel driver circuit, 303s(1): image signal line driver circuit, 303s(2): imaging signal line driver circuit, 303t: transistor, 304: gate, 308: imaging pixel, 308p: photoelectric conversion element, 308t: transistor, 309: FPC, 311: wiring, 319: terminal, 321: insulating layer, 328: partition, 329: spacer, 350R: light-emitting element, 351R: lower electrode, 352: upper electrode, 353: EL layer, 353a: EL layer, 353b: EL layer, 354: intermediate layer, 360: adhesive layer, 367B: coloring layer, 367BM: light-blocking layer, 367G: coloring layer, 367p: anti-reflective layer, 367R: coloring layer, 380B: light-emitting module, 380G: light-emitting module, 380R: light-emitting module, 390: touch panel, 500: display portion, 500TP: touch panel, 501: display portion, 503g: driver circuit, 503s: driver circuit, 505A: touch panel, 505B: touch panel, 509: FPC, 590: substrate, 591: electrode, 592: electrode, 593: insulating layer, 594: wiring, 595: touch sensor, 597: adhesive layer, 598: wiring, 599: connection layer, 600: input portion, 602: sensing unit, 603d: driver circuit, 603g: driver circuit, 650: capacitor, 651: electrode, 652: electrode, 653: insulating layer, 667: window portion, 670: protective layer, 701: substrate, 701b: substrate, 703: adhesive layer, 705: barrier layer, 711: substrate, 713: adhesive layer, 715: barrier layer, 715a: barrier layer, 715b: barrier layer, 804: light-emitting portion, 806: driver circuit portion, 808: FPC, 814: conductive layer, 815: insulating layer, 817: insulating layer, 817a: insulating layer, 817b: insulating layer, 820: transistor, 821: insulating layer, 822: adhesive layer, 823: spacer, 824: transistor, 825: connector, 830: light-emitting element, 830a: light-emitting element, 830b: light-emitting element, 831: lower electrode, 832: optical adjustment layer, 833: EL layer, 835: upper electrode, 845: coloring layer, 847: light-blocking layer, 849: overcoat, 856: conductive layer, 857: conductive layer, 857a: conductive layer, 857b: conductive layer, 7000: display portion, 7001: display portion, 7100: mobile phone, 7101: housing, 7103: operation button, 7104: external connection port, 7105: speaker, 7106: microphone, 7200: television set, 7201: housing, 7203: stand, 7211: remote controller, 7300: portable information terminal, 7301: housing, 7302: operation button, 7303: information, 7304: information, 7305: information, 7306: information, 7310: portable information terminal, 7320: portable information terminal, 7500: portable information terminal, 7501: housing, 7502: display portion pull, 7503: operation button, 7600: portable information terminal, 7601: housing, 7602: hinge, 7650: portable information terminal, 7651: non-display portion, 7700: portable information terminal, 7701: housing, 7703a: button, 7703b: button, 7704a: speaker, 7704b: speaker, 7705: external connection port, 7706: microphone, 7709: battery, 7800: portable information terminal, 7801: band, 7802: input-output terminal, 7803: operation button, 7804: icon, 7805: battery, 9700: automobile, 9701: car body, 9702: wheel, 9703: dashboard, 9704: light, 9710: display portion, 9711: display portion, 9712: display portion, 9713: display portion, 9714: display portion, 9715: display portion, 9721: display portion, 9722: display portion, 9723: display portion.

This application is based on Japanese Patent Application serial no. 2014-162594 filed with Japan Patent Office on Aug. 8, 2014, the entire contents of which are hereby incorporated by reference.

The invention claimed is:
1. A display device comprising:
a first display panel;
a second display panel;
a first adhesive layer; and
a substrate,
wherein each of the first display panel and the second display panel includes a first region, a second region, and a barrier layer,
wherein the barrier layer includes a portion overlapping with the first region and a portion overlapping with the second region,
wherein the first region includes a region transmitting visible light,
wherein the second region is configured to display an image,
wherein the barrier layer contains an inorganic insulating material,
wherein the barrier layer includes a region in contact with the first adhesive layer,
wherein the barrier layer includes a region with a thickness of 10 nm or more and 2 µm or less,
wherein the display device includes a region in which the substrate, the first adhesive layer, the first region of the second display panel, and the second region of the first display panel overlap each other, and
wherein the substrate entirely covers the first display panel and the second display panel with the first adhesive layer disposed between the substrate and each of the first display panel and the second display panel.

2. The display device according to claim 1,
wherein the substrate includes a portion having a first refractive index,
wherein the first adhesive layer includes a portion having a second refractive index,
wherein the barrier layer of the second display panel includes a portion having a third refractive index, and
wherein the lowest refractive index among the first refractive index to the third refractive index is 80% or more of the highest refractive index thereof.

3. The display device according to claim 1, wherein the first adhesive layer is formed using a photocurable resin.

4. The display device according to claim 1, further comprising a second adhesive layer,
wherein the second adhesive layer includes a region in contact with the second region of the first display panel, and
wherein the display device includes a region in which the first region of the second display panel, the second adhesive layer, and the second region of the first display panel overlap each other.

5. The display device according to claim 4,
wherein the second adhesive layer includes a portion having a fourth refractive index,
wherein the barrier layer of the first display panel includes a portion having a fifth refractive index, and
wherein the lower refractive index between the fourth refractive index and the fifth refractive index is 80% or more of the higher refractive index.

6. The display device according to claim 4, wherein the second adhesive layer is formed using a photocurable resin.

7. The display device according to claim 5, wherein the second adhesive layer is formed using a photocurable resin.

8. An electronic device comprising:
the display device according to claim 1; and
a microphone, a speaker, a battery, an operation switch, or a housing.

9. A display device comprising:
a first display panel;
a second display panel;
a first adhesive layer; and
a substrate,
wherein each of the first display panel and the second display panel includes a first region, a second region, and a barrier layer,
wherein the barrier layer includes a portion overlapping with the first region and a portion overlapping with the second region,
wherein the first region includes a region transmitting visible light,
wherein the second region is configured to display an image,
wherein the barrier layer contains an inorganic insulating material,
wherein the barrier layer includes a region in contact with the first adhesive layer,
wherein the barrier layer includes a region with a thickness of 10 nm or more and 2 µm or less,
wherein the display device includes a region in which the substrate, the first adhesive layer, the first region of the second display panel, and the second region of the first display panel overlap each other,
wherein the substrate continuously covers an entirety of the second region of the first display panel and an entirety of the second region of the second display panel, and
wherein the first adhesive layer is disposed between the substrate and each of the first display panel and the second display panel.

10. The display device according to claim 9,
wherein the substrate includes a portion having a first refractive index,
wherein the first adhesive layer includes a portion having a second refractive index,
wherein the barrier layer of the second display panel includes a portion having a third refractive index, and
wherein the lowest refractive index among the first refractive index to the third refractive index is 80% or more of the highest refractive index thereof.

11. The display device according to claim 9, wherein the first adhesive layer is formed using a photocurable resin.

12. The display device according to claim 9, further comprising a second adhesive layer,
wherein the second adhesive layer includes a region in contact with the second region of the first display panel, and
wherein the display device includes a region in which the first region of the second display panel, the second adhesive layer, and the second region of the first display panel overlap each other.

13. The display device according to claim 12,
wherein the second adhesive layer includes a portion having a fourth refractive index,
wherein the barrier layer of the first display panel includes a portion having a fifth refractive index, and
wherein the lower refractive index between the fourth refractive index and the fifth refractive index is 80% or more of the higher refractive index.

14. The display device according to claim 12, wherein the second adhesive layer is formed using a photocurable resin.

15. The display device according to claim 13, wherein the second adhesive layer is formed using a photocurable resin.

16. An electronic device comprising:
the display device according to claim 9; and
a microphone, a speaker, a battery, an operation switch, or a housing.

* * * * *